United States Patent
Saito et al.

(10) Patent No.: US 12,218,482 B2
(45) Date of Patent: Feb. 4, 2025

(54) LASER BEAM GENERATION DEVICE AND LASER PROCESSING APPARATUS INCLUDING THE SAME

(71) Applicant: Mitsubishi Electric Corporation, Tokyo (JP)

(72) Inventors: Yoshimichi Saito, Tokyo (JP); Shuji Wakaiki, Tokyo (JP); Hiroshi Ikarashi, Tokyo (JP); Shingo Tsuda, Tokyo (JP); Hideyasu Machii, Tokyo (JP); Masato Matsubara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 739 days.

(21) Appl. No.: 17/604,766

(22) PCT Filed: May 25, 2020

(86) PCT No.: PCT/JP2020/020607
§ 371 (c)(1),
(2) Date: Oct. 19, 2021

(87) PCT Pub. No.: WO2020/241592
PCT Pub. Date: Dec. 3, 2020

(65) Prior Publication Data
US 2022/0200236 A1 Jun. 23, 2022

(30) Foreign Application Priority Data
May 28, 2019 (JP) .................................. 2019-099470

(51) Int. Cl.
*H01S 5/068* (2006.01)
*B23K 26/00* (2014.01)
(Continued)

(52) U.S. Cl.
CPC ........ *H01S 5/06808* (2013.01); *H01S 5/0427* (2013.01); *H01S 5/4012* (2013.01); *B23K 26/00* (2013.01)

(58) Field of Classification Search
CPC ..... B23K 26/00; H01S 5/0427; H01S 5/0428; H01S 5/06216; H01S 5/06808;
(Continued)

(56) References Cited

U.S. PATENT DOCUMENTS

2015/0035444 A1* 2/2015 Kuwano ................ H05B 45/48
315/192
2015/0117481 A1* 4/2015 Brons ................. H01S 5/06835
372/30
(Continued)

FOREIGN PATENT DOCUMENTS

JP 63-157679 A 6/1988
JP 2005-191223 A 7/2005
(Continued)

OTHER PUBLICATIONS

International Search Report and Written Opinion mailed on Aug. 25, 2020, received for PCT Application PCT/JP2020/020607, Filed on May 25, 2020, 13 pages including English Translation.
(Continued)

*Primary Examiner* — Joe E Mills, Jr.
(74) *Attorney, Agent, or Firm* — XSENSUS LLP

(57) ABSTRACT

A laser beam generation device includes power supply units, LD modules, a combiner, and a control device. The LD modules receive currents from the power supply units, and output laser beams. The combiner collects the laser beams and outputs one laser beam. The control device generates control signals such that power of the laser beam becomes a laser output setting value and such that the currents
(Continued)

become current command values. Phases of pulses of the control signals are shifted from each other by 60 degrees.

20 Claims, 44 Drawing Sheets

(51) Int. Cl.
  *H01S 5/042* (2006.01)
  *H01S 5/40* (2006.01)
(58) Field of Classification Search
  CPC ............ H01S 5/06825; H01S 5/06835; H01S 5/4012; H01S 5/4018
  See application file for complete search history.

(56) References Cited

U.S. PATENT DOCUMENTS

| | | |
|---|---|---|
| 2016/0330814 A1 | 11/2016 | Rutgers |
| 2017/0070031 A1 | 3/2017 | Takigawa et al. |
| 2017/0125976 A1 | 5/2017 | Sato |
| 2017/0133819 A1 | 5/2017 | Takigawa et al. |
| 2017/0262772 A1 | 9/2017 | Takigawa et al. |
| 2017/0279246 A1 | 9/2017 | Muendel et al. |
| 2018/0097336 A1 | 4/2018 | Tsuda et al. |
| 2018/0294619 A1 | 10/2018 | Miyata et al. |
| 2019/0176264 A1 | 6/2019 | Kyoto et al. |
| 2019/0356109 A1 | 11/2019 | Tsuda et al. |

FOREIGN PATENT DOCUMENTS

| | | |
|---|---|---|
| JP | 2007-49051 A | 2/2007 |
| JP | 2017-503351 A | 1/2017 |
| JP | 2017-54931 A | 3/2017 |
| JP | 2017-59603 A | 3/2017 |
| JP | 2017-84964 A | 5/2017 |
| JP | 2017-92206 A | 5/2017 |
| JP | 6257869 B1 | 1/2018 |
| JP | 2018-503966 A | 2/2018 |
| JP | 6360090 B2 | 7/2018 |
| JP | 2018-181950 A | 11/2018 |
| JP | 2019-71364 A | 5/2019 |
| WO | 2015/101559 A2 | 7/2015 |
| WO | 2016/060933 A1 | 4/2016 |
| WO | 2016/167019 A1 | 10/2016 |
| WO | 2018/078730 A1 | 5/2018 |

OTHER PUBLICATIONS

Japanese Office Action issued Nov. 15, 2022, in counterpart application 2021-522760, 16pp.

* cited by examiner

LASER BEAM GENERATION DEVICE AND LASER PROCESSING APPARATUS INCLUDING THE SAME

CROSS-REFERENCE TO RELATED APPLICATIONS

The present application is based on PCT filing PCT/JP2020/020607, filed May 25, 2020, which claims priority to JP 2019-099470, filed May 28, 2019, the entire contents of each are incorporated herein by reference.

TECHNICAL FIELD

The present disclosure relates to a laser beam generation device and a laser processing apparatus including the laser beam generation device.

BACKGROUND ART

A gas laser device such as a $CO_2$ laser and a solid-state laser device by lamp excitation such as a yttrium aluminum garnet (YAG) laser have been conventionally used in processing fields such as metal welding, cutting, and marking. However, in recent years, a solid-state laser device by laser diode (hereinafter, referred to as an "LD") excitation such as a fiber laser and a direct diode laser device that directly outputs a laser beam have been increasing in output. Thus, replacement from the gas laser such as the $CO_2$ laser or the solid-state laser device by the lamp excitation such as the YAG laser to a solid state laser device by the LD excitation such as a fiber laser or a direct diode laser device is progressed in the above-described processing field.

An LD module configured by arranging a large number of LDs in series or in parallel is generally used in order to generate a high-output laser beam using the LD. In this case, high efficiency and high heat dissipation are required. For example, in a laser beam generation device disclosed in Japanese Patent No. 6360090 (PTL 1), a plurality of power supply units are provided corresponding to the plurality of LD modules and a driving current of each LD module is controlled so as to maximize light conversion efficiency, thereby obtaining high efficiency. In this laser beam generation device, by providing the plurality of LD modules and the plurality of power supply units, heat is dispersed to obtain high heat dissipation.

In addition, in the laser beam generation device using the LD, a constant current source that supplies a constant driving current necessary for obtaining a desired laser output to the LD is generally used because the LD is a current-driven element. However, because a reactor is generally used in the constant current source, a response speed of an output current is decreased by accumulating electromagnetic energy in the reactor. For this reason, there is a problem that a desired laser pulse cannot be obtained even when a laser pulse having a short pulse width is output in accordance with a processing condition.

In order to solve this problem, for example, Japanese Patent No. 6257869 (PTL 2) discloses a technique in which a switching element is connected in parallel to an LD module, and the switching element is turned on and off to consume the electromagnetic energy of the reactor, thereby increasing a response speed of the driving current of the LD module.

CITATION LIST

Patent Literature

PTL 1: Japanese Patent No. 6360090
PTL 2: Japanese Patent No. 6257869

SUMMARY OF INVENTION

Technical Problem

However, PTL 1 discloses the high heat dissipation and the high efficiency, but does not disclose the stability of the laser output.

In PTL 2, due to the current ripple generated in the driving current of the LD module accompanying a switching operation of a full-bridge circuit included in the constant current source, a ripple occurs in the laser output, and there is a possibility that a stable laser output cannot be obtained.

Therefore, a main object of the present disclosure is to provide a laser beam generation device capable of obtaining the stable laser output and a laser processing apparatus including the laser beam generation device.

Solution to Problem

A laser beam generation device according to the present disclosure includes a plurality of power supply units, a plurality of laser diode modules, a condensing unit, and a control device. The plurality of power supply units are driven by a plurality of control signals, respectively, and each power supply unit is configured to output a current. The plurality of laser diode modules are provided corresponding to the plurality of power supply units, respectively, and each laser diode module is configured to receive a current from the corresponding power supply unit to output a laser beam. The condensing unit is configured to collect a plurality of laser beams output from the plurality of laser diode modules, and output a laser beam. The control device is configured to generate a plurality of control signals. The control device is configured to be able to change a phase or a frequency of each of the plurality of control signals.

Advantageous Effects of Invention

In the laser beam generation device, the phase or frequency of each of the plurality of control signals driving the plurality of power supply units can be changed. Thus, for example, by shifting the phases of the plurality of control signals from each other, the ripples included in the laser beams output from the plurality of laser diode modules are canceled from each other, and the stable laser output having the small ripple can be obtained.

DESCRIPTION OF EMBODIMENTS

Figure 1:
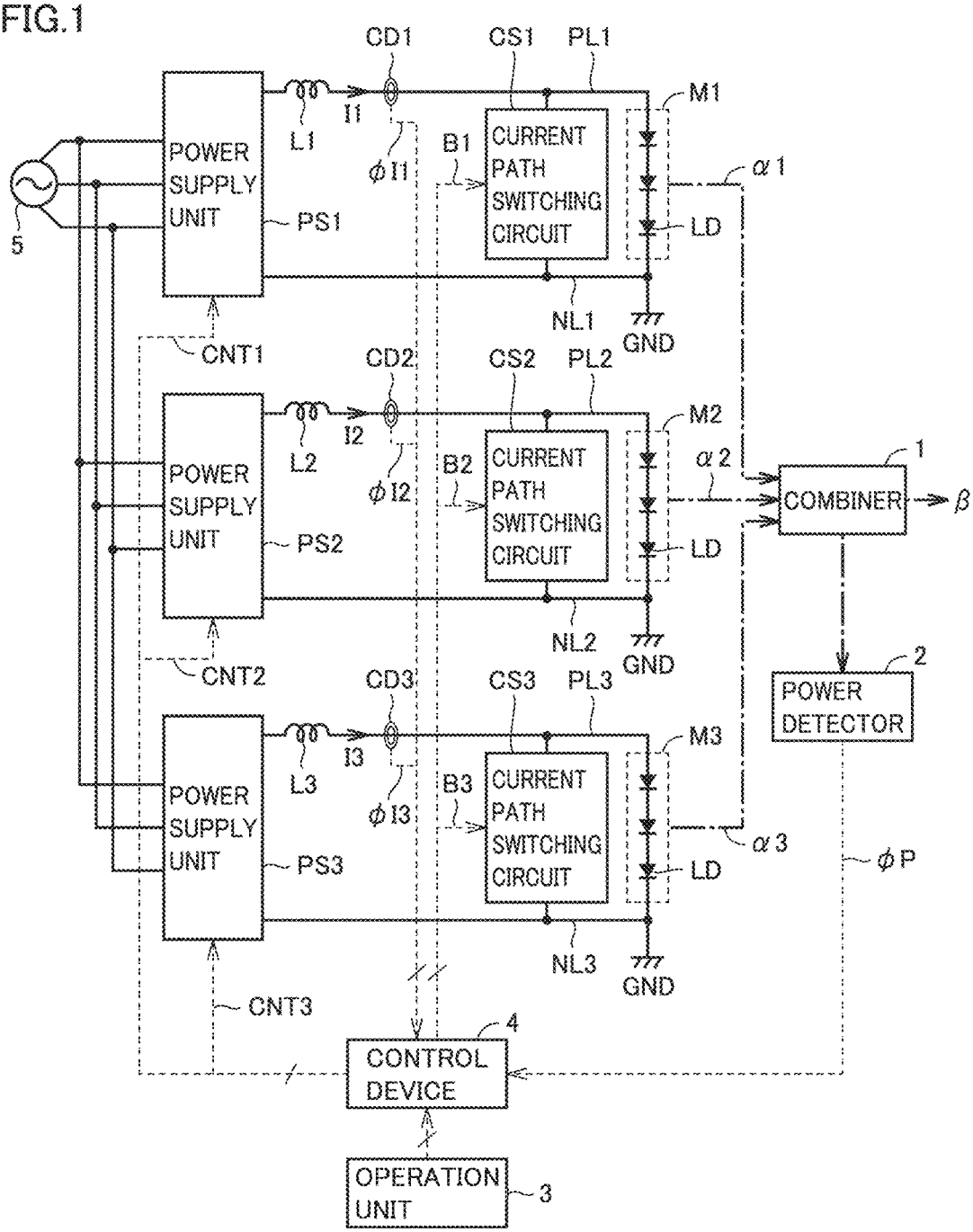
FIG. 1 is a circuit block diagram illustrating a configuration of a laser beam generation device according to a first embodiment.

With reference to the drawings, embodiments of the present invention will be described in detail below. Although a plurality of embodiments will be described below, it is planned from the beginning of the application to that the configurations of the embodiments are appropriately combined. In the drawings, the same or corresponding portion is denoted by the same reference numeral, and the description thereof will not be repeated.

First Embodiment

<Overall Configuration>

FIG. 1 is a circuit block diagram illustrating a configuration of a laser beam generation device according to a first embodiment. In FIG. 1, the laser beam generation device includes a plurality of (three in this example) power supply units PS1 to PS3, a plurality of reactors L1 to L3, a plurality of DC positive buses PL1 to PL3, a plurality of DC negative buses NL1 to NL3, current detectors CD1 to CD3, a plurality of current path switching circuits CS1 to CS3, a plurality of LD modules M1 to M3, a combiner 1, a power detector 2, an operation unit 3, and a control device 4.

Positive electrodes of power supply units PS1 to PS3 are connected to one terminals of reactors L1 to L3, respectively. The other terminals of reactors L1 to L3 are connected to one ends of DC positive buses PL1 to PL3, respectively. The other ends of DC positive buses PL1 to PL3 are connected to anode terminals of LD modules M1 to M3, respectively.

Cathode terminals of LD modules M1 to M3 are connected to a line of a ground voltage GND and connected to one ends of DC negative buses NL1 to NL3, respectively. The other ends of DC negative buses NL1 to NL3 are connected to negative electrodes of power supply units PS1 to PS3, respectively.

Power supply units PS1 to PS3 operate in synchronization with control signals CNT1 to CNT3 supplied from control device 4, respectively, and output currents I1 to I3. Hereinafter, sometimes power supply units PS1 to PS3 are collectively referred to as a "power supply unit PS", control signals CNT1 to CNT3 are collectively referred to as a "control signal CNT", and currents I1 to I3 are collectively referred to as a "current I".

Specifically, power supply unit PS performs full-wave rectification on the three-phase AC voltage from an AC power supply 5 to convert the three-phase AC voltage into a DC voltage, converts the DC voltage into an AC voltage having an amplitude corresponding to a duty ratio of control signal CNT, performs the full-wave rectification on the AC voltage, and outputs current I.

Reactors L1 to L3 smooth currents I1 to I3, respectively. When current path switching circuits CS1 to CS3 are in the non-conduction state, current detectors CD1 to CD3 detect currents I1 to I3 flowing through DC positive buses PL1 to PL3, respectively, and output signals φI1 to φI3 indicating detected values to control device 4.

One terminals of current path switching circuits CS1 to CS3 are connected to current positive buses PL1 to PL3, respectively, and the other terminals of current path switching circuits CS1 to CS3 are connected to current negative buses NL1 to NL3, respectively. Current path switching circuits CS1 to CS3 receive beam-on signals B1 to B3 from control device 4, respectively. When beam-on signal B1 is at an "L" level that is a deactivation level, terminals of the current path switching circuit CS1 become a conduction state. When beam-on signal B1 is at a "H" level that is an activation level, the terminals of the current path switching circuit CS1 become a non-conduction state. The same applies to current path switching circuits CS2, CS3.

Each of LD modules M1 to M3 includes at least one (three in this example) LD connected in series between an anode terminal and a cathode terminal. LD modules M1 to M3 are driven by currents IM1 to IM3, and output laser beams α1 to α3, respectively. When the terminals of current path switching circuit CS1 are in the conduction state, driving currents IM1 to IM3 of LD module M1 become 0 A. When the terminals of current path switching circuit CS1 are in the non-conduction state, driving current IM1 of LD module M1 becomes current I1. The same applies to driving currents IM2, IM3 of LD modules M2, M3.

Combiner 1 collects laser beams α1 to α3 from LD modules M1 to M3 and outputs the collected laser beams as one laser beam β. Power detector 2 detects power P of output laser beam β of combiner 1, and outputs a signal φP indicating the detected value. Power P of laser beam ⊕ is expressed in units such as watts and joules.

For example, operation unit 3 includes a plurality of buttons operated by a user of the laser beam generation device, a display device that displays various information, a numerical control device, and the like. The user of the laser beam generation device operates operation unit 3 to set a waveform of a beam-on signal BON indicating output timing of laser beam β. Beam-on signal BON is a signal such as a rectangular wave signal, a triangular wave signal, or a sine wave signal. Laser beam β is output when beam-on signal BON is at the "H" level, and the output of laser beam β is stopped when beam-on signal BON is at the "L" level.

The user of the laser beam generation device operates operation unit 3 to set a laser output setting value Pc indicating the power of laser beam β. Laser output setting value Pc may be a constant value or a value that changes in synchronization with beam-on signal BON. The waveform of beam-on signal BON and laser output setting value Pc are stored in a storage (not illustrated) in operation unit 3. For example, when the user of the laser beam generation device turns on an output start button included in operation unit 3, beam-on signal BON and laser output setting value Pc are read from the storage (not illustrated) and output to control device 4.

Control device 4 generates control signals CNT1 to CNT3 and beam-on signals B1 to B3 based on signals φI1 to φI3 from current detectors CD1 to CD3, signal φP from power detector 2, and laser output setting value Pc and beam-on signal BON from operation unit 3.

When beam-on signal BON is at the "H" level, control device 4 sets beam-on signals B1 to B3 to the "H" level and generates control signals CNT1 to CNT3 such that output signal φP of power detector 2 becomes laser output setting value Pc. When beam-on signal BON is at the "L" level, control device 4 sets beam-on signals B1 to B3 to the "L" level and stops the generation of control signals CNT1 to CNT3.

For example, control signal CNT is a pulse width modulation (PWM) signal. In this case, a frequency (switching frequency) of control signal CNT is constant, and the duty ratio of control signal CNT can be controlled. The duty ratio is a ratio between time during which control signal CNT is set to the "H" level within one period of control signal CNT and one period. The duty ratio of control signal CNT1 is controlled such that a deviation between a current command value Ic1 and the detected value of current detector CD1 is eliminated. Hereinafter, sometimes current command values Ic1 to Ic3 are collectively referred to as a "current command value Ic", and current detectors CD1 to CD3 are collectively referred to as a "current detector CD".

Control device 4 shifts the phases of the pulses of control signals CNT1 to CNT3 by 60 degrees. Thus, the phases of the ripples of currents IM1 to IM3 flowing through LD modules M1 to M3 are shifted by 120 degrees, and the phases of the ripples included in laser beams α1 to α3 are shifted by 120 degrees. As a result, the ripples included in laser beams α1 to α3 cancel each other, and the ripple included in laser beam β is reduced.

Control signal CNT may be a pulse frequency modulation (PFM) signal. In this case, a pulse width (time at the "H" level) of control signal CNT is constant, and the period (that is, the frequency) of control signal CNT can be controlled. For this reason, when the period (that is, the frequency) of the control signal CNT changes, the duty ratio of the control signal CNT changes. The frequency of control signal CNT is controlled such that the deviation between current command value Ic and the detected value of current detector CD is eliminated.

Although FIG. 1 illustrates the case where three sets of power supply unit PS, reactor L, current detector CD, current path switching circuit CS, and LD module M are provided, the number of sets is not limited to three, and may be two or four or more. For example, AC power supply 5 supplies an AC voltage of 100 V to 480 V to power supply units PS1 to PS3. AC power supply 5 may be a three-phase AC power supply or a single-phase AC power supply. AC power supply 5 may be a commercial AC power supply or a private power generator. Hereinafter, each component of the laser beam generation device will be described in detail.

<Control Device 4>

Figure 2:
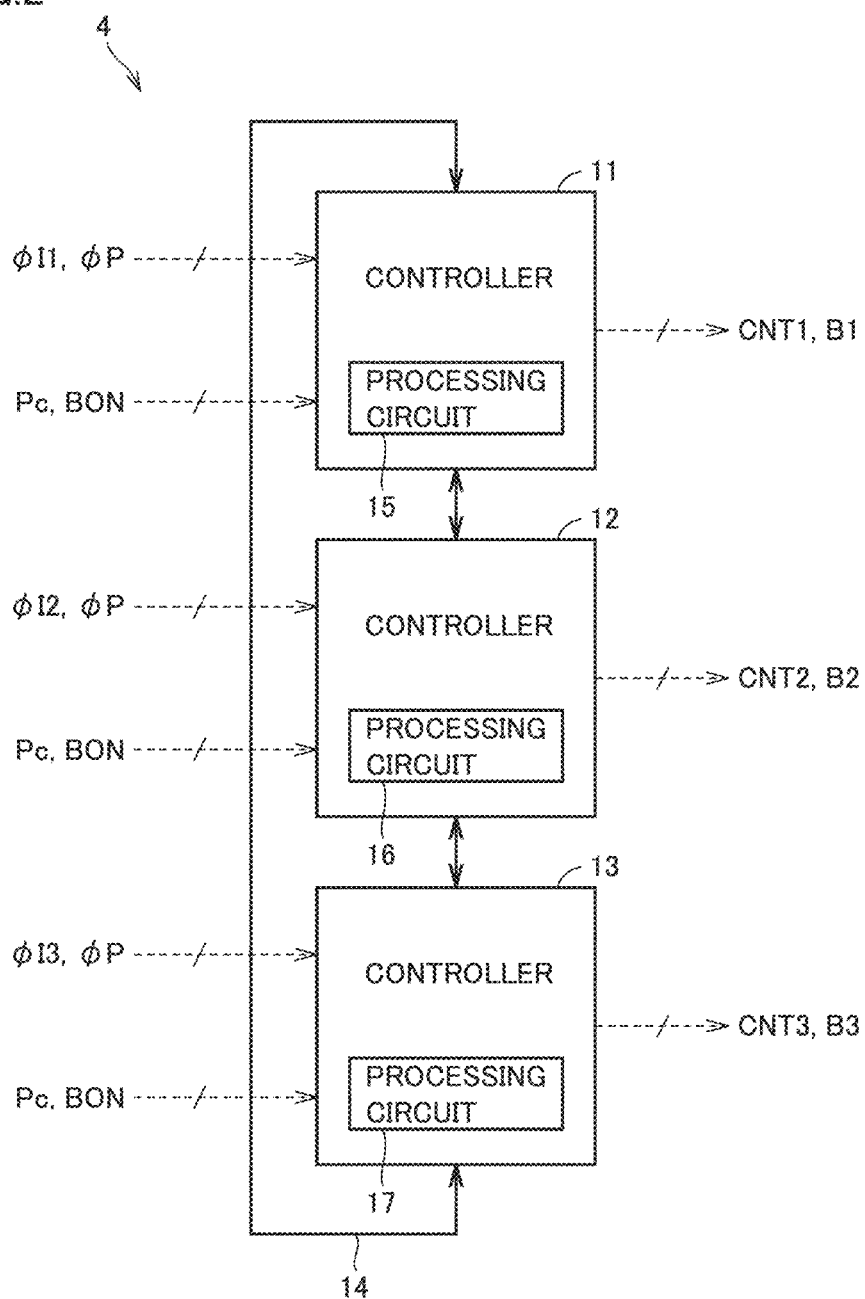
FIG. 2 is a block diagram illustrating a configuration of a control device in FIG. 1.

FIG. 2 is a block diagram illustrating a configuration of control device 4. In FIG. 2, control device 4 includes a plurality of controllers 11 to 13 corresponding to the plurality of power supply units PS1 to PS3, respectively. Controllers 11 to 13 are connected to each other by a communication line 14 such as a communication cable, exchange information with each other, and operate in synchronization with each other. Controller 11 to 13 detect that a number N of power supply units PS is three, and determine to shift the phases of the pulses of control signals CNT1 to CNT3 by 180/N=60 degrees.

Controller 11 generates control signal CNT1 and beam-on signal B1 based on signal φI1 from current detector CD1, signal φP from power detector 2, and laser output setting value Pc and beam-on signal BON from operation unit 3.

Controller 12 generates control signal CNT2 and beam-on signal B2 based on signal φI2 from current detector CD2, signal φP from power detector 2, and laser output setting value Pc and beam-on signal BON from the operation unit 3. The phase of the pulse of control signal CNT2 is delayed by 60 degrees from the phase of the pulse of control signal CNT1.

Controller 13 generates control signal CNT3 and beam-on signal B3 based on signal φI3 from current detector CD3, signal φP from power detector 2, and laser output setting value Pc and beam-on signal BON from the operation unit 3. The phase of the pulse of control signal CNT3 is delayed by 60 degrees from the phase of the pulse of control signal CNT2.

The functions of controller 11 to 13 can be implemented using processing circuit 15 to 17. Processing circuit 15 to 17 refers to dedicated hardware such as a dedicated processing circuit, a processor, and a storage device. When dedicated hardware is used, the dedicated processing circuit corresponds to a single circuit, a composite circuit, a programmed processor, a parallel programmed processor, an application specific integrated circuit (ASIC), a field programmable gate array (FPGA), or a combination thereof. The functions of controller 11 to 13 may be collectively implemented by one processing circuit.

When the processor and the storage device are used, the above functions are implemented by software, firmware, or a combination thereof. The software or firmware is described as a program and stored in the storage device. The processor reads and executes the program stored in the storage device. It can also be said that these programs cause a computer to execute a procedure and a method for implementing each of the above functions.

The storage device corresponds to a semiconductor memory such as a random access memory (RAM), a read only memory (ROM), a flash memory, an erasable programmable read only memory (EPROM), or an electrically erasable programmable read only memory (EEPROM (registered trademark)). The semiconductor memory may be a nonvolatile memory or a volatile memory. In addition to the semiconductor memory, the storage device corresponds to a magnetic disk, a flexible disk, an optical disk, a compact disk, a mini disk, or a digital versatile disc (DVD).

Figure 3:
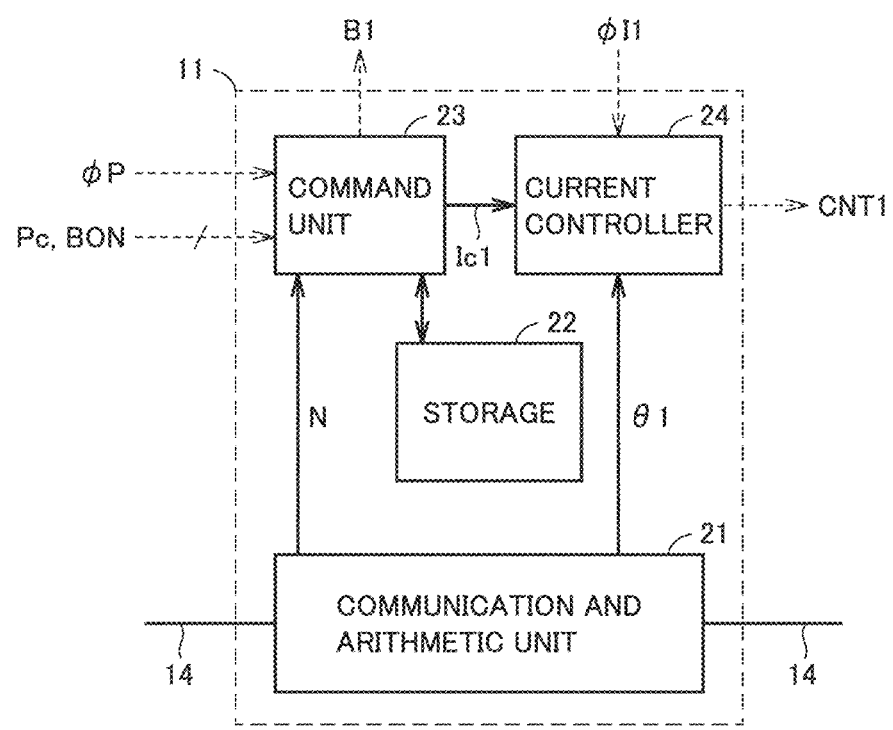
FIG. 3 is a block diagram illustrating a configuration of a controller in FIG. 2.

FIG. 3 is a block diagram illustrating a configuration of controller 11. In FIG. 3, controller 11 includes a communication and arithmetic unit 21, a storage 22, a command unit 23, and a current controller 24. Communication and arithmetic unit 21 communicates with other controllers 12, 13 through communication line 14, obtains number N of power supply units PS to be operated and a phase angle $\theta 1$ of corresponding control signal CNT1, and provides number N and phase angle $\theta 1$ to command unit 23 and current controller 24.

In this case, number N of power supply units PS to be operated is three. In addition, when a number of corresponding power supply unit PS is n, a phase angle $\theta n$ is calculated by $\theta n=180\times(n-1)/N$. Because number n of power supply unit PS1 corresponding to controller 11 is one, $\theta 1$ becomes 0 degrees. A phase angle $\theta 2$ of control signal CNT2 is 60 degrees, and a phase angle $\theta 3$ of control signal CNT3 is 120 degrees.

Storage 22 previously stores a share ratio SR1 of the laser output of corresponding LD module M1. At this point, SR1=1/N. Laser output share ratios SR1, SR3 of LD modules M2, M3 are also 1/N. Consequently, in the first embodiment, share ratios SR1 to SR3 of the laser outputs of LD modules M1 to M3 are 1/N=1/3.

Command unit 23 generates current command value Ic1 such that a value P/3 obtained by multiplying power P of output laser beam β indicated by output signal φP of power detector 2 by share ratio SR1=1/3 becomes a value Pc/3 obtained by multiplying laser output setting value Pc by share ratio SRA=1/3, and generates beam-on signal B1 delayed from beam-on signal BON. Beam-on signal B1 is provided to current path switching circuit CS1, and current command value Ic1 is provided to current controller 24.

Current controller 24 generates control signal CNT1 such that current I1 indicated by an output signal φI1 of current detector CD1 becomes current command value Ic1. Phase angle $\theta 1$ of the pulse of control signal CNT1 is 0 degrees as described above. The duty ratio of control signal CNT1 is controlled such that the deviation between current I1 and current command value Ic1 is eliminated. That is, current controller 24 decreases the duty ratio of control signal CNT1 in the case of I1>Ic1, and increases the duty ratio of control signal CNT1 in the case of I1<Ic1. Thus, current I1 is controlled by current command value Ic1. The configuration of each of other controllers 12, 13 is similar to the configuration of controller 11.

Current command value Ic may be determined only from laser output setting value Pc with no use of output signal φP of power detector 2. That is, when current command value Ic is determined only from laser output setting value Pc, current command value Ic is determined from laser output setting value Pc based on the current-power characteristics (I-P characteristics) of LD modules M1 to M3 (hereinafter, collectively referred to as an "LD module M"). The I-P characteristic may be described in a data sheet or the like, or may be previously measured. The I-P characteristic may be stored in storage 22. The I-P characteristic is stored in storage 22, so that current command value Ic can be determined from the I-P characteristic.

In this case, because power detector 2 and the peripheral circuit of power detector 2 are unnecessary, the cost of the device can be reduced. However, even when a current having the same magnitude as current command value Ic flows through LD module M1, there is a risk that laser beam β having power P different from laser output setting value Pc is output due to the degradation of LD module M, variations in I-P characteristics, or the like.

When current command value Ic is determined using laser output setting value Pc and output signal φP of power detector 2, current command value Ic1 is determined from laser output setting value Pc based on the current I-P characteristic of LD module M. At this point, the current I-P characteristic of LD module M is a characteristic of the laser output with respect to driving current IM of LD module M obtained from output signal φP of power detector 2 and the detected value of current detector CD when LD module M is driven, or obtained from output signal φP of power detector 2 and current command value Ic.

At this point, laser beam β having the same power as laser output setting value Pc can be obtained even when LD module M degrades or the I-P characteristics varies. In addition, because a degree of degradation of LD module M can be known from the current I-P characteristics, a residual lifetime of LD module M can be predicted.

<Power Supply Units PS1 to PS3>

Figure 4:
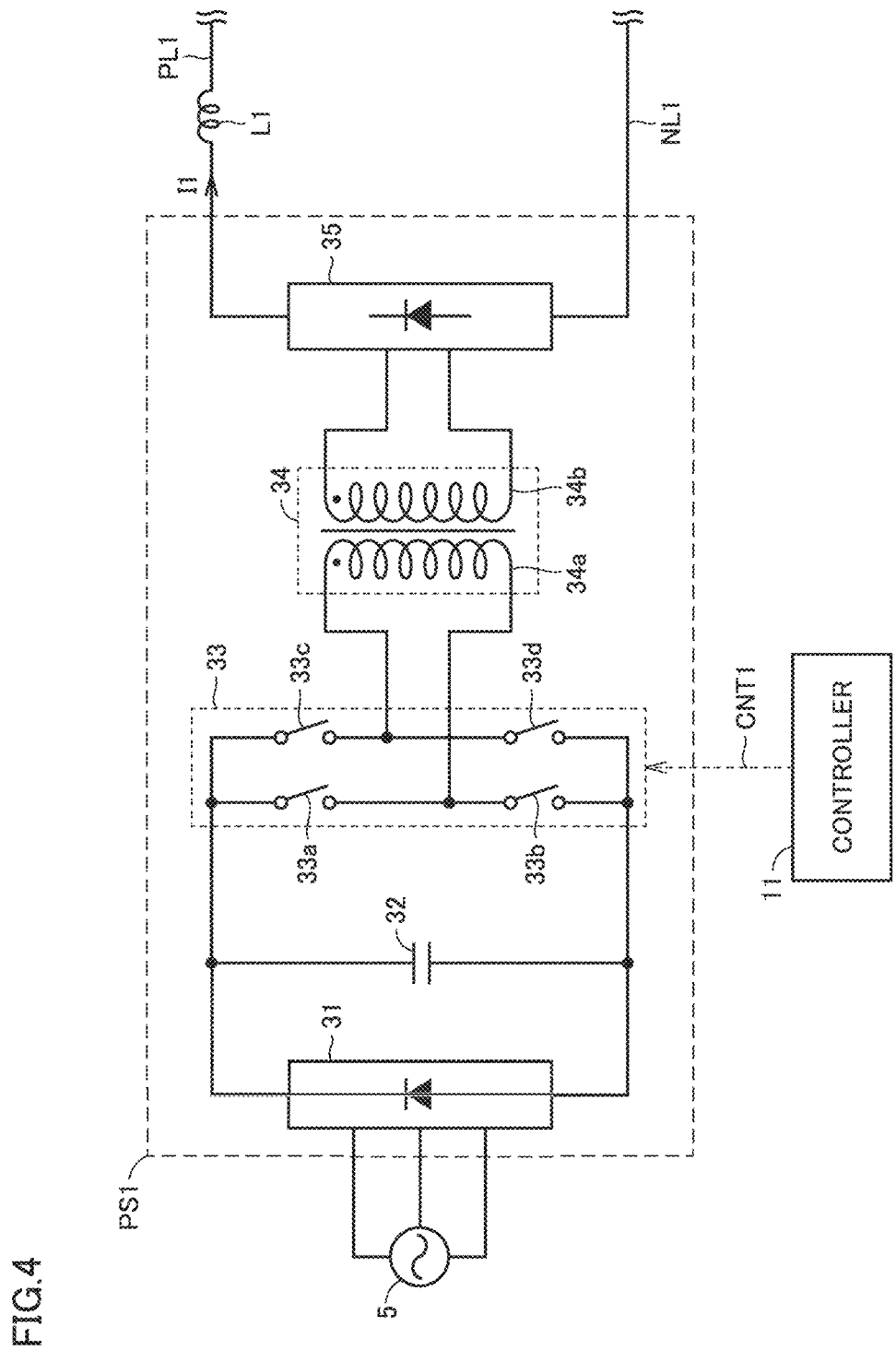
FIG. 4 is a circuit block diagram illustrating a configuration of a power supply unit in FIG. 1.

FIG. 4 is a circuit block diagram illustrating a configuration of power supply unit PS1 in FIG. 1. In FIG. 4, power supply unit PS1 includes a rectifier circuit 31 that rectifies the AC voltage supplied from AC power supply 5, a smoothing capacitor 32 that smooths the output voltage of rectifier circuit 31, a full-bridge circuit 33 that receives the DC voltage supplied from rectifier circuit 31 and smoothing capacitor 32 and outputs the AC voltage, a transformer 34 that transforms the AC voltage supplied from full-bridge circuit 33 to a primary winding 34*a* and outputs the transformed AC voltage from a secondary winding 34*b*, and a rectifier circuit 35 that rectifies the AC voltage output from transformer 34.

Full-bridge circuit 33 includes four switching elements 33*a* to 33*d*. When control signal CNT1 is at the "H" level, switching elements 33*a*, 33*d* are turned off, and switching elements 33*b*, 33*c* are turned on. When control signal CNT1 is at the "H" level, switching elements 33*a*, 33*d* are turned off, and switching elements 33*b*, 33*c* are turned on. When control signal CNT1 is at the "L" level, switching elements 33*a*, 33*d* are turned on, and switching elements 33*b*, 33*c* are turned off.

When the duty ratio of control signal CNT1 increases, the on time of switching elements 33*b*, 33*c* increases, the amplitude of the AC output voltage of transformer 34 increases, the DC output voltage of rectifier circuit 35 increases, and current I1 output from power supply unit PS1 increases.

Conversely, when the duty ratio of control signal CNT1 decreases, the on time of switching elements 33*b*, 33*c* decreases, the amplitude of the AC output voltage of transformer 34 decreases, the DC output voltage of rectifier circuit 35 decreases, and current I1 output from power supply unit PS1 decreases. Full-bridge circuit 33 and transformer 34 constitute an AC voltage generation circuit that outputs an AC voltage having an amplitude of a value corresponding to the duty ratio of corresponding control signal CNT1 and a frequency of a value corresponding to the frequency of corresponding control signal CNT1. Consequently, power supply unit PS1 is driven by the AC power supplied from AC power supply 5, and outputs current I1 having the value corresponding to control signal CNT1 supplied from controller 11.

Instead of full-bridge circuit 33, a circuit method that optimizes efficiency and cost according to the amount of power to be converted, such as a forward circuit method, a flyback circuit method, a push-pull circuit method, a half-bridge circuit method, or a chopper circuit method, which is a circuit method of a general DC-DC converter, may be adopted, or a composite form of these circuit methods may be adopted.

Rectifier circuits 31, 35 are full-wave rectifier circuits including diodes. The configurations of rectifier circuits 31, 35 are not limited thereto. Rectifier circuits 31 and 35 may be configured using switching elements instead of diodes. In this case, a loss can be reduced.

An insulated gate bipolar transistor (IGBT), a metal oxide semiconductor field effect transistor (MOSFET), or the like can be used as the switching element used in power supply unit PS or current path switching circuit CS. In this case, the switching element made of a material of silicon (Si) can be used, but when the switching element made of a material of silicon carbide (SiC) or gallium nitride (GaN) is used, a switching loss and a conduction loss can be suppressed, and high efficiency and a low loss of power supply unit PS1 can be achieved. Hereinafter, the case where an N-type MOSFET is used as the switching element will be described. However, the present invention is not limited to the use of the N-type MOSFET.

The configurations of power supply units PS2, PS3 are similar to the configuration of power supply unit PS1. In the first embodiment, because three power supply units PS1 to PS3 that supply power to three LD modules M1 to M3, respectively, are provided, power capacity of each of power supply units PS1 to PS3 can be reduced. Thus, it is possible to use inexpensive and general-purpose transformer 34 having the small power capacity and inexpensive and general-purpose reactors L1 to L3 having the small power capacity in the case of the chopper circuit system.

<Reactors L1 to L3>

Reactors L1 to L3 smooth currents I1 to I3 supplied from power supply units PS1 to PS3 to LD modules M1 to M3, respectively, thereby reducing the current ripple generated in the driving current of LD modules M1 to M3. Thus, the power of output laser beams α1 to α3 of LD modules M1 to M3 can be stabilized.

When the large current flows through each of reactors L1 to L3, an edgewise coil or a fully molded reactor may be used as each of reactors L1 to L3. The edgewise coil refers to a coil in which a rectangular wire is wound in an edgewise direction, and because the winding has a one-layer structure, heat dissipation can be enhanced as compared with a multilayer-structure reactor in which the winding has a round type.

In addition, because the reactor molded as a whole can dissipate heat from the molded portion, the molded reactor has higher heat dissipation than a reactor not molded. For this reason, a temperature rise of each reactor can be suppressed using the edgewise coil or the reactor in which the entire reactor is molded. Thus, a cooling mechanism (for example, a heat dissipation fin, a water cooling mechanism, and the like) necessary for dissipating heat from the reactor is downsized, and a cooling system (for example, forced air cooling to natural air cooling) is simplified, so that the number of cooling members can be reduced.

A smoothing capacitor may be provided in parallel to each of current path switching circuits CS1 to CS3. Specifically, the smoothing capacitors connected in parallel between a DC positive bus PL1 and a DC negative bus NL1, between a DC positive bus PL2 and a DC negative bus NL2, and between a DC positive bus PL3 and a DC negative bus NL3 may be provided.

When such the smoothing capacitor is provided, rise and fall speeds of the driving current of LD module M decrease, so that there is a risk that a response speed of the laser output of LD module M decreases. In addition, in order to absorb the current ripple generated in the input and output current by the switching operation of full-bridge circuit 33, it is necessary to provide the smoothing capacitor having high ripple tolerance. Furthermore, when the current ripple is large, it is necessary to increase the number of parallel capacitors, and the device becomes large and expensive.

However, because current I output from power supply unit PS can be further smoothed, the current supplied to LD module M can be further smoothed, and the laser output of LD module M can be further stabilized. Accordingly, when the response speed of the laser output is not obtained, it is better to provide the smoothing capacitor.

<Current Detectors CD1 to CD3>

A series resistive element (shunt resistive element), a current transformer (CT), a Hall current sensor, or the like is often used as current detector CD. In addition, an integrated circuit (IC) for current detection may be used as current detector CD. The cost can be reduced using a general-purpose component.

<Current Path Switching Circuits CS1 to CS3>

Figure 5:
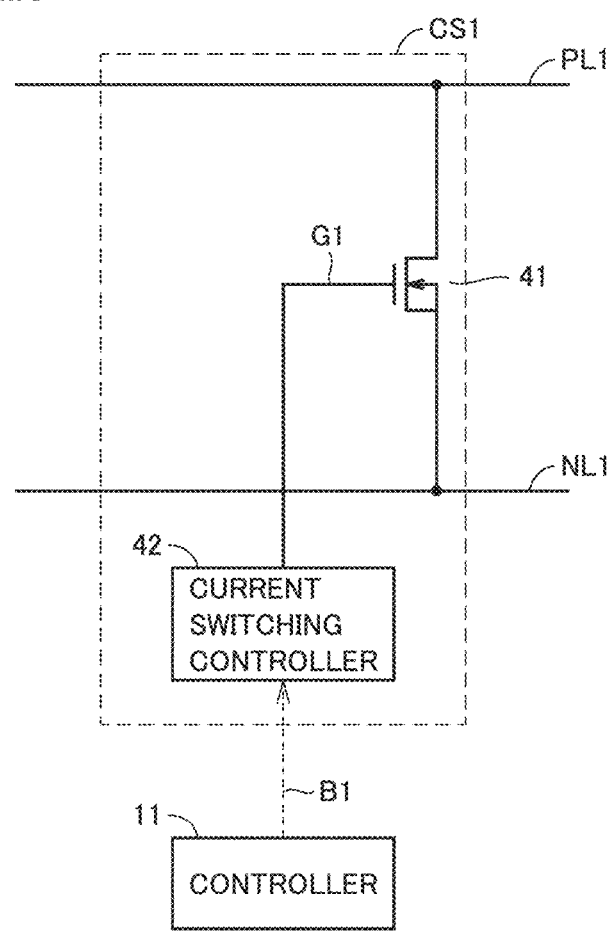
FIG. 5 is a circuit block diagram illustrating a configuration of a current path switching circuit in FIG. 1.

FIG. 5 is a circuit block diagram illustrating a configuration of current path switching circuit CS1 in FIG. 1. In FIG. 5, current path switching circuit CS1 includes a switching element 41 connected between DC positive bus PL1 and DC negative bus NL1 and a current switching controller 42 that controls switching element 41. For example, switching element 41 is an N-type MOSFET. Current switching controller 42 converts beam-on signal B1 supplied from the controller 11 (FIG. 3) into a gate signal G1 used to turn on and off switching element 41.

The operation of current path switching circuit CS1 will be described below. In the state where power supply unit PS1 is driven and the current flows through reactor L1, beam-on signal B1 is supplied to current switching controller 42, and current switching controller 42 controls on and off of switching element 41, thereby switching whether current I1 output from reactor L1 flows through LD module M1 or switching element 41.

Current I1 flows to LD module M1 when switching element 41 is turned off, and current I1 flows to switching element 41 in current path switching circuit CS1 when switching element 41 is turned on. That is, in current path switching circuit CS1, the driving current of LD module M1 is raised or fallen according to beam-on signal B1.

When current path switching circuit CS1 is not provided, it is necessary to store energy in reactor L1 when the driving current of LD module M1 is raised, so that there is a problem that the time required for raising the driving current of LD module M1 becomes long. In addition, when the driving current of LD module M1 is fallen, there is a problem that the time required for falling the driving current of LD module M1 becomes long due to the energy stored in reactor L1.

On the other hand, in the case where current path switching circuit CS1 is provided, when the driving current of LD module M1 is raised, switching element 41 is turned on before the driving current of LD module M1 is raised, the current flows through reactor L1, and the energy is previously stored in the reactor L1, so that the time required for raising the driving current of LD module M1 can be shortened.

When the driving current of LD module M1 is fallen, switching element 41 is turned on to switch the current path of the output current of reactor L1, so that the time required for falling the driving current of LD module M1 can be shortened. That is, by providing current path switching circuit CS1, the time required for raising or falling the driving current of LD module M1 can be shortened, and the laser output can be instantaneously switched on and off.

When the driving current of LD module M1 is large, a snubber circuit may be further provided in parallel with respect to switching element 41 in order to suppress a surge voltage generated in turning off switching element 41. For example, an RCD snubber circuit or the like, in which the resistive element and the capacitor are arranged in parallel and the diode is connected in series to the resistive element and the capacitor, may be used as the snubber circuit.

In a large device such as the laser processing apparatus, current path switching circuit CS1 and LD module M1 are often separated from each other. In this case, the wiring between current path switching circuit CS1 and LD module M1 is lengthen, and there is a risk that the suitable control of the driving current of LD module M1 becomes difficult due to the parasitic inductance of the wiring.

In order to reduce a parasitic inductance value of the wiring between current path switching circuit CS1 and LD module M1, current path switching circuit CS1 may be installed near LD module M1 such that the wiring between current path switching circuit CS1 and LD module M1 is shortened. In addition, the wiring may be performed such that a loop area of the wiring between current path switching circuit CS1 and LD module M1 is minimized in order to increase a cancellation effect of mutual inductance of the wiring. Each of current path switching circuits CS2, CS3 is the same as current path switching circuit CS1.

<LD Modules M1 to M3>

Each of LD modules M1 to M3 includes at least one LD. When LD module M includes a plurality of LDs, the plurality of LDs are connected in series in a forward direction between the anode terminal and the cathode terminal of LD module M. In the high-power laser device, at least one LD module M is used.

<Combiner 1>

Combiner 1 has a function of combining laser beams α1 to α3 of three LD modules M1 to M3. Not only an optical fiber type but also a prism, a mirror, an optical coupling element, or the like may be used as combiner 1.

<Power Detector 2>

FIG. 1 schematically illustrates an example that part of laser beam ft is incident from combiner 1 to power detector 2. When laser beam β propagates in space, for example, a beam splitter or the like is used to branch laser beam β, and part of laser beam β is detected. In addition, when laser beam β propagates in the optical fiber, for example, light from an end of the optical fiber branched using an optical branching device can be detected, or leak light can be detected from a clad of the optical fiber.

An incident structure of laser beams α1 to α3 on power detector 2 is not limited to the structure in FIG. 1. Power detector 2 is a sensor that detects the magnitude of the laser output, and indicates a sensor that measures an amount of light by any one of photoelectric, thermal, photochemical, and mechanical methods. Because a photodiode (PD) that can photoelectrically measure the laser output is high sensitivity and a high response speed, the PD may be used as power detector 2.

<Basic Operation of Laser Beam Generation Device>

Three controllers 11 to 13 (FIG. 2) included in control device 4 control three power supply units PS1 to PS3 (FIG. 1), and control the driving currents of three LD modules M1 to M3, respectively. Command unit 23 (FIG. 3) of controller 11 determines the driving current of LD module M1 such that a value P/3 of 1/3 of power P of laser beam β indicated by output signal φP of power detector 2 is matched with a value Pc/3 of 1/3 of laser output setting value Pc, and command unit 23 outputs the driving current as current command value Ic1. This is because laser beam α1 having the power of 1/3 of laser output setting value Pc is output from LD module M1.

In addition, current controller 24 (FIG. 3) performs the on and off control of switching elements 33a to 33d included in full-bridge circuit 33 (FIG. 4) of power supply unit PS1 such that current I1 indicated by output signal φI1 of current detector CD1 is matched with current command value Ic1 supplied from command unit 23. At this point, the switching frequencies of full-bridge circuits 33 of power supply units PS1 to PS3 are equal to each other, and the switching phases are shifted by 60 degrees.

In each of power supply units PS1 to PS3, because the AC current output from full-bridge circuit 33 is full-wave rectified by rectifier circuit 35 (FIG. 4), the current ripple having the frequency twice the switching frequency is generated in the rectified current. Consequently, the phase difference between the current ripples generated in currents I1 to I3, which are output from power supply units PS1 to PS3 and flow through reactors L1 to L3, is 120 degrees.

When switching elements 41 of current path switching circuits CS1 to CS3 are turned off, currents I1 to I3 flowing through reactors L1 to L3 are equal to the driving currents of LD modules M1 to M3. For this reason, the current ripples generated in the driving currents of three LD modules M1 to M3 have the phase difference of 120 degrees from each other, and the ripples of the laser outputs of LD modules M1 to M3 also have the phase difference of 120 degrees from each other, so that the laser output obtained by combining the laser outputs of LD modules M1 to M3 by combiner 1 can become stable by an effect that the ripples of the laser outputs cancel each other.

Figure 6:
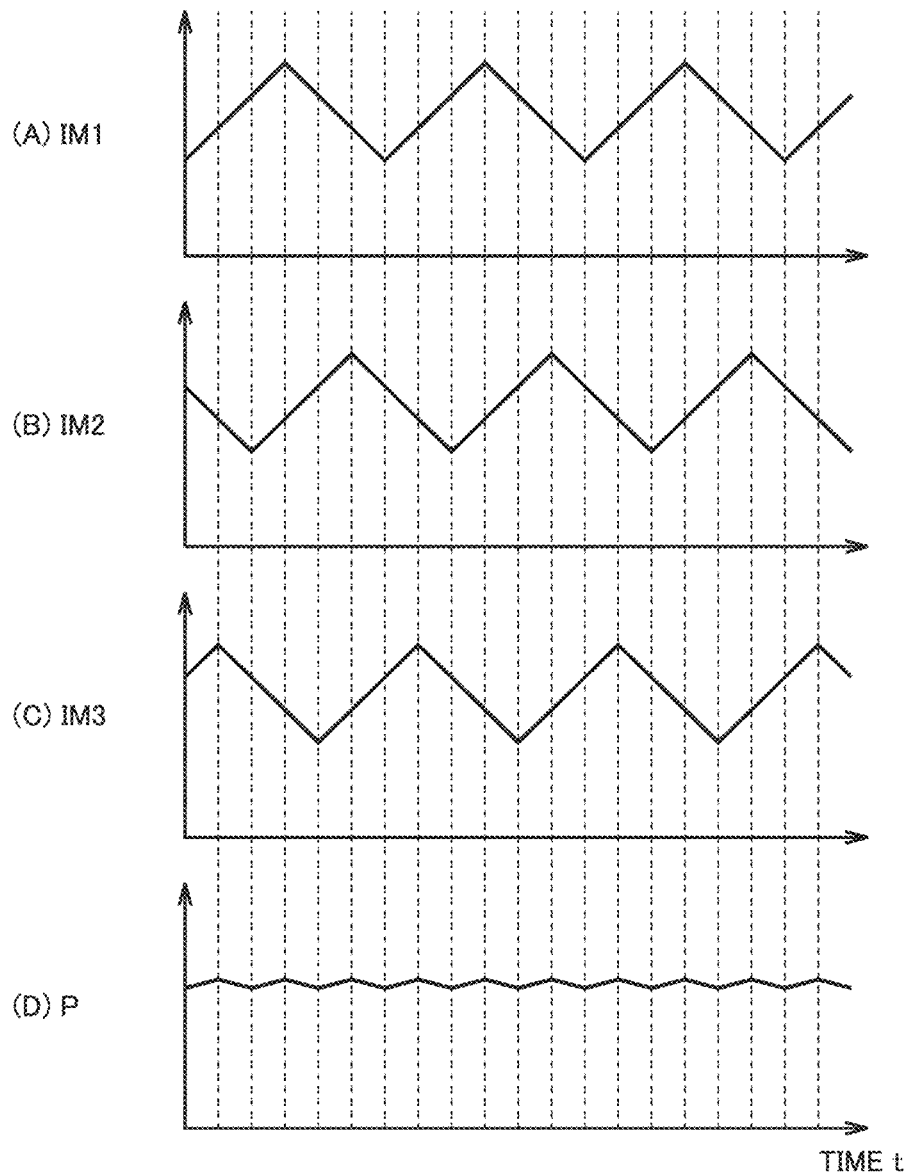
FIG. 6 is a time chart illustrating operation of the laser beam generation device in FIGS. 1 to 5.

FIG. 6 is a time chart illustrating the operation of the laser beam generation device in FIGS. 1 to 5. FIGS. 6(A) to 6(C) illustrate waveforms of currents IM1 to IM3 flowing through LD modules M1 to M3, respectively, and FIG. 6(D) illustrates the waveform of power P of laser beam β. As can be seen from FIG. 6, because the phases of the current ripples generated in driving currents IM1 to IM3 of LD modules M1 to M3 are shifted by 120 degrees, the ripple of power P of laser beam β is reduced.

COMPARATIVE EXAMPLE

Figure 7:
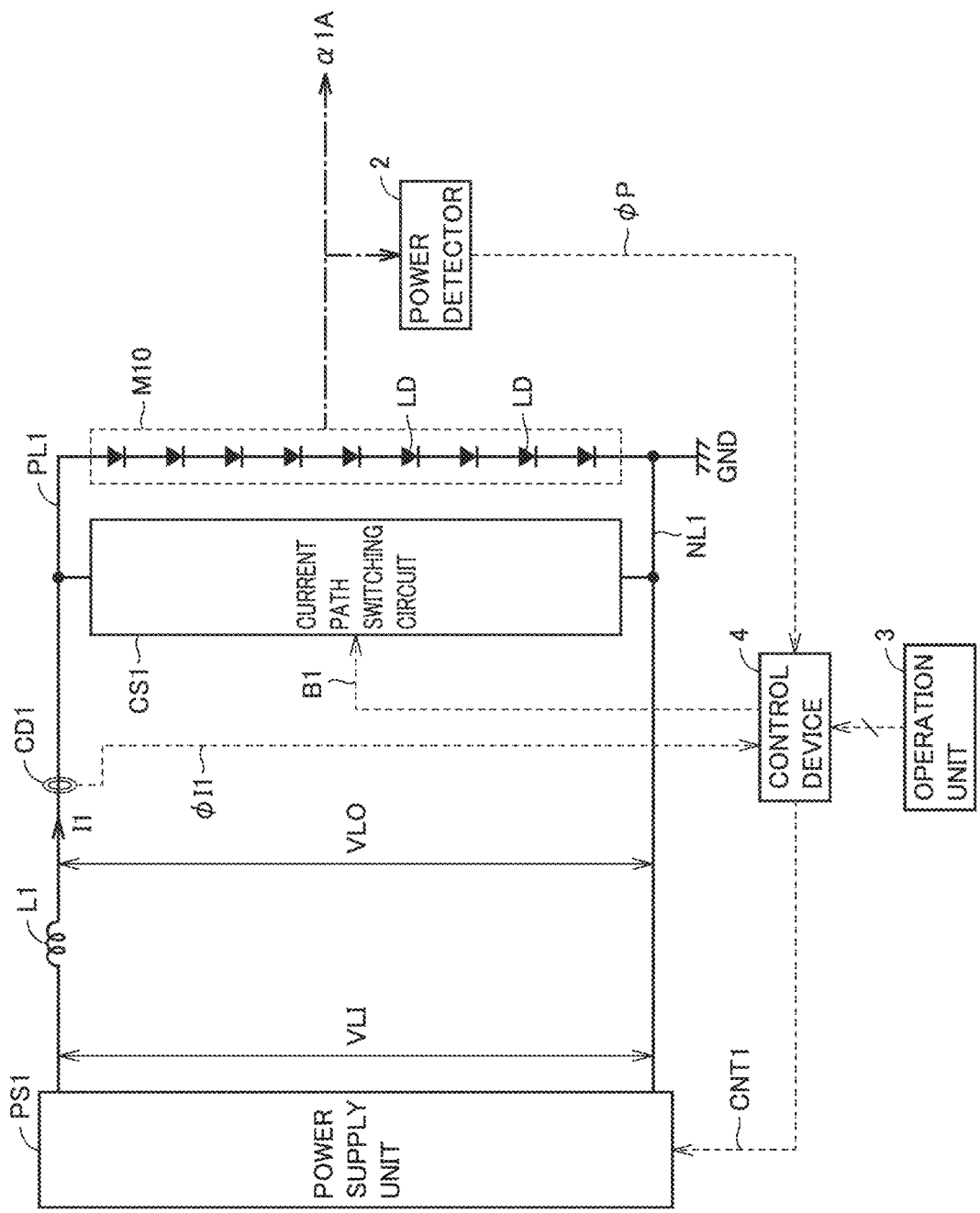
FIG. 7 is a circuit block diagram illustrating a comparative example of the first embodiment.

FIG. 7 is a circuit block diagram illustrating a comparative example of the first embodiment and is a view compared with FIG. 1. Referring to FIG. 7, a laser beam generation device of a comparative example is different from the laser beam generation device of FIG. 1 in that power supply units PS2, PS3, reactors L2, L3, current detectors CD2, CD3, current path switching circuits CS2, CS3, LD modules M2, M3, and combiner 1 are removed, and LD module M1 is replaced with a LD module M10.

LD module M10 includes a plurality of (nine in this example) LDs connected in series. The number of LDs (9) included in LD module M10 is equal to the number of LDs (3×3=9) included in LD modules M1 to M3 (FIG. 1). Power detector 2 detects the power of laser beam α1A output from LD module M10, and provides signal φP indicating the detected value to control device 4.

A ripple rate of laser beam α1A will be described below. In FIG. 7, it is assumed that switching element 41 of current path switching circuit CS1 is turned off, and that current I1 flowing through reactor L1 and a driving current IM10 of LD module M10 have the same value.

When the output voltage of power supply unit PS1 is a rectangular wave voltage having an amplitude value of VLI and a frequency of f, when the voltage on the output side of reactor L1 is VLO, and when the inductance value of reactor L1 is L, a current ripple (peak-to-peak) IR superimposed on the current flowing through reactor L1 is expressed by the following equation (1).

$$IR=(VLI-VLO)/(L \times f) \times VLO/VLI \qquad (1)$$

For example, when VLI is set to 200 V, when VLO is set to 50 V, when f is set to 100 kHz, and when L is set to 100 μH, current ripple IR superimposed on current I1 flowing through reactor L1 is 3.75 A by the equation (1). At this point, when a current ripple rate Ri is defined as Ri=IR/I1× 100(%) and when current I1 is 40 A, Ri=(3.75/2)/40× 100=±4.7%.

Figure 8:
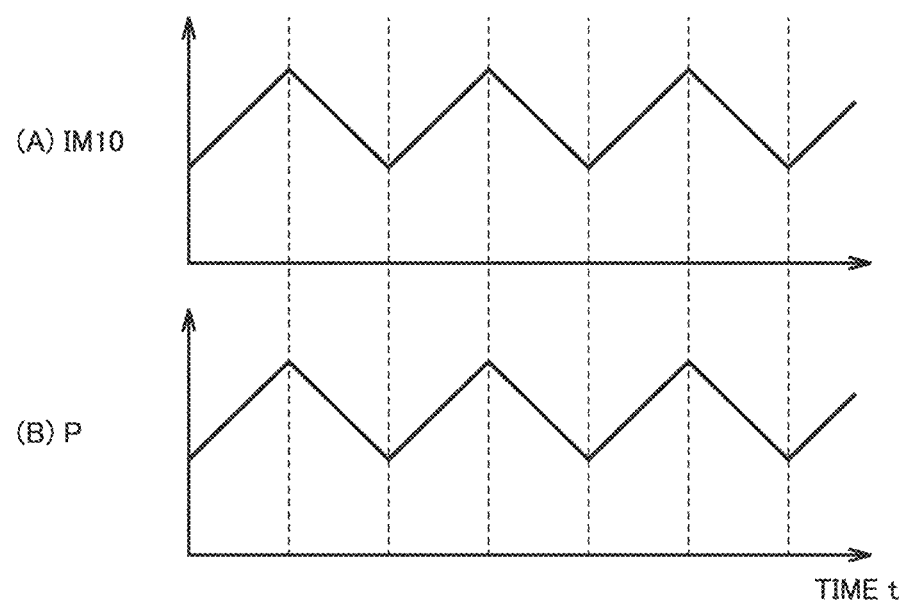
FIG. 8 is a time chart illustrating operation of a laser beam generation device in FIG. 7.

FIG. 8 is a time chart illustrating the operation of the laser beam generation device in FIG. 7. FIG. 8(A) illustrates the waveform of current IM10 flowing through LD module M10, and FIG. 8(B) illustrates the waveform of the power of a laser beam α1A output from LD module M10.

In the comparative example, driving current IM10 of LD module M10 and laser output P have a proportional relationship. In this case, when the current ripple of driving current IM10 of LD module M10 is ±4.7%, the ripple rate of laser output P of LD module M10 is ±4.7%. That is, the ripple rate of laser output P of the laser beam generation device according to the comparative example is ±4.7%.

First Effect of First Embodiment

The ripple rate of the laser output in the laser beam generation device of the first embodiment will be described below. In order to obtain the same laser output in the laser beam generation device of the first embodiment and the laser beam generation device of the comparative example, the voltage between the terminals of each LD included in LD modules M1 to M3 needs to be the same as the voltage between the terminals of each LD included in LD module M10. For this purpose, because the number of LDs included in each of LD modules M1 to M3 is 1/3 of the number of LDs included in LD module M10, the voltage between the terminals of each of LD modules M1 to M3 needs to be 1/3 of the voltage between the terminals of LD module M10.

Consequently, voltage VLO on the output side of reactor L1 in the laser beam generation device of the first embodiment is set to 50/3 V, which is 1/3 of voltage VLO on the output side of reactor L1 in the laser beam generation device of the first embodiment. Similarly to the comparative example, when VLI is set to 200 V, when f is set to 100 kHz, and when L is set to 100 μH, current ripple IR superimposed on current I1 flowing through reactor L1 is 1.53 A by the equation (1). At this point, when current I1 flowing through reactor L1 is 40 A, current ripple rate Ri flowing through reactor L1 is Ri=(1.53/2)/40=±1.9%.

In the case where driving currents IM1 to IM3 of LD modules M1 to M3 and the power of laser beams α1 to α3 have a proportional relationship, when the current ripple rate of driving currents IM1 to IM3 of LD modules M1 to M3 is ±1.9%, the ripple rate of the power of output laser beams α1 to α3 of LD modules M1 to M3 is ±1.9%.

In the first embodiment, as illustrated in FIGS. 6(A) to 6(D), the phases of the ripples of driving currents I1 to I3 of LD modules M1 to M3 are shifted by 120 degrees. Consequently, the ripple phases of the power in output laser beams α1 to α3 of LD modules M1 to M3 are also shifted by 120 degrees. Furthermore, because output laser beams α1 to α3 of LD modules M1 to M3 are combined and output by combiner 1, the ripple rate of the power of laser beam β is ±1.9%÷3=±0.6%.

As described above, in the first embodiment, the more stable laser output than that of the comparative example can be obtained. When the laser beam generation device of the first embodiment is used as the laser processing apparatus and an object is processed by irradiation of laser beam β, flatness accuracy of a processed section can be improved at the time of laser processing.

Second Effect of First Embodiment

In the laser beam generation device of the first embodiment, because the voltage between the terminals of each of LD modules M1 to M3 can be reduced to 1/3 of the voltage between the terminals of LD module M10 of the comparative example, a low-cost withstand voltage product can be used as switching element 41 (FIG. 5) of current path switching circuit CS.

In addition, because switching element 41 having a low price and a low withstand voltage has a low on-resistance value, switching element 41 can also contribute to high efficiency. For example, while the on-resistance value of the N-type MOSFET having the withstand voltage of 900 V is 0.73Ω, the on-resistance value of the N-type MOSFET having the withstand voltage of 300 V is 0.04Ω, and the conduction loss due to the on-resistance value can be reduced, and the efficiency can be improved. The on-resistance value of the N-type MOSFET of each withstand voltage is an example of the minimum on-resistance value that is generally used at the present time.

Third Effect of First Embodiment

Instead of improving the stability of the laser output, inductance values L of reactors L1 to L3 can be reduced. For example, the inductance values of reactors L1 to L3 in the laser beam generation device of the first embodiment are set to 1/3 of the inductance value of reactor L1 in the laser beam generation device of the comparative example. In this case, the current ripple rates of the driving currents of LD modules M1 to M3 are three times the current ripple rate of the driving current of LD module M1 in the first effect of the first embodiment.

However, in the first embodiment, because output laser beams α1 to α3 of LD modules M1 to M3 are coupled by combiner 1, the ripple rate of the laser output obtained from combiner 1 is reduced to 1/3 as compared with the ripple rate of the laser output of each of LD modules M1 to M3, which becomes the same as the ripple rate of the laser output of the laser beam generation device in the first effect of the first embodiment. Consequently, the inductance values of reactors L1 to L3 can be reduced when the stability of the laser output is approximately the same as that of the laser beam generation device of the comparative example.

The miniaturization and cost reduction of reactors L1 to L3 can be performed by reducing the inductance values of reactors L1 to L3. In particular, in the laser beam generation device having the large laser output, there is a problem that a mounting place is limited due to the increase in size of reactors L1 to L3, and there is a problem that the cost is increased because manufacturing is performed by a limited manufacturer. However, by reducing the inductance value, reactors L1 to L3 are downsized, a problem that the mounting place is limited is solved, the number of manufacturers that can manufacture the reactor increases, and the low-cost and general-purpose reactor can be used.

In addition, highly efficient reactors L1 to L3 having a small heat generation loss can be used by reducing the inductance values of reactors L1 to L3, the cooling mechanism (for example, the heat dissipation fin and the water cooling mechanism) necessary for the heat dissipation of reactors L1 to L3 can be miniaturized and the cooling system (for example, the forced air cooling to the natural air cooling) can be simplified, so that the number of cooling members can be decreased.

Fourth Effect of First Embodiment

In the laser beam generation device of the first embodiment, because three power supply units PS1 to PS3 and three LD modules M1 to M3 are dispersedly disposed, the heat dissipation of power supply units PS1 to PS3 and LD modules M1 to M3 can be enhanced. Consequently, a heat dissipation member such as an insulating sheet that dissipates heat from power supply units PS1 to PS3 and LD modules M1 to M3 and a cooling member such as a water-cooled or air-cooled heat sink can be downsized and the price can be reduced.

When the laser output is repeatedly changed, thermal stress caused by the temperature difference of the LD is repeatedly applied to the LD. When the light emitting element and the bonding wire in the LD or the lead frame and the bonding wire in the LD are metals having different thermal expansion coefficients, stress is generated due to a difference in thermal expansion coefficient, and a crack is generated in a joint portion between the light emitting element and the bonding wire in the LD or a joint portion between the lead frame and the bonding wire in the LD, which may lead to a failure.

In the laser beam generation device of the first embodiment, the temperature difference between the temperature of the LD during the large laser output and the temperature of the LD during the small laser output can be reduced by disposing the LD modules M1 to M3 in a distributed manner, the failure of the LD due to the thermal stress can be reduced, and the life can be lengthened.

In addition, because the temperature difference between the temperature of the LD during the large laser output and the temperature of the LD during the small laser output is reduced, the necessity of the use of the LD having high reliability under a temperature cycle condition or the like is eliminated. In addition, because the temperature rise of the LD is reduced, a general-purpose LD having a low heat-resistant temperature can be used. Accordingly, the expensive LD such as the LD having the high reliability under the temperature cycle condition or the like or the LD having the high heat-resistant temperature can be replaced with the inexpensive LD, and the cost of the device can be achieved.

Problem of First Embodiment

Figure 9:
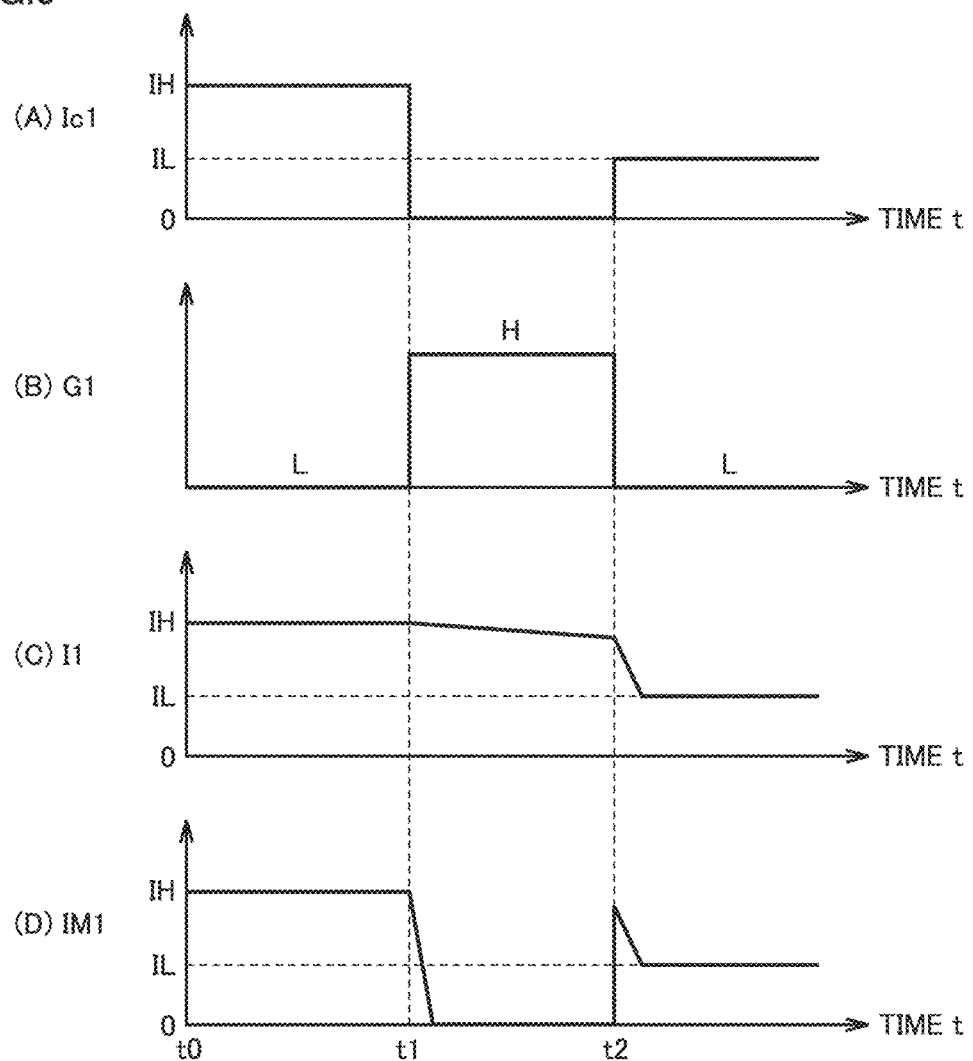
FIG. 9 is a time chart illustrating a problem of the first embodiment.

FIG. 9 is a time chart illustrating a problem of the first embodiment. FIG. 9(A) illustrates the waveform of current command value Ic1 (FIG. 3), FIG. 9(B) illustrates the waveform of gate signal G1 (FIG. 5), FIG. 9(C) illustrates the waveform of output current I1 of reactor L1 (FIG. 1), and FIG. 9(D) illustrates the waveform of current IM1 flowing through LD module M1 (FIG. 1).

FIG. 9 illustrates the case where current command value Ic1 is changed from large value IH (for example, 40 A) to 0 A, and then is changed to value IL (for example, 20 A)

smaller than value IH. When current command value Ic1 is IH or IL, beam-on signal B1 (FIG. 5) is set to the "H" level that is the activation level. When current command value Ic1 is 0 A, beam-on signal B1 is set to the "L" level that is the deactivation level.

From time t0 to t1, current command value Ic1 is set to value IH, and current I1 having the same value IH as current command value Ic1 is output from power supply unit PS1 and reactor L1. In addition, gate signal G1 is set to the "L" level, and switching element 41 is turned off. Thus, entire output current I1 of reactor L1 flows to LD module M1, driving current IM1 of LD module M1 becomes IH, and high-power laser beam α1 is output from LD module M1. At this point, the electromagnetic energy is stored in reactor L1.

From time t1 to time t2, current command value Ic1 is set to 0 A, the output current of power supply unit PS1 becomes 0 A, and gate signal G1 is set to the "H" level to turn on switching element 41. The electromagnetic energy stored in reactor L1 causes current I1 to flow from the other terminal of reactor L1 to one terminal of reactor L1 through switching element 41 and rectifier circuit 35 (FIG. 4).

Because all output current I1 of reactor L1 flows to switching element 41, driving current IM1 of LD module M1 becomes 0 A, and the output of laser beam α1 from LD module M1 is stopped. At this point, the electromagnetic energy of reactor L1 decreases gradually, and output current I1 of reactor L1 decreases gradually.

At time t2, current command value Ic1 is set to value IL, and the current having the same value IL as current command value Ic1 is output from power supply unit PS1. In addition, gate signal G1 is set to the "L" level, and switching element 41 is turned off. Thus, all output currents I1 of power supply unit PS1 and reactor L1 flow to LD module M1, and LD module M1 outputs low-power laser beam α1.

At this point, because the internal impedance of switching element 41 is small, the electromagnetic energy accumulated in reactor L1 is hardly consumed at times t1 to t2, and output current I1 of reactor L1 decreases only slightly from the IH.

For this reason, when switching element 41 is turned off (time t2), a sum of the output current of power supply unit PS1 and output current I1 of reactor L1 that slightly decreases from the IH flows to LD module M1, driving current IM1 larger than current command value Ic1=IL instantaneously flows to LD module M1, and laser beam α1 having the large power is instantaneously output from LD module M1. Because the same applies to other laser beams α2, α3, laser beam β obtained by collecting laser beams α1 to α3 instantaneously becomes the large power. When the laser processing is performed using laser beam β, there is a risk that the processing failure occurs. In the following modification 1 to 3, this problem is solved.

First Modification

Figure 10:
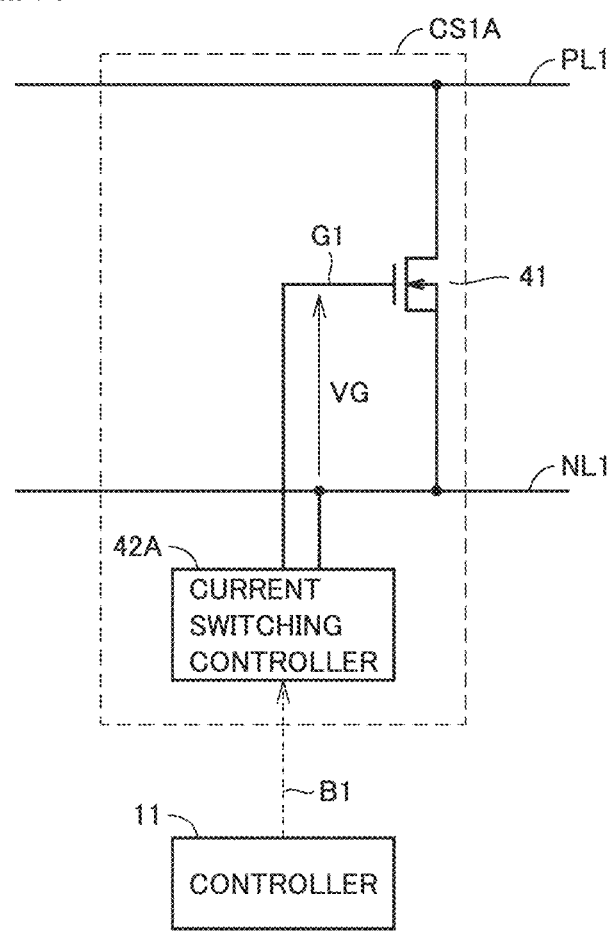
FIG. 10 is a circuit block diagram illustrating a modification of the first embodiment.

FIG. 10 is a circuit block diagram illustrating a first modification of the first embodiment and is a view compared with FIG. 5. Referring to FIG. 10, the first modification is different from the first embodiment in that current path switching circuit CS1 is replaced with a current path switching circuit CS1A. Current path switching circuit CS1A is obtained by replacing current switching controller 42 of current path switching circuit CS1 with a current switching controller 42A.

Current switching controller 42A outputs a gate voltage VG in response to beam-on signal B1. For example, switching element 41 is an N-type MOSFET. Gate voltage VG is provided between a gate and a source of switching element 41. When beam-on signal B1 is at the "H" level that is the activation level, gate voltage VG is set to the "L" level. When beam-on signal B1 falls from the "H" level of the activation level to the "L" level of the deactivation level, gate voltage VG is set to a setting voltage VM for setting time T1 and then set to the "H" level.

Setting voltage VM is a voltage between the "L" level and the "H" level, and is set to a voltage necessary for driving switching element 41 in an active region. The active region is a region where a drain current increases when the gate-to-source voltage of switching element 41 is increased. When gate voltage VG is set to setting voltage VM, an on-resistance value of switching element 41 becomes a relatively high value, and switching element 41 operates as a resistive element.

The "H" level of gate voltage VG is set to a voltage necessary for driving switching element 41 in a saturation region. The saturation region is a region where the drain current is saturated when the gate-to-source voltage of switching element 41 is increased. When gate voltage VG is set to the "H" level, switching element 41 is turned on, and the on-resistance value of switching element 41 is minimized.

The "L" level of gate voltage VG is set to a voltage necessary for driving switching element 41 in a cutoff region. The cutoff region is a region where the drain current does not flow even when the gate-to-source voltage of switching element 41 is increased. When gate voltage VG is set to the "L" level, switching element 41 is turned off, and the resistance value of switching element 41 is maximized.

In the first modification, other current path switching circuits CS2, CS3 are also changed to the same configuration as current path switching circuit CS1A. Because other configurations and operations are the same as those of the first embodiment, the description will not be repeated.

Figure 11:
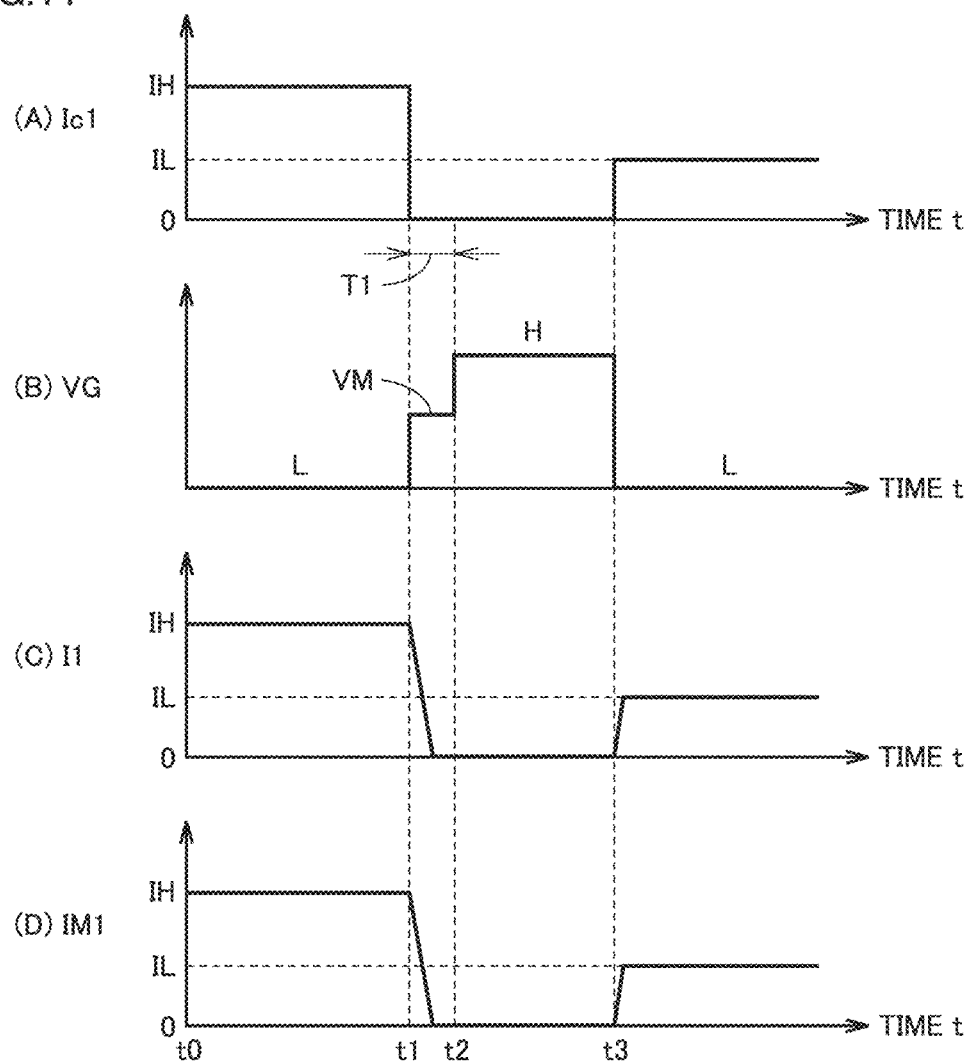
FIG. 11 is a time chart illustrating operation of a laser beam generation device in FIG. 10.

FIG. 11 is a time chart illustrating the operation of the laser beam generation device of the first modification, and is a view compared with FIG. 9. FIG. 11(A) illustrates the waveform of current command value Ic1 (FIG. 3), FIG. 11(B) illustrates the waveform of gate voltage VG (FIG. 10), FIG. 11(C) illustrates the waveform of output current I1 of reactor L1 (FIG. 1), and FIG. 11(D) illustrates the waveform of current IM1 flowing through LD module M1 (FIG. 1).

FIG. 11 also illustrates the case where current command value Ic1 is changed from a large value IH (for example, 40 A) to 0 A and then to a value IL (for example, 20 A) smaller than value IH. When current command value Ic1 is IH or IL, beam-on signal B1 (FIG. 5) is set to the "H" level that is the activation level. When current command value Ic1 is 0 A, beam-on signal B1 is set to the "L" level that is the deactivation level.

From time t0 to t1, current command value Ic1 is set to value IH, and current I1 having the same value IH as current command value Ic1 is output from power supply unit PS1 and reactor L1. In addition, gate voltage VG is set to the "L" level, switching element 41 operates in the cutoff region, and switching element 41 is turned off. Thus, entire output current I1 of reactor L1 flows to LD module M1, driving current IM1 of LD module M1 becomes IH, and high-power laser beam α1 is output from LD module M1. At this point, the electromagnetic energy is stored in reactor L1.

At time t1, current command value Ic1 is set to 0 A, and the output current of power supply unit PS1 becomes 0 A. At time t1, gate voltage VG is set to setting voltage VM. Thus, switching element 41 is driven in the active region, and switching element 41 operates as the resistive element.

Although the output current of power supply unit PS1 becomes 0 A, the electromagnetic energy stored in reactor L1 causes current I1 to flow from the other terminal of reactor L1 to one terminal of reactor L1 through switching element 41, a parallel connection body of LD module M1, and rectifier circuit 35 (FIG. 4).

At this point, when voltage VM is set such that current IM1 flowing through LD module M1 becomes less than an oscillation threshold of the LD, the electromagnetic energy accumulated in reactor L1 can be consumed by LD module M1 and switching element 41 without outputting laser beam α1 from LD module M1, and output current I1 of reactor L1 can be rapidly reduced from the IH. During the period between times t1 to t2, the electromagnetic energy accumulated in reactor L1 is completely consumed, and output current I1 of reactor L1 and driving current IM1 of LD module M1 become 0 A.

At time t2, gate voltage VG is set to the "H" level, switching element 41 operates in the saturation region, and switching element 41 is turned on. At time t3, current command value Ic1 is set to value IL, and the current having the same value IL as current command value Ic1 is output from power supply unit PS1. In addition, gate voltage VG is set to the "L" level, and switching element 41 is turned off. Thus, all output currents I1 of power supply unit PS1 and reactor L1 flow to LD module M1, and LD module M1 outputs low-power laser beam α1.

In the first modification, because the electromagnetic energy of reactor L1 is completely consumed at the rise of current command value Ic1 (time t3), high-power laser beam α1 in FIG. 9 is not output in a pulsed manner. Because the same applies to other laser beams α2, α3, laser beam β obtained by collecting laser beams α1 to α3 does not instantaneously become the large power. Occurrence of processing failure can be prevented by performing the laser processing using laser beam β.

Second Modification

Figure 12:
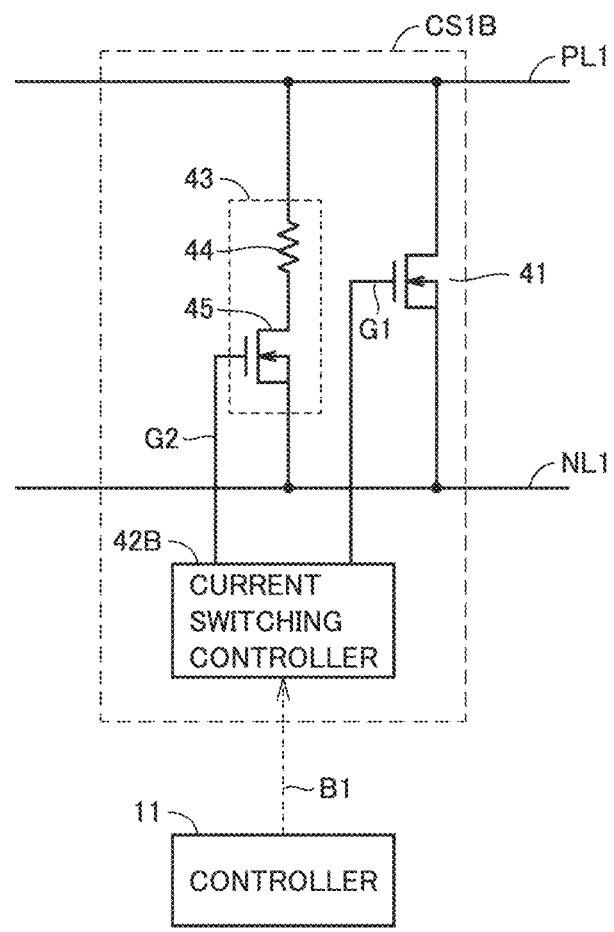
FIG. 12 is a circuit block diagram illustrating another modification of the first embodiment.

FIG. 12 is a circuit block diagram illustrating a second modification of the first embodiment and is a view compared with FIG. 5. Referring to FIG. 12, the second modification is different from the first embodiment in that current path switching circuit CS1 is replaced with a current path switching circuit CS1B. Current path switching circuit CS1B is obtained by adding an energy consumption unit 43 to current path switching circuit CS1 and replacing current switching controller 42 with a current switching controller 42B.

Energy consumption unit 43 includes a resistive element 44 and a switching element 45 that are connected in series between DC positive bus PL1 and DC negative bus NL1. For example, switching element 45 is an N-type MOSFET.

Current switching controller 42B outputs gate signals G1, G2 in response to beam-on signal B1. Gate signals G1, G2 are provided to the gates of switching elements 41, 45, respectively. When beam-on signal B1 is at the "H" level that is the activation level, both gate signals G1, G2 are set to the "L" level.

When beam-on signal B1 falls from the "H" level of the activation level to the "L" level of the deactivation level, a gate signal G2 rises to the "H" level, and gate signal G2 falls to the "L" level while gate signal G1 rises to the "H" level after setting time T1 elapses.

In the second modification, other current path switching circuits CS2, CS3 are also changed to the same configuration as current path switching circuit CS1B. Because other configurations and operations are the same as those of the first embodiment, the description will not be repeated.

Figure 13:
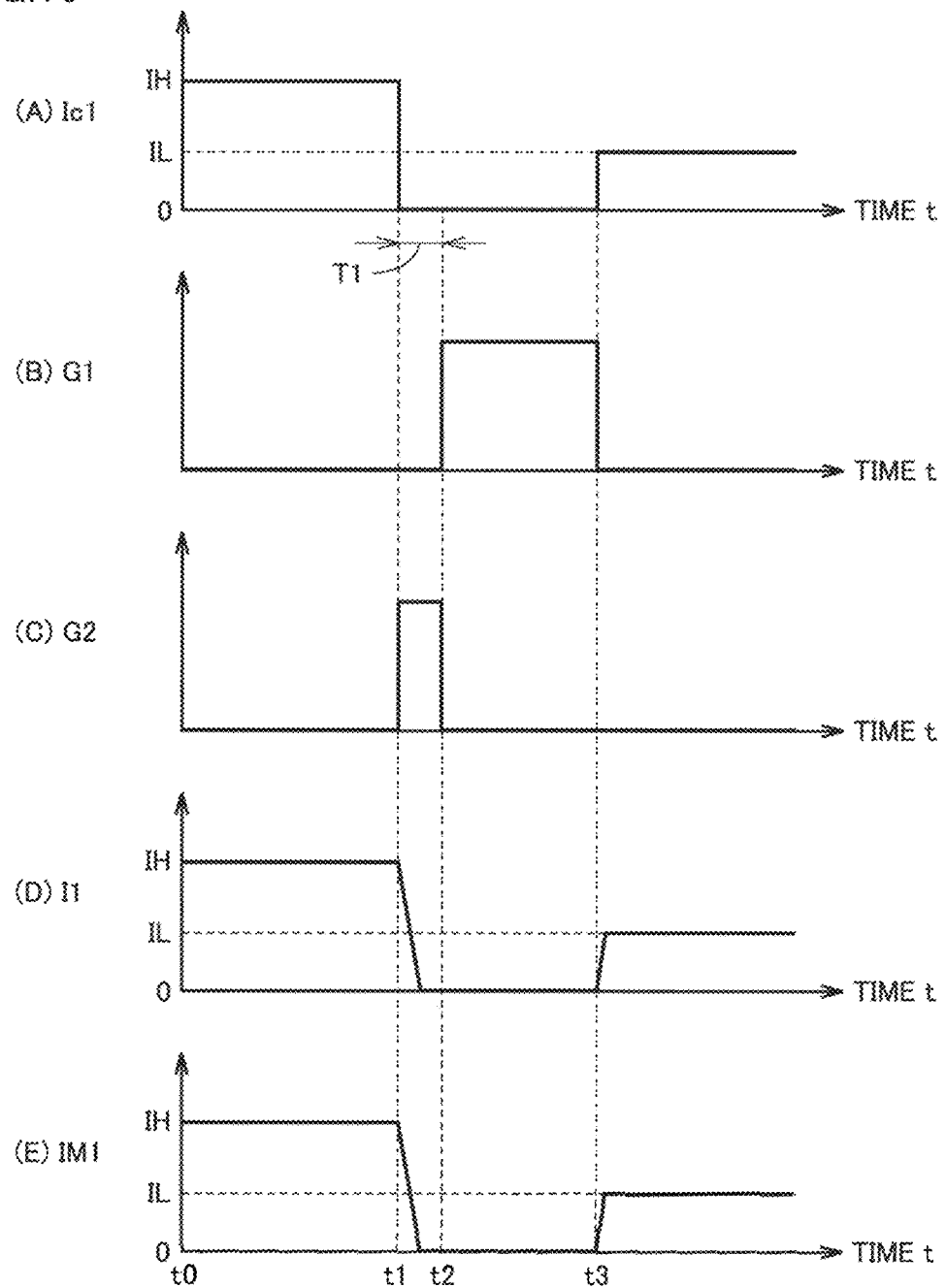
FIG. 13 is a time chart illustrating operation of a laser beam generation device in FIG. 12.

FIG. 13 is a time chart illustrating the operation of the laser beam generation device of the second modification and is a view compared with FIG. 9. FIG. 13(A) illustrates the waveform of current command value Ic1 (FIG. 3), FIGS. 13(B) and 13(C) illustrate the waveforms of gate signals G1, G2 (FIG. 12), FIG. 13(D) illustrates the waveform of output current I1 of reactor L1 (FIG. 1), and FIG. 13(E) illustrates the waveform of current IM1 flowing through LD module M1 (FIG. 1).

FIG. 13 illustrates the case where current command value Ic1 is changed from large value IH (for example, 40 A) to 0 A, and then is changed to value IL (for example, 20 A) smaller than value IH. When current command value Ic1 is IH or IL, beam-on signal B1 (FIG. 5) is set to the "H" level that is the activation level. When current command value Ic1 is 0 A, beam-on signal B1 is set to the "L" level that is the deactivation level.

From time t0 to t1, current command value Ic1 is set to value IH, and current I1 having the same value IH as current command value Ic1 is output from power supply unit PS1 and reactor L1. In addition, gate signals G1, G2 are set to the "L" level, and switching elements 41, 45 are turned off. Thus, entire output current I1 of reactor L1 flows to LD module M1, driving current IM1 of LD module M1 becomes IH, and high-power laser beam α1 is output from LD module M1. At this point, the electromagnetic energy is stored in reactor L1.

At time t1, current command value Ic1 is set to 0 A, and the output current of power supply unit PS1 becomes 0 A. At time t1, gate signal G2 is set to the "H" level, and switching element 45 is turned on. At this point, although the output current of power supply unit PS1 becomes 0 A, the electromagnetic energy stored in reactor L1 causes current I1 to flow from the other terminal of reactor L1 to one terminal of reactor L1 through energy consumption unit 43, the parallel connection body of LD module M1, and rectifier circuit 35 (FIG. 4).

At this point, when the resistance value of resistive element 44 is set such that current IM1 flowing through LD module M1 becomes less than the oscillation threshold of the LD, the electromagnetic energy accumulated in reactor L1 can be consumed by LD module M1 and resistive element 44 without outputting laser beam α1 from LD module M1, and output current I1 of reactor L1 can be rapidly reduced from the IH. During the period between times t1 to t2, the electromagnetic energy accumulated in reactor L1 is completely consumed, and output current I1 of reactor L1 and driving current IM1 of LD module M1 become 0 A.

At time t2, gate signal G2 falls to the "L" level to turn off switching element 45, and gate signal G1 rises to the "H" level to turn on switching element 41.

At time t3, current command value Ic1 is set to value IL, and the current having the same value IL as current command value Ic1 is output from power supply unit PS1. In addition, gate signal G1 is set to the "L" level, and switching element 41 is turned off. Thus, all output currents I1 of power supply unit PS1 and reactor L1 flow to LD module M1, and LD module M1 outputs low-power laser beam α1.

In the second modification, because the electromagnetic energy of reactor L1 is completely consumed at the rise of current command value Ic1 (time t3), high-power laser beam α1 in FIG. 9 is not output in a pulsed manner. Because the same applies to other laser beams α2, α3, laser beam β obtained by collecting laser beams α1 to α3 does not instantaneously become the large power. Occurrence of processing failure can be prevented by performing the laser processing using laser beam β.

Assuming that VO(0) is the voltage between the terminals of LD module M1 immediately after switching element 45 is turned on, that L is the inductance value of reactor L1, that R is the resistance value of resistive element 44, and that t=0 [s] is the time during which switching element 45 is turned on, voltage VO(t) between the terminals of LD module M1 is expressed by the following equation (2).

$$VO(t)=VO(0)\times[1-e^{(-Rt/L)}] \quad (2)$$

As described above, in the first embodiment, inductance value L of reactor L2 can be set to 1/3 as compared with the comparative example. Consequently, in the second modification, time t required to set VO(t) to a desired voltage value can be set to 1/3 of that of the comparative example. Thus, the time for turning on switching element 45 in energy consumption unit 43 can be reduced to 1/3, the time required for switching the magnitude of driving current IM1 of LD module M1 from large value IH to small value IL can be reduced to 1/3, and the response speed of the laser output can be increased.

Third Modification

In the first and second modifications, the electromagnetic energy accumulated in the reactor L1 is consumed by current path switching circuits CS1A, CS1B and LD module M1, thereby solving the problem that the driving current larger than the IL instantaneously flows through LD module M1. However, in such a solution, because the electromagnetic energy accumulated in reactor L1 is consumed, there is a problem that the efficiency is reduced. In a third modification, this problem is solved.

Figure 14:
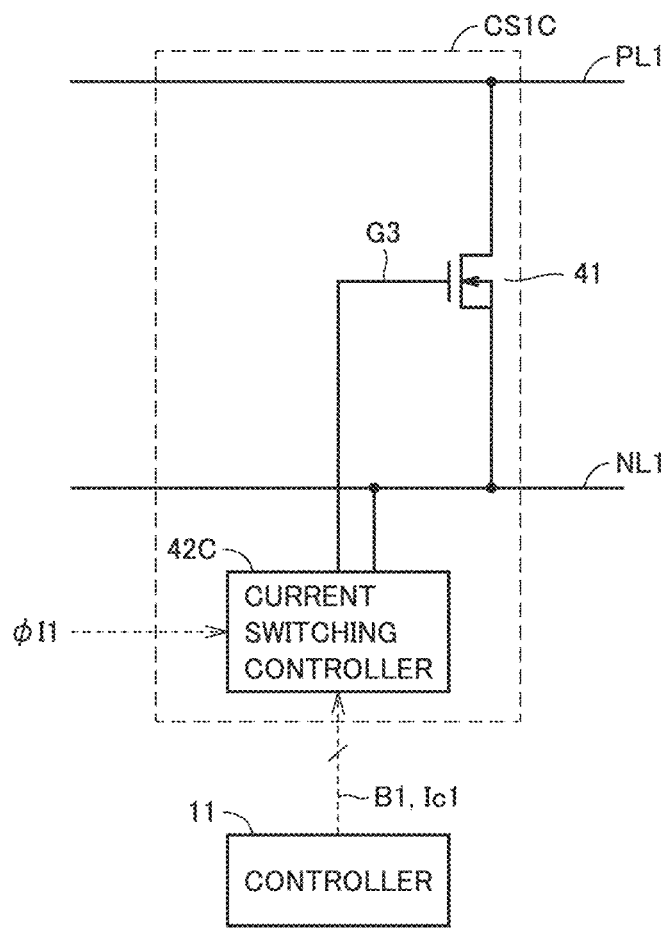
FIG. 14 is a circuit block diagram illustrating still another modification of the first embodiment.

FIG. 14 is a circuit block diagram illustrating the third modification of the first embodiment and is a view compared with FIG. 5. Referring to FIG. 14, the third modification is different from the first embodiment in that current path switching circuit CS1 is replaced with a current path switching circuit CS1C. Current path switching circuit CS1C is obtained by replacing current switching controller 42 with a current switching controller 42C.

Current switching controller 42C generates a gate signal G3 based on beam-on signal B1, current command value Ic1, and output signal φI1 of current detector CD1. Gate signal G3 is provided to the gate of switching element 41. When beam-on signal B1 is at the "L" level that is the deactivation level, gate signal G3 is set to the "L" level.

When beam-on signal B1 is raised from the "L" level of the deactivation level to the "H" level of the activation level, gate signal G3 is subjected to pulse width modulation until the detected value of current detector CD1 reaches current command value Ic1.

In the third modification, other current path switching circuits CS2, CS3 are also changed to the same configuration as current path switching circuit CS1C. Because other configurations and operations are the same as those of the first embodiment, the description will not be repeated.

Figure 15:
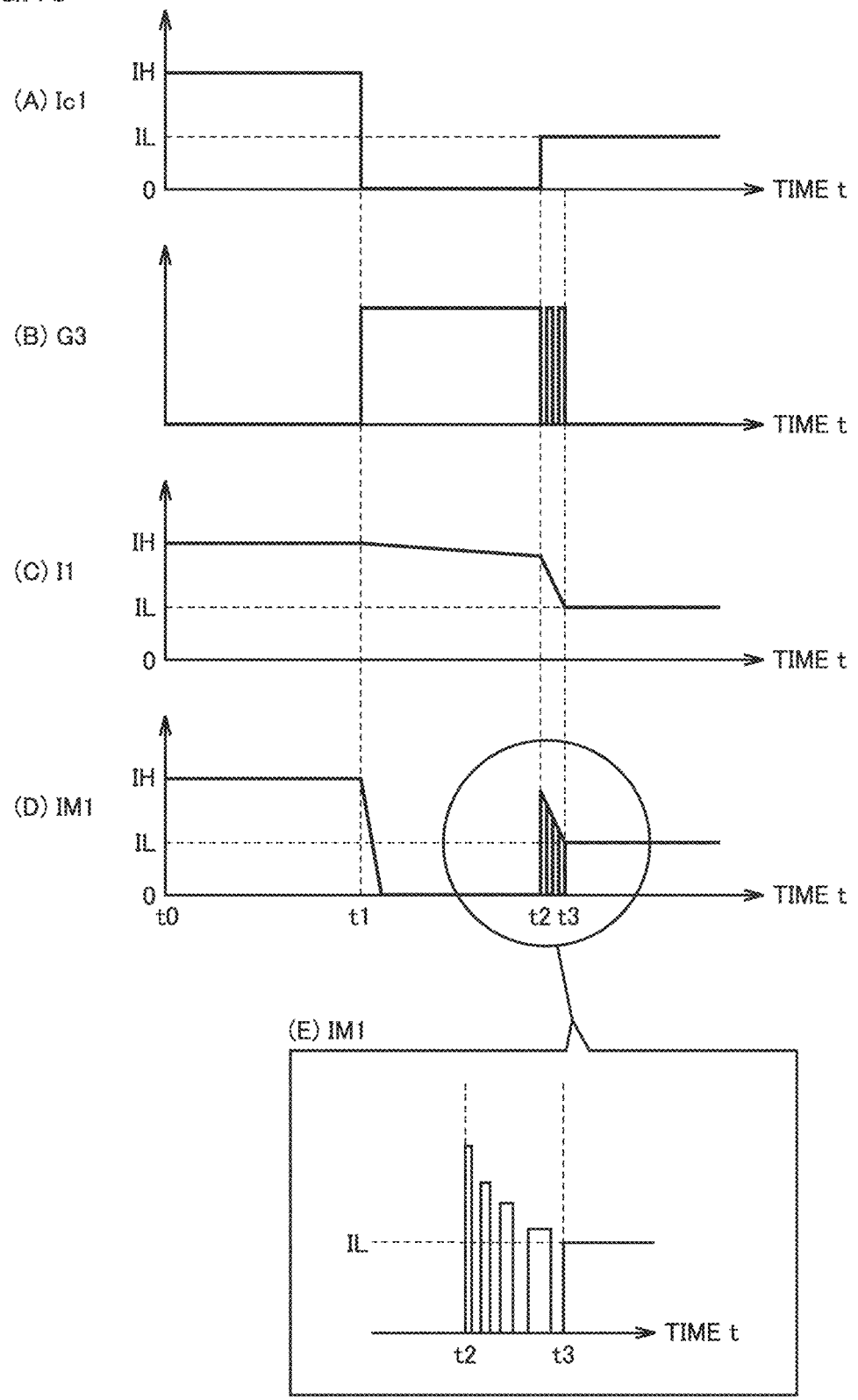
FIG. 15 is a time chart illustrating operation of a laser beam generation device in FIG. 14.

FIG. 15 is a time chart illustrating the operation of the laser beam generation device of the third modification and is a view compared with FIG. 9. FIG. 15(A) illustrates the waveform of current command value Ic1 (FIG. 3), FIG. 15(B) illustrates the waveform of gate signal G3 (FIG. 14), FIG. 15(C) illustrates the waveform of output current I1 of reactor L1 (FIG. 1), FIG. 15(D) illustrates the waveform of current IM1 flowing through LD module M1 (FIG. 1), and FIG. 15(E) is an example of an enlarged view of the region from time t2 to time t3 in FIG. 15(D).

FIG. 15 illustrates the case where current command value Ic1 is changed from large value IH (for example, 40 A) to 0 A, and then is changed to value IL (for example, 20 A) smaller than value IH. When current command value Ic1 is IH or IL, beam-on signal B1 (FIG. 5) is set to the "H" level that is the activation level. When current command value Ic1 is 0 A, beam-on signal B1 is set to the "L" level that is the deactivation level.

From time t0 to t1, current command value Ic1 is set to value IH, and current I1 having the same value IH as current command value Ic1 is output from power supply unit PS1 and reactor L1. In addition, gate signal G3 is set to the "L" level, and switching element 41 (FIG. 14) is turned off. Thus, entire output current I1 of reactor L1 flows to LD module M1, driving current IM1 of LD module M1 becomes IH, and high-power laser beam α1 is output from LD module M1. At this point, the electromagnetic energy is stored in reactor L1.

From time t1 to time t2, current command value Ic1 is set to 0 A, the output current of power supply unit PS1 becomes 0 A, and gate signal G3 is set to the "H" level to turn on switching element 41. The electromagnetic energy stored in reactor L1 causes current I1 to flow from the other terminal of reactor L1 to one terminal of reactor L1 through switching element 41 and rectifier circuit 35.

Because all output current I1 of reactor L1 flows to switching element 41, driving current IM1 of LD module M1 becomes 0 A, and the output of laser beam α1 from LD module M1 is stopped. At this point, the electromagnetic energy of reactor L1 decreases gradually, and output current I1 of reactor L1 decreases gradually.

At time t2, current command value Ic1 is set to value IL, and the current having the same value IL as current command value Ic1 is output from power supply unit PS1. At time t2, the pulse width modulation of gate signal G3 is started by current switching controller 42C. At time t3, when the detected value of current detector CD1 becomes current command value Ic1, the pulse width modulation of gate signal G3 is stopped, and gate signal G3 is set to the "L" level. Thus, current IM1 having the same value IL as current command value Ic1 flows through LD module M1, and stable laser beam α1 is output.

In the third modification, as illustrated in FIG. 15(B), gate signal G3 is pulse-width modulated immediately after time t2. Thus, as illustrated in FIGS. 15(D) and 15(E), driving current IM1 of LD module M1 changes in a pulse shape, and the power of laser beam α1 output from LD module M1 changes in a pulse shape. Because the power of laser beam α1 is an average value when the pulse is on and off, the power of laser beam α1 does not become the high output as illustrated in FIG. 9. Because other laser beams α2, α3 are similar to laser beam α1, laser beam β obtained by collecting laser beams α1 to α3 does not become the high output. Occurrence of processing failure can be prevented by performing the laser processing using laser beam β. In addition, the efficiency can be improved because the electromagnetic energy of reactor L1 is not wastefully consumed.

Second Embodiment

Figure 16:
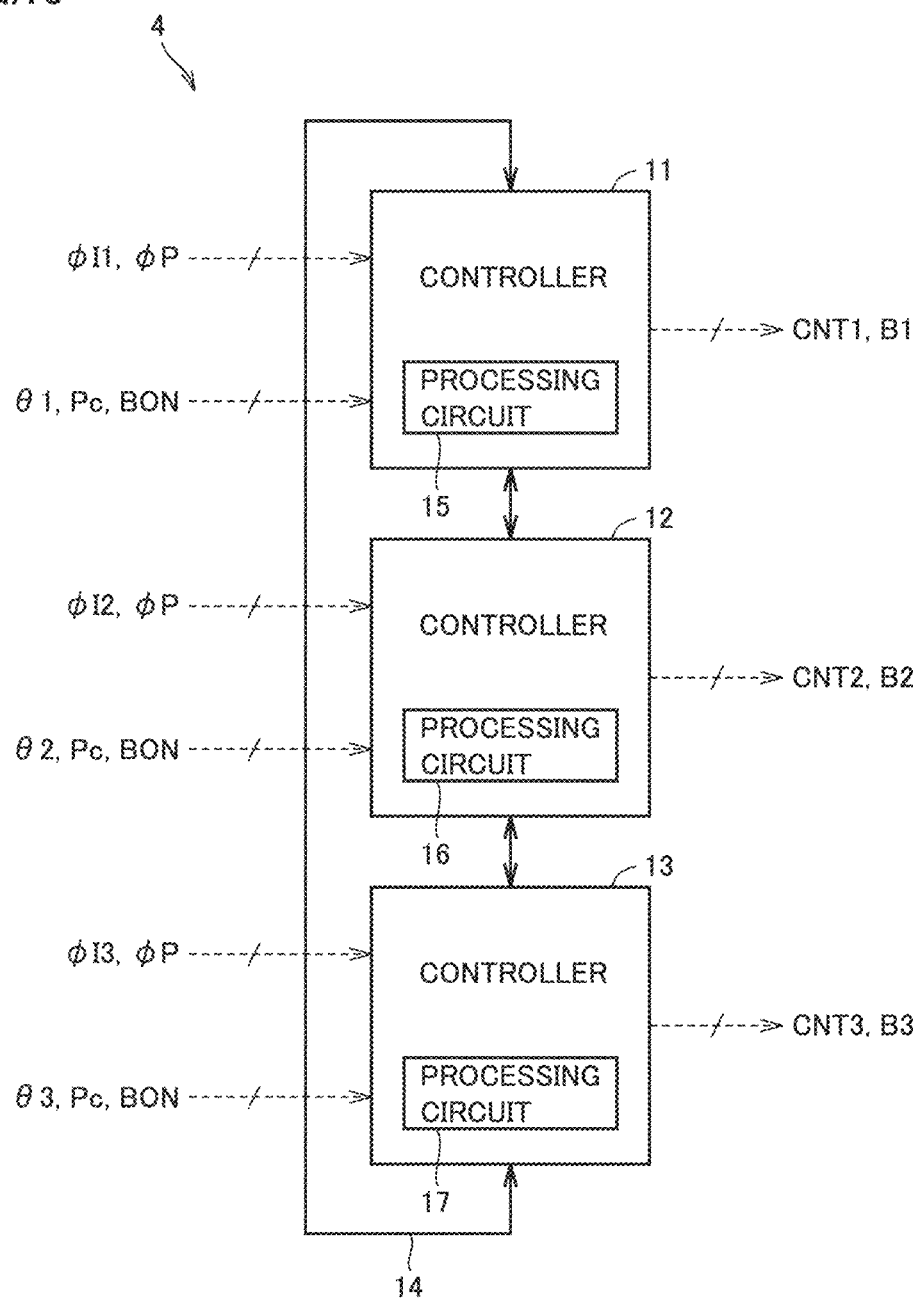
FIG. 16 is a block diagram illustrating a main part of a laser beam generation device according to a second embodiment.

FIG. 16 is a block diagram illustrating a main part of a laser beam generation device according to a second embodiment and is a view compared with FIG. 2. Referring to FIG. 16, the laser beam generation device is different from that of the first embodiment in that phase angles β1 to β3 of control signals CNT1 to CNT3 can be set using operation unit 3, and that set phase angles β1 to β3 are provided to controller 11 to 13, respectively.

The user of the laser beam generation device operates operation unit 3 to set phase angles β1 to β3 of control signals CNT1 to CNT3 in addition to laser output setting value Pc and the waveform of beam-on signal BON. Each of phase angles θ1 to θ3 may be a constant value or a value that changes in synchronization with beam-on signal BON. The waveform of beam-on signal BON, laser output setting value Pc, and phase angles θ1 to 74 3 are stored in the storage (not illustrated) in operation unit 3.

For example, when the user of the laser beam generation device turns on the output start button included in operation unit 3, beam-on signal BON, laser output setting value Pc, and phase angles θ1 to θ3 are read from the storage (not illustrated) and output to control device 4.

Current controller 24 (FIG. 3) in controller 11 generates control signal CNT1 having set phase angle θ1. Current controller 24 in controller 12 generates control signal CNT2 having set phase angle θ2. Current controller 24 in controller 13 generates control signal CNT3 having set phase angle θ3.

When phase angles θ1, θ2, θ3 are 0 degrees, 60 degrees, and 120 degrees, respectively, the same results as in the first embodiment are obtained. As illustrated in FIG. 6, the ripples of the laser outputs of three LD modules M1 to M3 effectively cancel each other, and the ripple rate of output laser beam β decreases.

Figure 17:
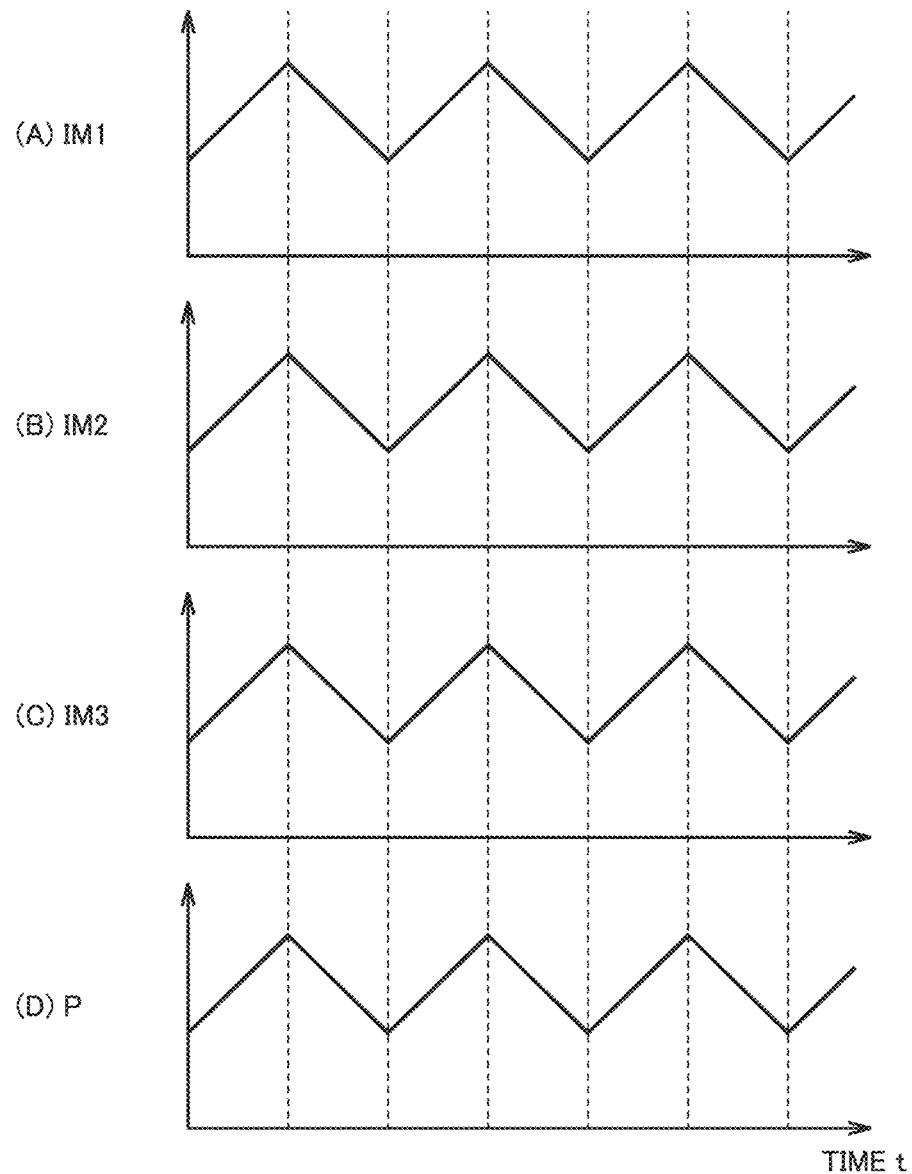
FIG. 17 is a time chart illustrating an example of operation of the laser beam generation device in FIG. 16.

FIG. 17 is a time chart illustrating an example of the operation of the laser beam generation device in FIG. 16 and is a view compared with FIG. 6. FIGS. 17(A) to 17(C) illustrate the waveforms of currents IM1 to IM3 flowing through LD modules M1 to M3, respectively, and FIG. 17(D) illustrates the waveform of power P of laser beam β.

FIG. 17 illustrates the case of θ1=θ2=θ3=0 degrees. As can be seen from FIG. 17, because the phases of the current ripples generated in driving currents IM1 to IM3 of LD modules M1 to M3 are the same, the ripples of the laser outputs of three LD modules M1 to M3 are added, and the ripple rate of output laser beam β increases.

Figure 18:
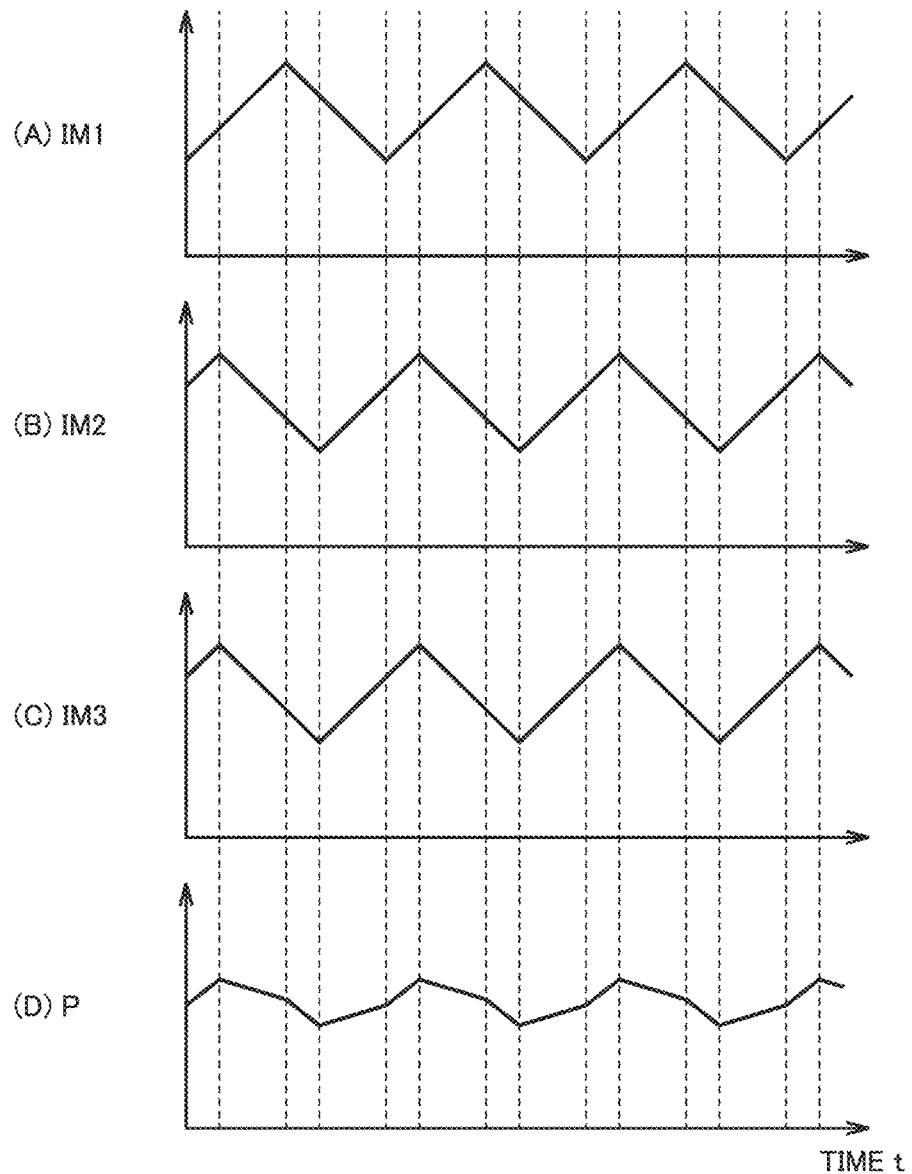
FIG. 18 is a time chart illustrating another operation example of the laser beam generation device in FIG. 16.

FIG. 18 is a time chart illustrating another operation example of the laser beam generation device in FIG. 16 and is a view compared with FIG. 6. FIGS. 18(A) to 18(C) illustrate the waveforms of currents IM1 to IM3 flowing through LD modules M1 to M3, respectively, and FIG. 18(D) illustrates the waveform of power P of laser beam β.

FIG. 18 illustrates the case where θ1=0 degrees and θ2=θ3=120 degrees. As can be seen from FIG. 18, the phases of the current ripples generated in driving currents IM1, IM2 of LD modules M1, M2 are shifted from each other by 240 degrees, and the phases of the current ripples generated in driving currents I2, I3 of LD modules M2, M3 are the same. The ripple generated in output laser beam α1 of LD module M1 and the ripples generated in output laser beam α2, α3 of LD modules M2, M3 cancel each other, but the ripples generated in output laser beam α2, α3 of LD modules M2, M3 are added.

Consequently, the ripple rate of the laser output when θ1=0 degrees and θ2=θ3=120 degrees is larger than the ripple rate of the laser output when θ1=0 degrees, θ2=60 degrees, and θ3=120 degrees, and is smaller than the ripple rate of the laser output when θ1=θ2=θ3=0 degrees.

In the second embodiment, the ripple rate of the laser output can be instantaneously changed by changing phase angles θ1 to θ3 of control signals CNT1 to CNT3 to desired magnitudes. When the laser beam generation device is used as the laser processing apparatus, the processed section can be made to have the desired flat accuracy according to the magnitude of the ripple rate of the laser output, and a pattern such as a satin processed surface can be formed with high accuracy or a flat processed section can be formed. In addition, by synchronizing the frequency of the ripple generated in the laser output with the control of the processing head that outputs laser beam β, for example, unevenness of the processed section generated by the ripple can be formed at regular intervals to create a pattern.

Third Embodiment

Figure 19:
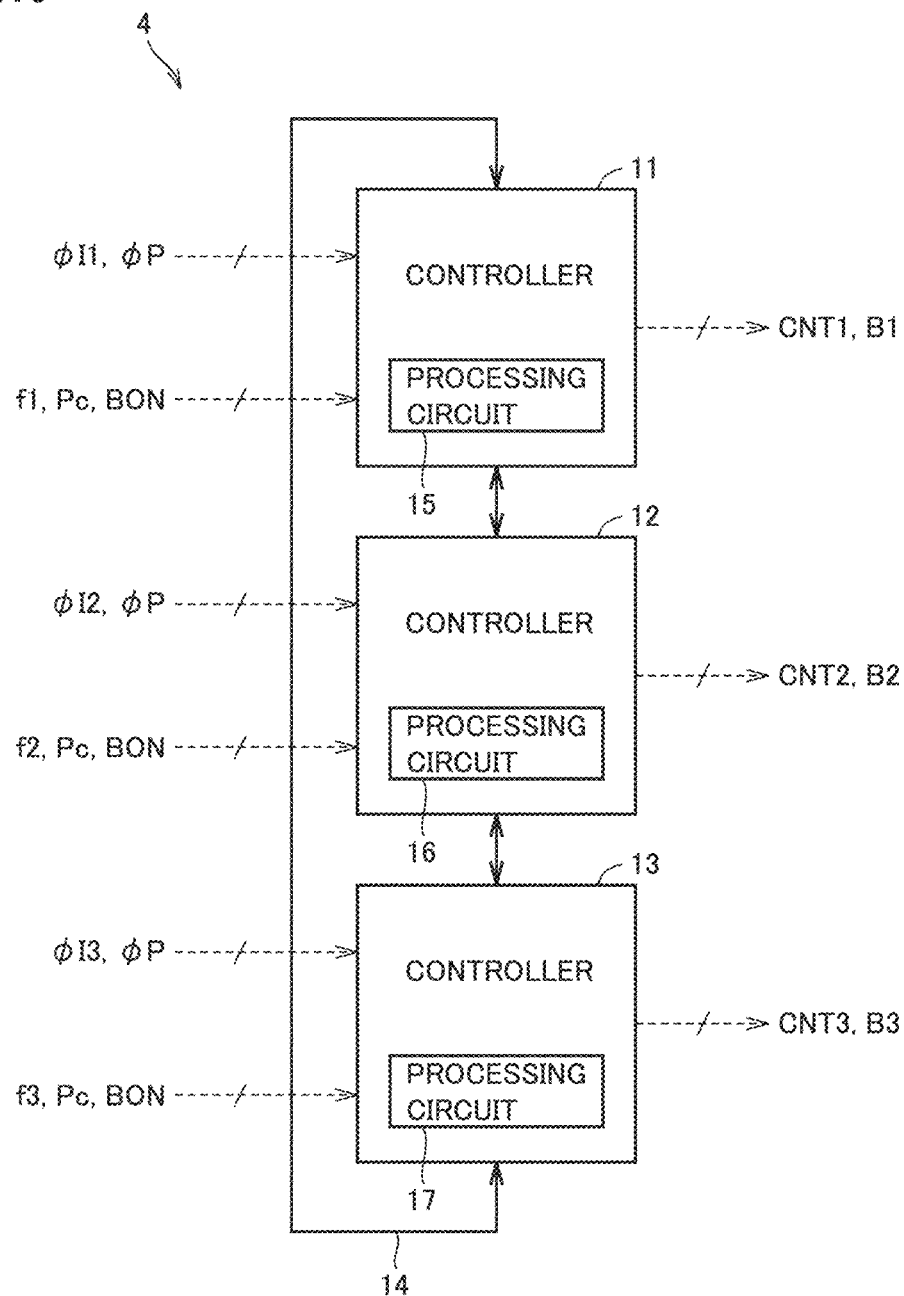
FIG. 19 is a block diagram illustrating a main part of a laser beam generation device according to a third embodiment.

FIG. 19 is a block diagram illustrating a main part of a laser beam generation device according to a third embodiment and is a view compared with FIG. 16. Referring to FIG. 19, the laser beam generation device is different from that of the second embodiment in that frequencies f1 to f3 of control signals CNT1 to CNT3 can be set using operation unit 3, and that set frequencies f1 to f3 are provided to controller 11 to 13, respectively.

The user of the laser beam generation device operates operation unit 3 to set frequencies f1 to f3 of control signals CNT1 to CNT3 in addition to laser output setting value Pc and the waveform of beam-on signal BON. Each of the frequencies f1 to f3 may be a constant value or a value that changes in synchronization with beam-on signal BON. The waveform of beam-on signal BON, laser output setting value Pc, and frequencies f1 to f3 are stored in the storage (not illustrated) in operation unit 3.

For example, when the user of the laser beam generation device turns on the output start button included in operation unit 3, beam-on signal BON, laser output setting value Pc, and frequencies f1 to f3 are read from the storage (not illustrated) and output to control device 4.

Current controller 24 (FIG. 3) in controller 11 generates control signal CNT1 having set frequency f1. Current controller 24 in controller 12 generates control signal CNT2 having set frequency f2. Current controller 24 in controller 13 generates control signal CNT3 having set frequency f3.

Figure 20:
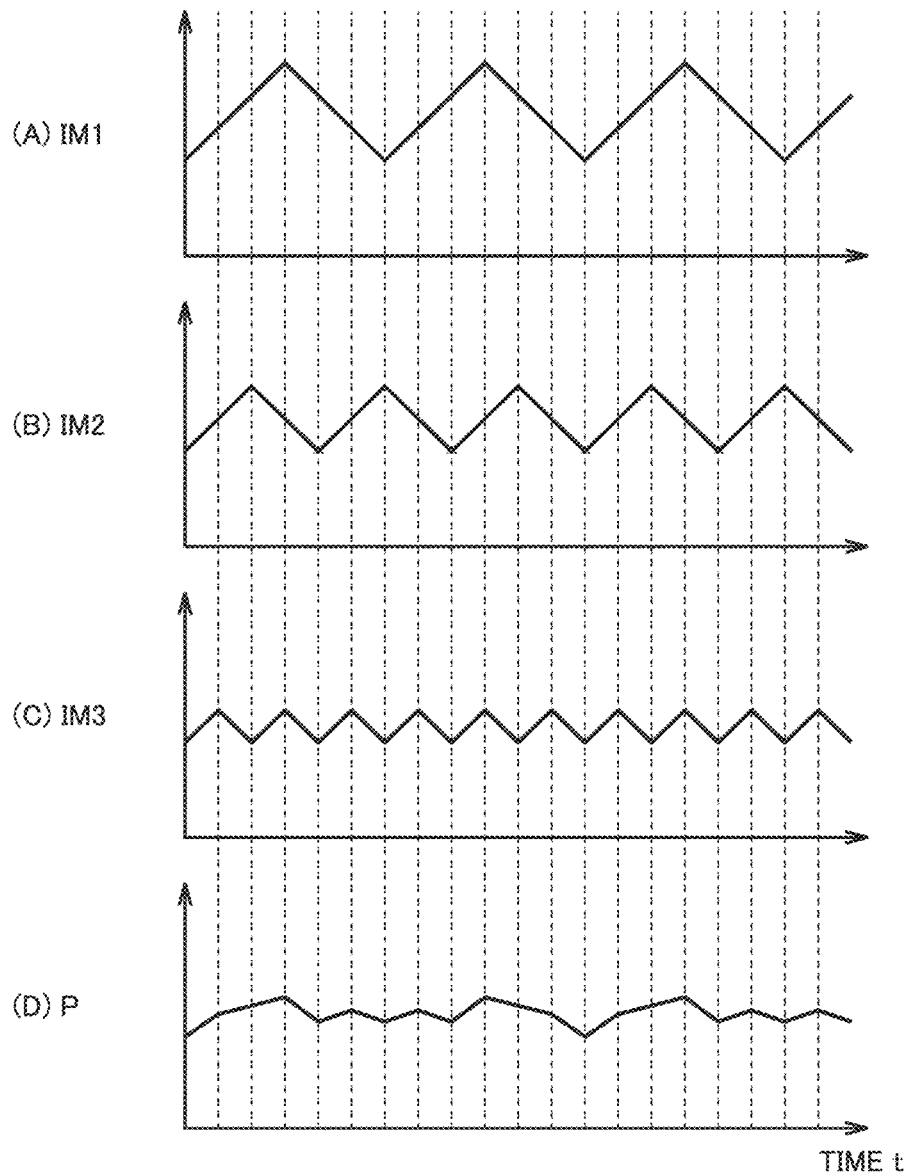
FIG. 20 is a time chart illustrating an example of operation of the laser beam generation device in FIG. 19.

FIG. 20 is a time chart illustrating an example of the operation of the laser beam generation device described with reference to FIG. 19. FIGS. 20(A) to 20(C) illustrate the waveforms of currents IM1 to IM3 flowing through LD modules M1 to M3, respectively, and FIG. 20(D) illustrates the waveform of power P of laser beam 3. FIG. 20 illustrates the case of f1<f2<f3.

As can be seen from FIG. 20, when frequencies f1 to f3 of control signals CNT1 to CNT3 are different from each other, the frequencies of the current ripples generated in driving currents I1 to I3 of LD modules M1 to M3 are also different from each other, and the frequencies of the ripples in the laser outputs of LD modules M1 to M3 are also different from each other. Consequently, a probability that peak values of the ripples in the laser outputs of LD modules M1 to M3 overlap each other is reduced, the ripple of output laser beam β is reduced, and the laser output can be stably obtained.

Frequencies f1 to f3 of control signals CNT1 to CNT3 may be changed during the output of laser beam β. Full-bridge circuits 33 (FIG. 4) of power supply units PS1 to PS3 are switched according to control signals CNT1 to CNT3, respectively. When the switching frequency of full-bridge circuit 33 is low, the switching loss is small, the temperature rise of power supply units PS1 to PS3 is small, and the current ripple increases. On the other hand, when the switching frequency of full-bridge circuit 33 is high, the switching loss generated in full-bridge circuit 33 is large, the temperature rise of power supply units PS1 to PS3 is large, and the current ripple is small.

Among power supply units PS1 to PS3, the power supply unit having the high temperature is switched at the low frequency and the power supply unit having the low temperature is switched at the high frequency, whereby the temperature rise of the power supply unit having the high temperature can be reduced and the current ripple superimposed on the output current of the power supply unit having the low temperature can be decreased. That is, by changing frequencies f1 to f3 of control signals CNT1 to CNT3 during the operation, the current ripple can be decreased and the temperature rise of power supply unit PS can be suppressed.

Fourth Embodiment

Figure 21:
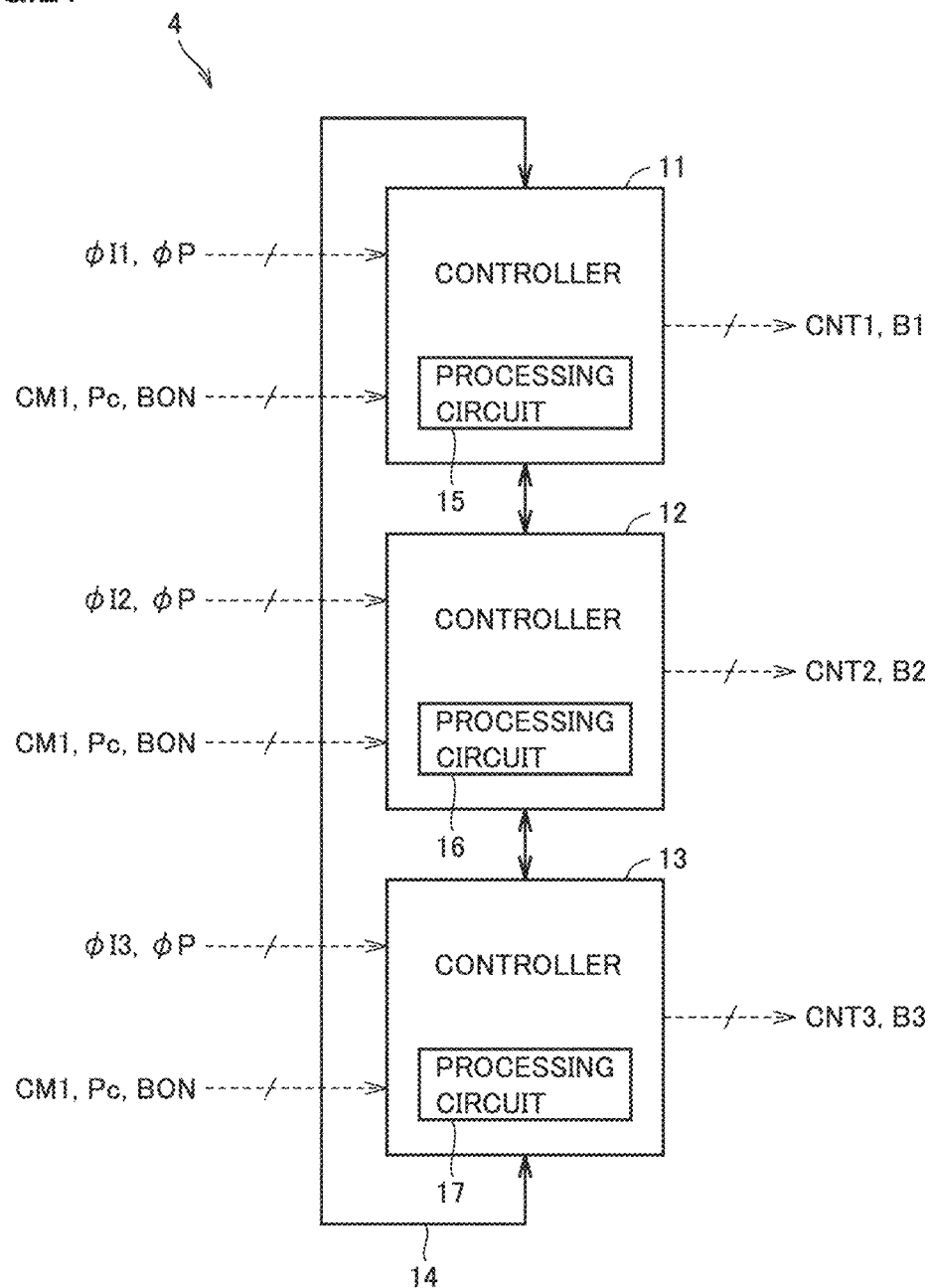
FIG. 21 is a block diagram illustrating a main part of a laser beam generation device according to a fourth embodiment.

FIG. 21 is a block diagram illustrating a main part of a laser beam generation device according to a fourth embodiment and is a view compared with FIG. 2. Referring to FIG. 21, the laser beam generation device is different from that of the first embodiment in that a mode for predicting the residual lifetimes of LD modules M1 to M3 can be set using operation unit 3, and that a signal CM1 is provided from operation unit 3 to controller 11 to 13 when the mode is set. Controller 11 to 13 sequentially executes a residual lifetime prediction mode in response to signal CM1.

When signal CM1 is provided, command unit 23 (FIG. 3) of controller 11 executes the residual lifetime prediction mode prior to command units 23 of controllers 12, 13. Command unit 23 sequentially outputs a plurality of current command values Ic1 having different values one by one. Current controller 24 controls the duty ratio of control signal CNT1 such that current I1 indicated by output signal $\varphi$I1 of current detector CD1 becomes current command value Ic1. Thus, current I1 is output from power supply unit PS1, and LD module M1 is driven by current I1 to output laser beam $\alpha$1. The power of laser beam $\alpha$1 is detected by power detector 2 (FIG. 1), and signal $\varphi$P indicating the detected value is provided to command unit 23.

Command unit 23 changes the magnitude of current command value Ic1 in a plurality of stages, detects the power of laser beam $\alpha$1 indicated by output signal $\varphi$P of power detector 2 for each current command value Ic1, obtains the current-power characteristic (I-P characteristic) of LD module M1, and stores the I-P characteristic in storage 22. Storage 22 stores the initial I-P characteristic. Command unit 23 compares the initial I-P characteristic stored in storage 22 with the I-P characteristic after the time degradation, and predicts a residual lifetime Tr1 of LD module M1 based on the comparison result.

Figure 22:
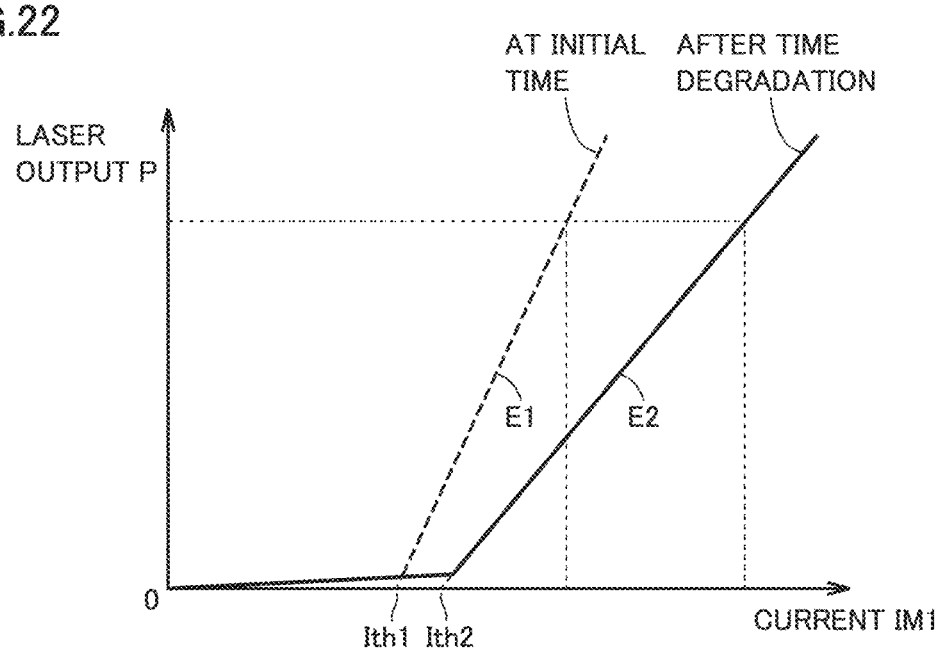
FIG. 22 is a view illustrating an I-P characteristic stored in a storage unit of FIG. 21.

FIG. 22 is a diagram illustrating the initial I-P characteristic and the I-P characteristic after time degradation stored in storage 22. In FIG. 22, initial LD module M1 outputs laser beam $\alpha$1 when driving current IM1 is greater than or equal to a threshold current Ith1. LD module M1 after the time degradation outputs laser beam $\alpha$1 when driving current IM1 is greater than or equal to a threshold current Ith2. Ith1<Ith2.

A laser output efficiency E1 of initial LD module M1 is larger than a laser output efficiency E2 of LD module M1 after the time degradation. The laser output efficiency is a slope of an I-P characteristic curve in a region greater than or equal to threshold current Ith.

Command unit 23 reads initial threshold current Ith1 and laser output efficiency E1 as well as threshold current Ith2 and laser output efficiency E2 after the time degradation from the initial I-P characteristic stored in storage 22 and the I-P characteristic after the time degradation, compares read Ith1, E1 with Ith2, E2, and predicts residual lifetime Tr1 of LD module M1 after the time degradation based on the comparison result.

Similarly to controller 11, controller 12 (FIG. 21) predicts a residual lifetime Tr2 of LD module M2 after controller 11. Similarly to controller 11, controller 13 (FIG. 21) predicts a residual lifetime Tr3 of LD module M3 after controller 12.

When the normal operation of outputting laser beam $\beta$ is performed after the end of the residual lifetime prediction mode, controllers 11 to 13 changes share ratios SR1 to SR3 of the power of LD modules M1 to M3 such that share ratio SR of LD module M having short residual lifetime Tr becomes small and such that share ratio SR of LD module M having long residual lifetime Tr becomes large. Thus, current command values Ic1 to Ic3 are set such that driving current IM of LD module M having short residual lifetime Tr decreases while driving current IM of LD module M having long residual lifetime Tr increases, so that LD module M having short residual lifetime Tr can be lengthened.

As a result, the maintenance interval of the laser beam generation device can be extended. In addition, the difference between residual lifetimes Tr1 to Tr3 of LD modules M1 to M3 can be reduced, and a large number of LD modules M can be replaced in one-time maintenance, so that a replacement frequency can be decreased.

Fifth Embodiment

Figure 23:
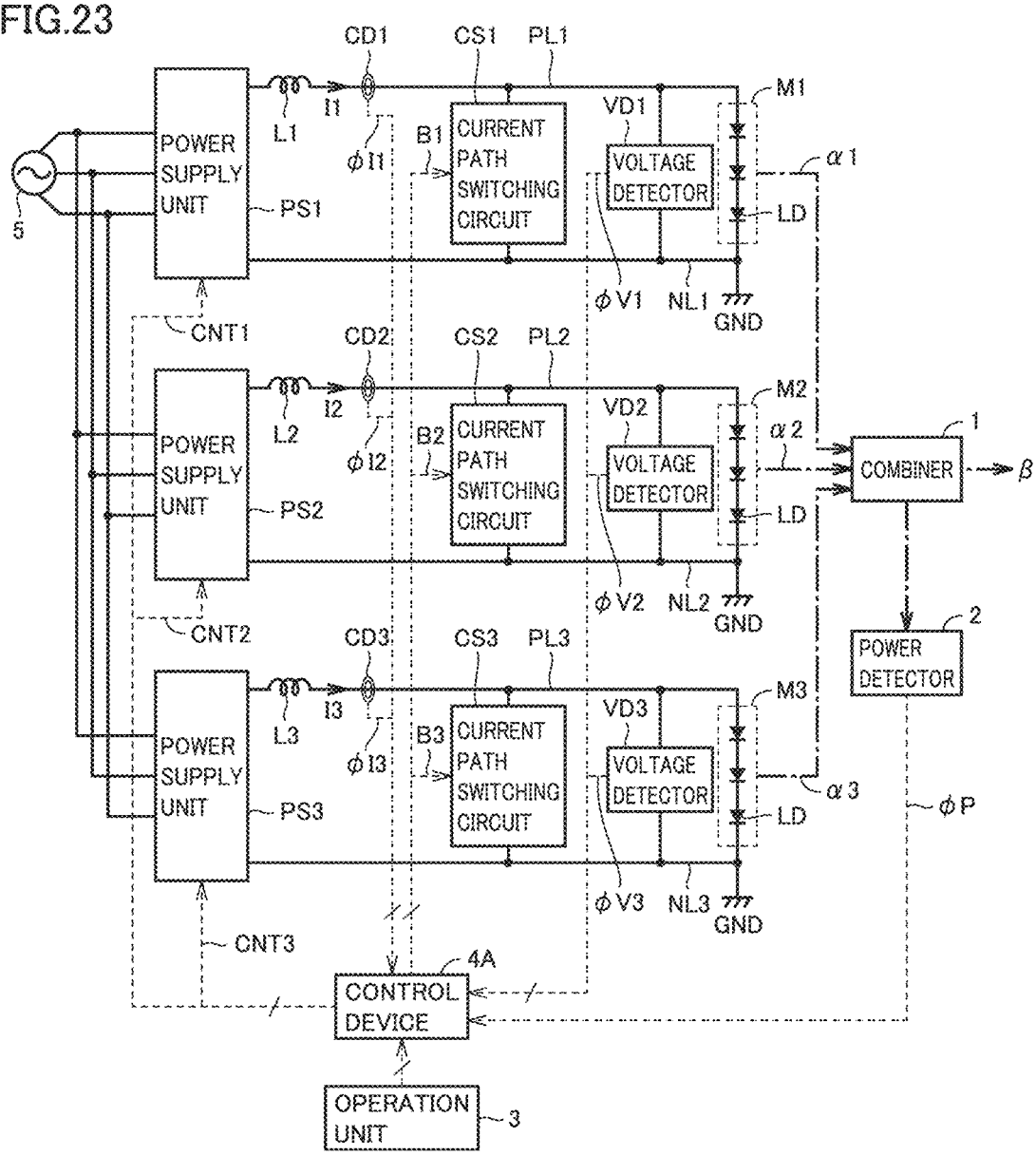
FIG. 23 is a circuit block diagram illustrating a configuration of a laser beam generation device according to a fifth embodiment.

FIG. 23 is a circuit block diagram illustrating a configuration of a laser beam generation device according to a fifth embodiment and is a view compared with FIG. 1. Referring to FIG. 23, the laser beam generation device is different from the laser beam generation device of FIG. 1 in that voltage detectors VD1 to VD3 are added and that control device 4 is replaced with a control device 4A.

Voltage detector VD1 detects a voltage V1 between the terminals of LD module M1, and outputs a signal $\varphi$V1 indicating the detected value to control device 4A. Voltage detector VD2 detects a voltage V2 between the terminals of LD module M2 and outputs a signal $\varphi$V2 indicating the detected value to control device 4A. Voltage detector VD3 detects a voltage V3 between the terminals of LD module M3, and outputs a signal $\varphi$V3 indicating the detected value to control device 4A.

Figure 24:
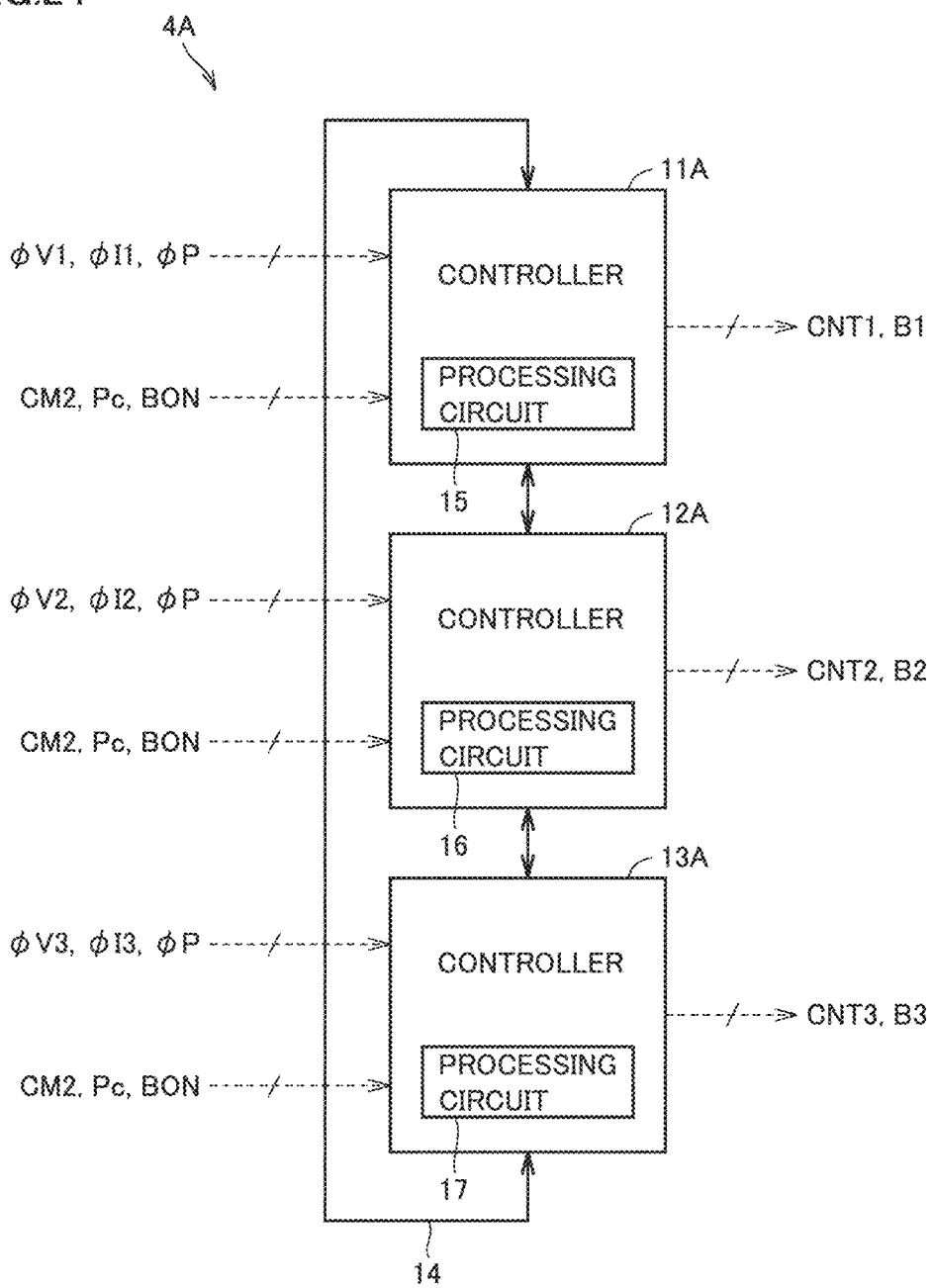
FIG. 24 is a block diagram illustrating a configuration of a control device in FIG. 23.

FIG. 24 is a block diagram illustrating the configuration of control device 4A and is a view compared with FIG. 2. Referring to FIG. 24, control device 4A is different from control device 4 in that controller 11 to 13 are replaced with controllers 11A to 13A.

The user of the laser beam generation device operates operation unit 3 to set the residual lifetime prediction mode for predicting the residual lifetimes of LD modules M1 to M3. In response to the setting of the residual lifetime prediction mode, operation unit 3 provides a signal CM2 instructing the execution of the residual lifetime prediction mode to controllers 11A to 13A. Controllers 11A to 13A execute the residual lifetime prediction mode in response to signal CM2. Output signals $\varphi$V1 to $\varphi$V3 of voltage detectors VD1 to VD3 are provided to controllers 11A to 13A, respectively.

Figure 25:
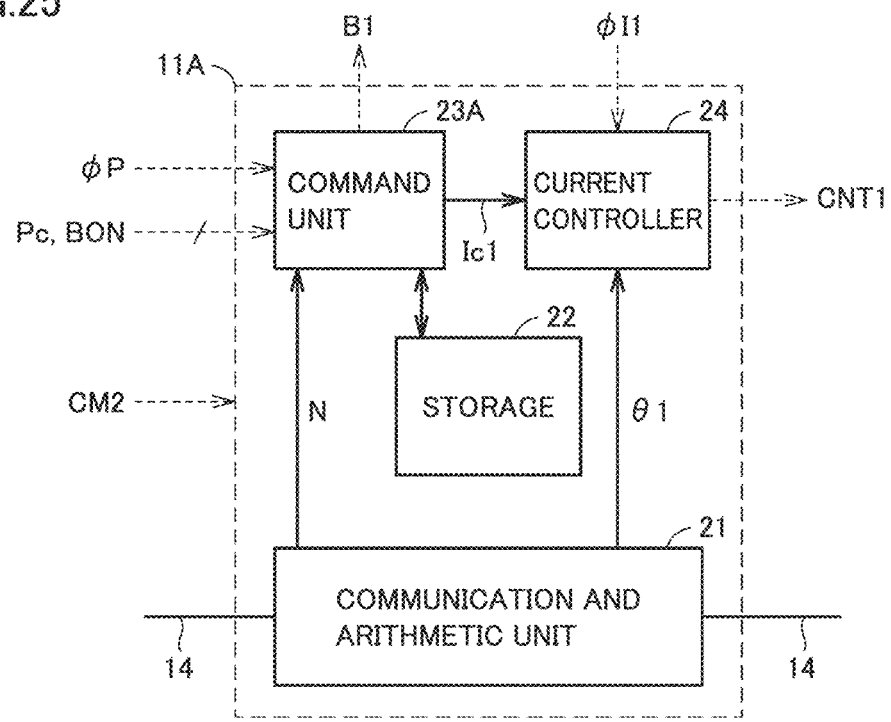
FIG. 25 is a block diagram illustrating a configuration of a controller in FIG. 24.

FIG. 25 is a block diagram illustrating the configuration of controller 11A and is a view compared with FIG. 3. Referring to FIG. 25, controller 11A is different from controller 11 in that command unit 23 is replaced with a command unit 23A.

When signal CM2 is provided to controller 11A, command unit 23A of controller 11A executes the residual lifetime prediction mode. Command unit 23A sequentially outputs a plurality of current command values Ic1 having different values one by one. Current controller 24 controls the duty ratio of control signal CNT1 such that current I1 indicated by output signal φI1 of current detector CD1 becomes current command value Ic1. Thus, current I1 is output from power supply unit PS1, and LD module M1 is driven by current I1 to output laser beam α1.

Command unit 23A changes the magnitude of current command value Ic1 in a plurality of stages, detects voltage V1 between the terminals of LD module M1 indicated by output signal φV1 of voltage detector VD1 for each current command value Ic1, obtains a current-voltage characteristic (I-V characteristic) of LD module M1, and stores the I-V characteristic in storage 22. Storage 22 stores the initial I-V characteristic. Command unit 23A compares the initial I-V characteristic stored in storage 22 with the I-V characteristic after the time degradation, and predicts the residual lifetime of LD module M1 based on the comparison result.

Figure 26:
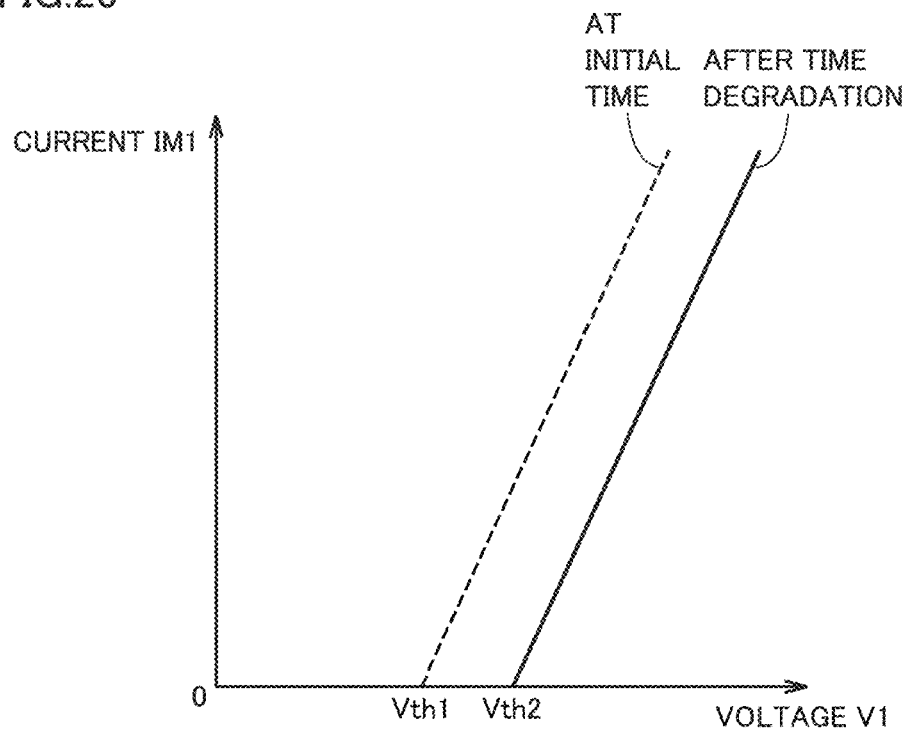
FIG. 26 is a view illustrating an I-V characteristic stored in a storage unit of FIG. 25.

FIG. 26 is a view illustrating the initial I-V characteristic stored in storage 22 and the I-V characteristic after the time degradation. In FIG. 26, in initial LD module M1, as voltage V1 between the terminals is gradually increased from 0 V, current IM1 starts to flow when voltage V1 reaches threshold voltage Vth1, and then current IM1 increases in proportion to voltage V1. In LD module M1 after the time degradation, as voltage V1 between the terminals is gradually increased from 0 V, current IM1 starts to flow when voltage V1 reaches threshold voltage Vth2, and then current IM1 increases in proportion to voltage V1. Vth1<Vth2.

Command unit 23A reads initial threshold voltage Vth1 and threshold voltage Vth2 after the time degradation from the initial I-V characteristic stored in storage 22 and the I-V characteristic after time degradation, compares read Vth1 and Vth2, and predicts residual lifetime Tr1 of LD module M1 after the time degradation based on the comparison result. Similarly to the controller 11A, controllers 12A, 13A (FIG. 24) predict residual lifetimes Tr2, Tr3 of LD modules M2, M3 at the same time as controller 11A.

When the normal operation of outputting laser beam β is performed after the end of the residual lifetime prediction mode, controllers 11A to 13A changes share ratios SR1 to SR3 of the power of LD modules M1 to M3 such that share ratio SR of LD module M having short residual lifetime Tr becomes small and such that share ratio SR of LD module M having long residual lifetime Tr becomes large. Thus, current command values Ic1 to Ic3 are determined such that driving current IM of LD module M having short residual lifetime Tr decreases while driving current IM of LD module M having long residual lifetime Tr increases, so that LD module M having short residual lifetime Tr is lengthened.

As a result, the maintenance interval of the laser beam generation device can be extended. In addition, the difference between residual lifetimes Tr1 to Tr3 of LD modules M1 to M3 can be reduced, and a large number of LD modules M can be replaced in one-time maintenance, so that a replacement frequency can be decreased.

In the fifth embodiment, because three voltage detectors VD1 to VD3 are provided, voltages V1 to V3 between the terminals of three LD modules M1 to M3 can be simultaneously detected, and the I-V characteristics of LD modules M1 to M3 can be simultaneously detected. Consequently, the residual lifetime prediction can be performed in a short time as compared with the fourth embodiment in which it is necessary to sequentially detect the I-P characteristics of LD modules M1 to M3 one by one.

In addition, because the I-V characteristics of LD modules M1 to M3 can be measured even when all LD modules M1 to M3 are in the operating state, for example, the residual lifetime can be measured even during processing of a workpiece using laser beam β.

Sixth Embodiment

Figure 27:
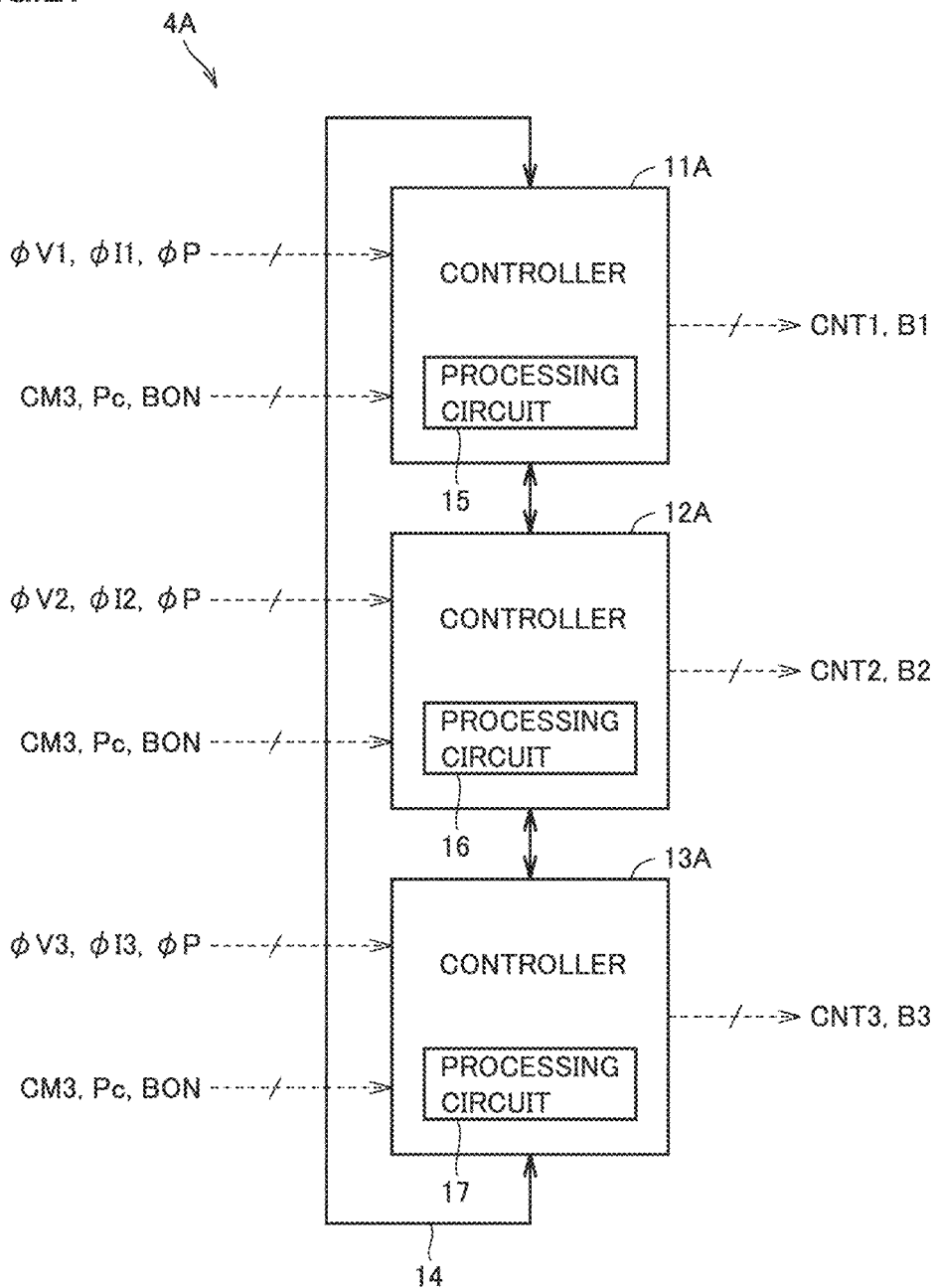
FIG. 27 is a block diagram illustrating a main part of a laser beam generation device according to a sixth embodiment.

FIG. 27 is a block diagram illustrating a main part of a laser beam generation device according to a sixth embodiment and is a view compared with FIG. 24.

Referring to FIG. 27, the laser beam generation device is different from that of the fifth embodiment in that a light emission efficiency detection mode for detecting light emission efficiencies EA1 to EA3 of LD modules M1 to M3 can be set using operation unit 3 and signal CM3 is provided from operation unit 3 to controllers 11A to 13A when the mode is set. Controllers 11A to 13A sequentially execute the light emission efficiency detection mode in response to signal CM3.

When signal CM3 is provided to controller 11A, command unit 23A (FIG. 25) executes the light emission efficiency detection mode prior to controllers 12A, 13A. Command unit 23A outputs set current command value Ic1. Current controller 24 controls the duty ratio of control signal CNT1 such that current I1 indicated by output signal φI1 of current detector CD1 becomes current command value Ic1. Thus, current I1 is output from power supply unit PS1, and LD module M1 is driven by current I1 to output laser beam α1.

The power of laser beam α1 is detected by power detector 2, and signal φP indicating the detected value is provided to command unit 23A. In addition, voltage V1 between the terminals of LD module M1 is detected by voltage detector VD1, and signal φV1 indicating the detected value is provided to command unit 23A.

Command unit 23A obtains light emission efficiency EA1=P/(V1×I1) of LD module M1 based on the power of laser beam α1 indicated by signal φP, voltage V1 between the terminals of LD module M1 indicated by signal φV1, and driving current I1 of LD module M1 indicated by current command value Ic1. After controller 11A, controller 12A detects light emission efficiency EA2 of LD module M2 similarly to controller 11A. After controller 12A, controller 13A detects light emission efficiency EA3 of LD module M3 similarly to controller 11A.

When the normal operation of outputting laser beam β is performed after the end of the light emission efficiency detection mode, controllers 11A to 13A change share ratios SR1 to SR3 of the power of LD modules M1 to M3 such that share ratio SR of LD module M having low light emission efficiency EA becomes small and such that share ratio SR of LD module M having high light emission efficiency EA becomes large. Thus, driving current IM of LD module M having low light emission efficiency EA is decreased, and driving current IM of LD module M having high light emission efficiency EA is increased, so that the efficiency of the laser beam generation device can be enhanced.

Seventh Embodiment

In the laser beam generation device (FIG. 7) that is the comparative example of the first embodiment, when the laser output of LD module M10 is turned off, the setting current less than oscillation threshold current Ith is passed to LD module M10 to increase the temperature of LD module M10. Thus, when the on and off operation of the laser output is repeated, the temperature difference of the junction of the LD between the case where the laser output is on and the case where the laser output is off is reduced. Thus, the thermal stress caused by a heat cycle is prevented from being repeatedly applied to the LD, and a crack is prevented from occurring in a bonding portion between the chip constituting the LD and a bonding wire, solder, or the like to lead to the failure.

However, in the comparative example, the junction temperature of each LD varies depending on the characteristic variation of the LD and the disposition of the cooling member such as the heat sink. For this reason, in some LDs, the temperature difference of the junction temperature between the time when the laser output of the LD module is turned on and the time when the laser output of the LD module is turned off cannot be reduced, and the thermal stress caused by the heat cycle is repeatedly applied to the LDs, which may lead to the early failure. A seventh embodiment solves this problem.

Figure 28:
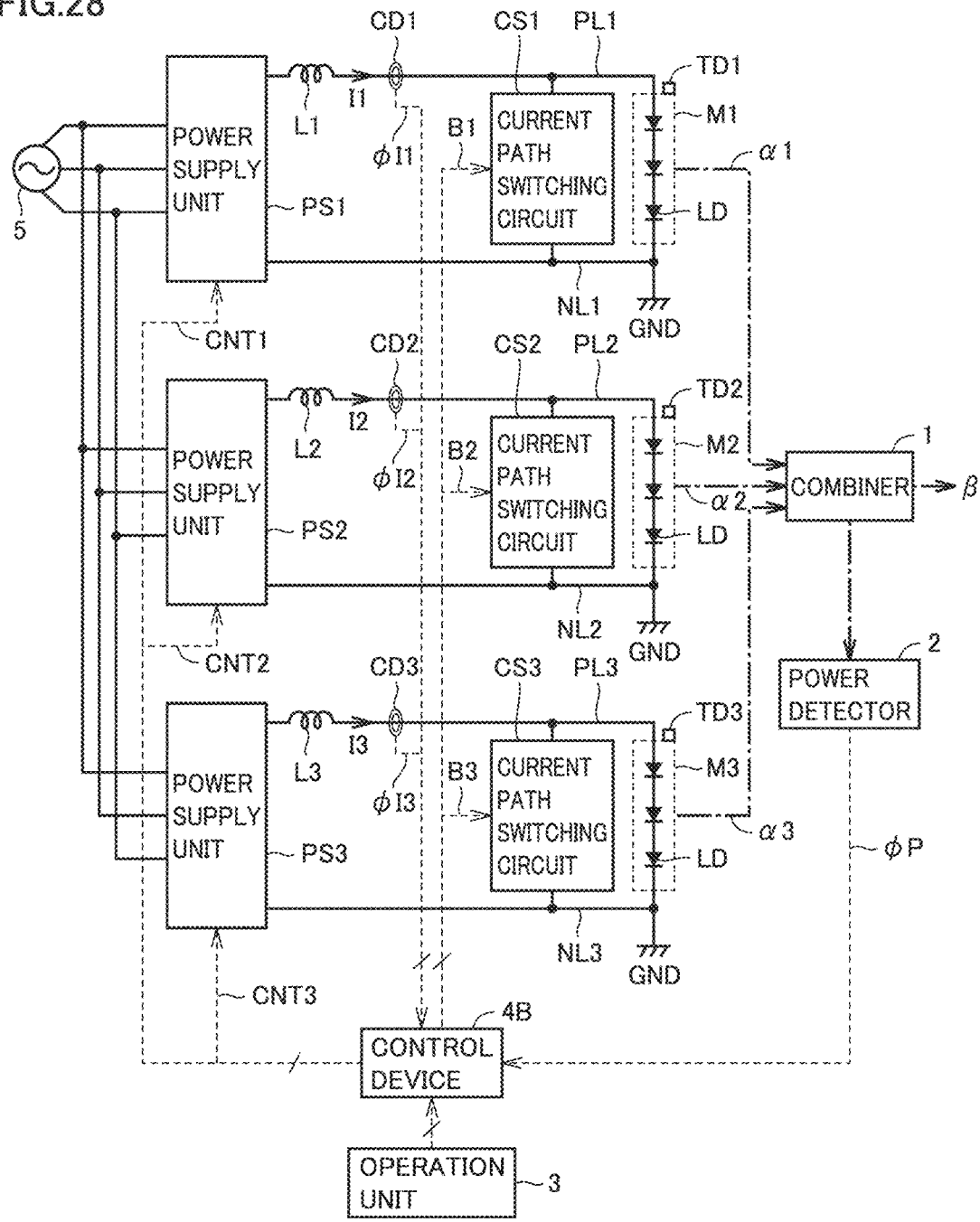
FIG. 28 is a circuit block diagram illustrating a configuration of a laser beam generation device according to a seventh embodiment.

FIG. 28 is a circuit block diagram illustrating a configuration of a laser beam generation device according to the seventh embodiment and is a view compared with FIG. 1. Referring to FIG. 28, the laser beam generation device is different from the laser beam generation device of FIG. 1 in that temperature detectors TD1 to TD3 are added and that control device 4 is replaced with a control device 4B.

Temperature detector TD1 detects a temperature Te1 of LD module M1 and provides a signal φTe1 indicating the detected value to control device 4B. Temperature detector TD2 detects s temperature Te2 of LD module M2 and provides a signal φTe2 indicating the detected value to control device 4B. Temperature detector TD3 detects a temperature Te3 of LD module M3 and provides a signal φTe3 indicating the detected value to control device 4B.

Figure 29:
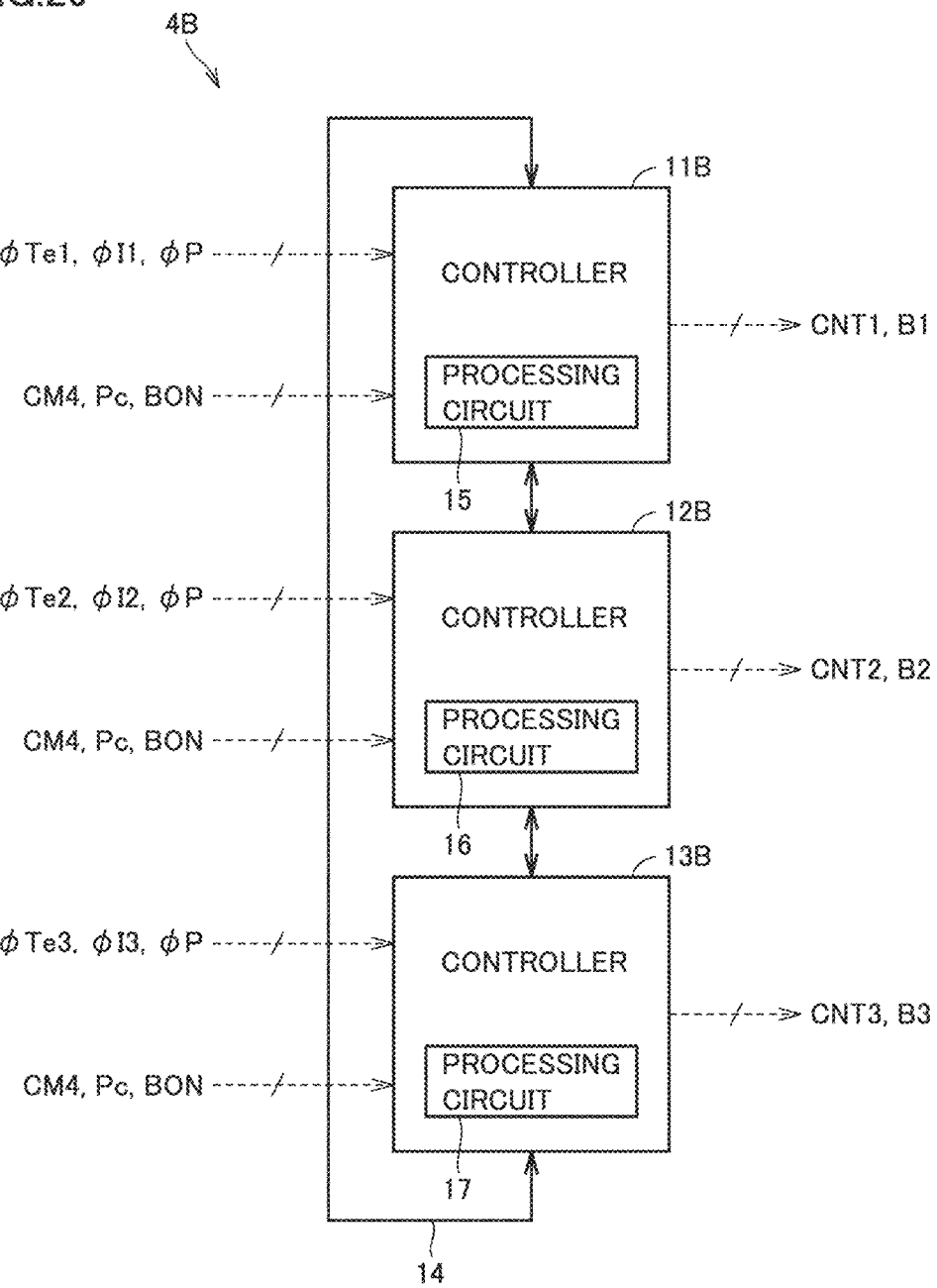
FIG. 29 is a block diagram illustrating a configuration of a control device in FIG. 28.

FIG. 29 is a circuit block diagram illustrating the configuration of control device 4B and is a view compared with FIG. 2. Referring to FIG. 29, control device 4B is different from control device 4 of FIG. 2 in that controller 11 to 13 is replaced with controllers 11B to 13B, respectively.

The user of the laser beam generation device operates operation unit 3 to set a temperature detection mode for detecting temperatures Te1 to Te3 when LD modules M1 to M3 are off. In response to the setting of the temperature detection mode, operation unit 3 provides a signal CM4 instructing the execution of the temperature detection mode to controllers 11B to 13B. Controllers 11B to 13B execute the temperature detection mode in response to signal CM4.

Figure 30:
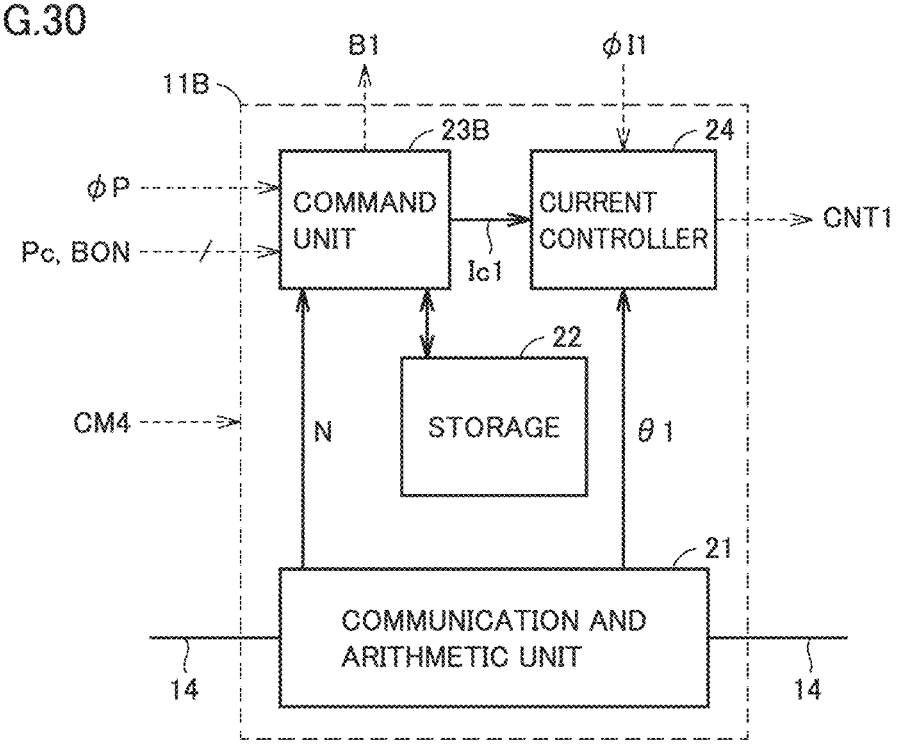
FIG. 30 is a block diagram illustrating a configuration of a controller in FIG. 29.

FIG. 30 is a block diagram illustrating the configuration of controller 11B, and is a view compared with FIG. 3. Referring to FIG. 30, controller 11B is different from controller 11 in that command unit 23 is replaced with a command unit 23B.

When signal CM4 is provided to controller 11B, command unit 23B executes the temperature detection mode. Command unit 23B outputs current command value Ic1 for causing the setting current to flow. Current controller 24 controls the duty ratio of control signal CNT1 such that current I1 indicated by output signal φI1 of current detector CD1 becomes current command value Ic1. Thus, current I1 is output from power supply unit PS1, LD module M1 generates heat by current I1, and temperature Te1 at LD module M1 rises.

Temperature Te1 at LD module M1 is detected by temperature detector TD1 (FIG. 28), and a signal φTe1 indicating the detected value is provided to command unit 23B. Command unit 23B detects temperature Te1 at LD module M1. Similarly to the controller 11B, controllers 12B, 13B (FIG. 29) detect temperatures Te2, Te3 at LD modules M2, M3, respectively.

When the normal operation of outputting laser beam β is performed after the temperature detection mode is ended, controllers 11B to 13B determine current command values Ic1 to Ic3 of LD modules M1 to M3 such that the small current flows through LD module M having high temperature Te and such that the large current flows through LD module M having low temperature Te.

Thus, even when there are the influences of the variations in the characteristics of the LDs and the arrangement of the cooling members such as the heat sink, the temperature difference of the junctions of the LDs can be reduced, and the lifetime of LD modules M1 to M3 can be lengthened while avoiding the thermal stress caused by the heat cycle from being repeatedly applied to the LDs.

When the I-P characteristics and the I-V characteristics of LD modules M1 to M3 are measured, temperatures Te1 to Te3 of LD modules M1 to M3 may be simultaneously measured by temperature detectors TD1 to TD3. The I-P characteristics, the I-V characteristics, threshold current Ith, threshold voltage Vth, laser output efficiency E, and light emission efficiency EA of LD modules M1 to M3 change according to temperatures Te1 to Te3 at LD modules M1 to M3. Consequently, when the residual lifetimes of LD modules M1 to M3 are predicted, the prediction accuracy of the residual lifetimes of LD modules M1 to M3 can be improved in consideration of temperatures Te1 to Te3 at LD modules M1 to M3 measured by temperature detectors TD1 to TD3.

Eighth Embodiment

Figure 31:
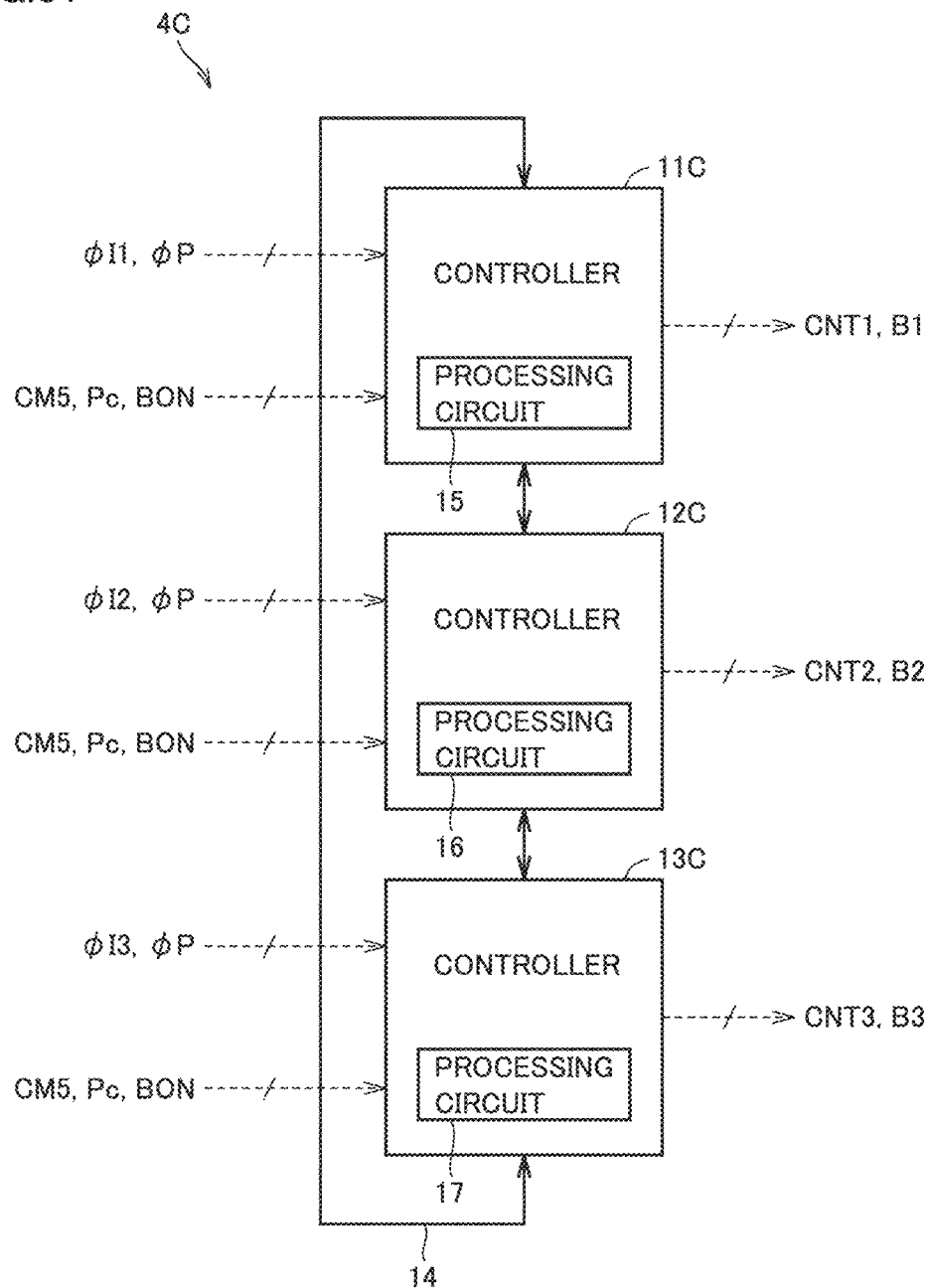
FIG. 31 is a block diagram illustrating a main part of a laser beam generation device according to an eighth embodiment.

FIG. 31 is a circuit block diagram illustrating a main part of a laser beam generation device according to an eighth embodiment and is a view compared with FIG. 2. Referring to FIG. 31, the laser beam generation device of the eighth embodiment is different from that of the first embodiment in that control device 4 is replaced with a control device 4C. In control device 4C, controller 11 to 13 are replaced with controllers 11C to 13C. In the eighth embodiment, a mode for changing the number N of LD modules M to emit light according to laser output setting value Pc using operation unit 3 can be set, and a signal CM5 is provided from operation unit 3 to controllers 11C to 13C when the mode is set.

Figure 32:
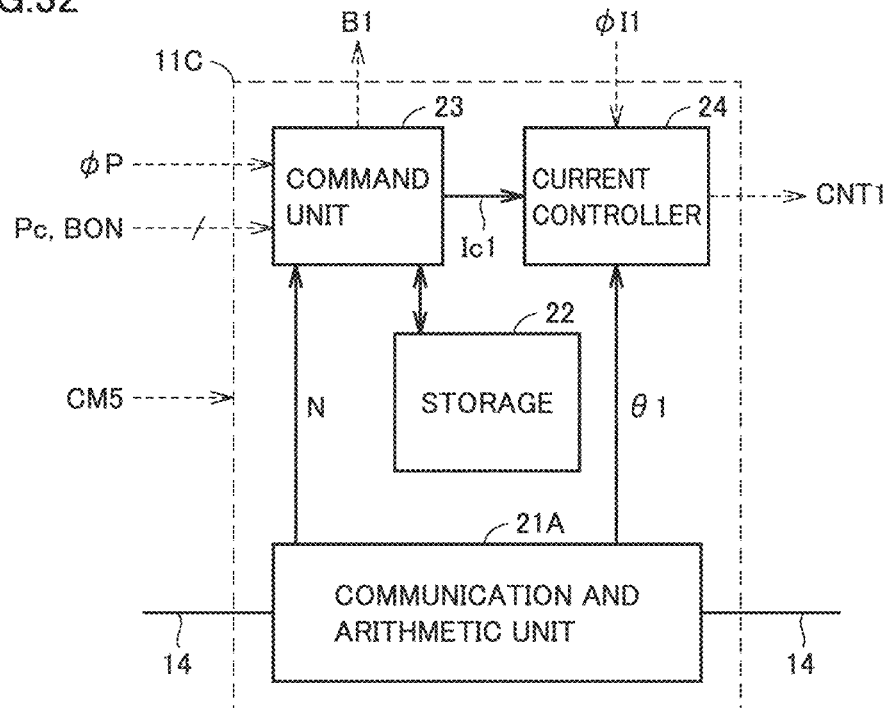
FIG. 32 is a block diagram illustrating a configuration of a controller in FIG. 31.

FIG. 32 is a block diagram illustrating the configuration of controller 11C, and is a view compared with FIG. 3. Referring to FIG. 32, controller 11C is different from controller 11 in that communication and arithmetic unit 21 is replaced with a communication and arithmetic unit 21A.

Communication and arithmetic unit 21A obtains the number N of LD modules M to be caused to emit light according to laser output setting value Pc. For example, N=1 when laser output setting value Pc is small, N=2 when laser output setting value Pc is slightly large, and N=3 when laser output setting value Pc is large. The obtained N is provided to command unit 23.

In the case of N=1, only command unit 23 of controller 11C among controllers 13C to 11C (FIG. 31) outputs current command value Ic1. In the case of N=2, command units 23 of two controllers 11C, 12C among controllers 11C to 13C output current command values Ic1, Ic2. In the case of N=3, command units 23 of all controllers 11C to 13C output current command values Ic1 to Ic3.

Command unit 23 of controller 11C generates current command value Ic1 such that the value of 1/N of power P of output laser beam β indicated by output signal φP of power detector 2 becomes the value of 1/N of laser output setting value Pc. Current controller 24 generates control signal CNT1 such that the detected value of current detector CD1 becomes current command value Id1. Because other configurations and operations are the same as those of the first embodiment, the description will not be repeated.

In the eighth embodiment, when laser output setting value Pc is small, only one LD module (for example, M1) among LD modules M1 to M3 is caused to emit light, so that laser beam having the lower power than that of the first embodiment can be output. Consequently, when the workpiece is processed using laser beam β, fine and precise processing can be performed using low-power laser beam β.

Figure 33:
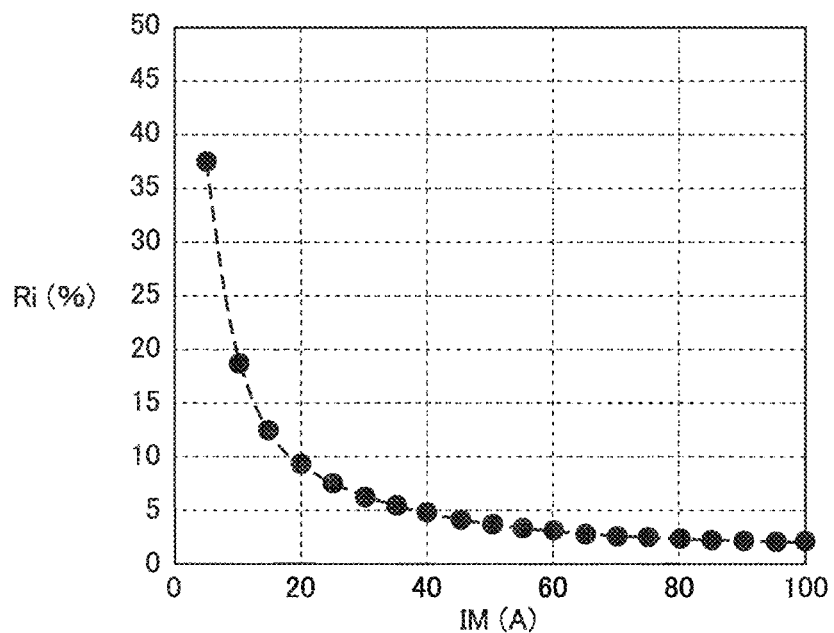
FIG. 33 is a view illustrating an effect of the eighth embodiment.

FIG. 33 is a view illustrating a relationship between driving current IM(A) of LD module M and current ripple rate Ri (%). FIG. 33 illustrates the results measured under the conditions of VLI=200 V, VLO=50 V, f=100 kHz, and L=100 μH.

For example, in the laser beam generation device (FIG. 7) of the comparative example of the first embodiment, when driving current IM of LD module M10 is 20 A, the current ripple rate with respect to driving current IM of the LD module M10 is ±9.4%.

On the other hand, in the laser beam generation device of the eighth embodiment, in order to obtain the same output as that of the laser beam generation device (FIG. 7) of the comparative example of the first embodiment, when 60 A, which is driving current IM three times larger than that of the comparative example, is caused to flow through LD module M1 in which the number of LDs is 1/3 compared with the comparative example, current ripple rate Ri with respect to driving current IM of LD module M1 is ±3.1%. Consequently, in the eighth embodiment, when the low-output operation is performed, current ripple rate Ri of the driving current of LD modules M1 to M3 can be reduced, and the laser output can be stably obtained.

Furthermore, according to the eighth embodiment, not only the laser output can be stably obtained, but also the power conversion efficiency can be improved.

Figure 34:
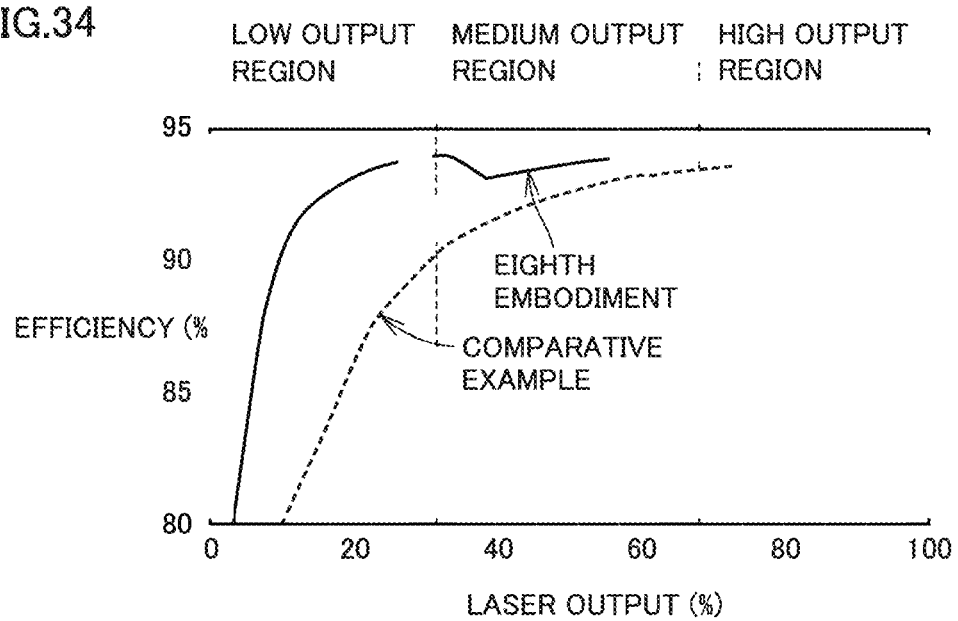
FIG. 34 is a view illustrating a relationship between laser output and power conversion efficiency.

FIG. 34 is a view illustrating a relationship between the laser output and the power conversion efficiency. FIG. 34 illustrates a curve (solid line) indicating the characteristic of the laser beam generation device of the eighth embodiment and a curve (dotted line) indicating the characteristic of the laser beam generation device (FIG. 7) in the comparative example of the first embodiment.

Hereinafter, the eighth embodiment and the comparative example (hereinafter, simply referred to as a "comparative example") of the first exemplary embodiment are compared with each other while the laser output is divided into a low-output region having the laser output of 0 to 33%, a medium output region having the laser output of 33 to 66%, and a high output region having the laser output of 66 to 100%.

Referring to FIG. 34, in the eighth embodiment, the high power conversion efficiency of about 94% is obtained in the high output region and the medium output region when the laser output is decreased from 100%, and the power conversion efficiency is largely decreased when the laser output is about 20% or less.

On the other hand, in the comparative example, when the laser output is decreased from 100%, the high power conversion efficiency of about 94% is obtained in the high output region, the power conversion efficiency gradually decreases in the medium output region, and the power conversion efficiency largely decreases in the low output region.

In the comparative example, because LD module M10 is driven by one power supply unit PS1, the power conversion efficiency of power supply unit PS1 is high during the high output, and the power conversion efficiency of power supply unit PS1 is low during the low output. For this reason, in the comparative example, there is a problem that the power conversion efficiency during the low output is low.

On the other hand, in the eighth embodiment, the power conversion efficiency during the low output can be improved by setting the mode for changing the number N of LD modules M to emit light according to laser output setting value Pc.

In the eighth embodiment, the power capacity of each of power supply units PS1 to PS3 is about 1/3 of the power capacity of power supply unit PS1 in the laser beam generation device (FIG. 7) of the comparative example. In the low output region, only one power supply unit (for example, power supply unit PS1) of power supply units PS1 to PS3 is used in order to cause only one LD module (for example, LD module MD of LD modules M1 to M3 to emit light. In the medium output region, only two power supply units (for example, power supply units PS1, PS2) of power supply units PS1 to PS3 are used in order to cause only any two LD modules (for example, LD modules M1, M2) of LD modules M1 to M3 to emit light. Furthermore, in the high output region, all power supply units PS1 to PS3 are used to cause all LD modules M1 to M3 to emit light. Thus, in the eighth embodiment, the power conversion efficiency of power supply units PS1 to PS3 can be increased in a wide range from the low output region to the high output region.

When the laser beam generation device of the eighth embodiment is used as the laser processing apparatus, the ripple rate of the laser output is reduced, so that stable and accurate processing can be performed even when the laser output is small. For example, when a thin plate is processed, the processing can be performed with less burrs and the fine processing can be performed. Laser marking with low power is also performed. Consequently, the conditions under which the processing can be performed are largely expanded. Consequently, the reliability of the laser processing accuracy can be improved.

When laser output setting value Pc is small, LD modules M1 to M3 may be sequentially driven one by one. In this case, power supply unit PS1, reactor L1, and LD module M1, power supply unit PS2, reactor L2, and LD module M2, and power supply unit PS3, reactor L3, and LD module M3 can be sequentially stopped, so that the temperature rise of power supply units PS1 to PS3, reactors L1 to L3, and LD modules M1 to M3 can be suppressed.

Ninth Embodiment

Figure 35:
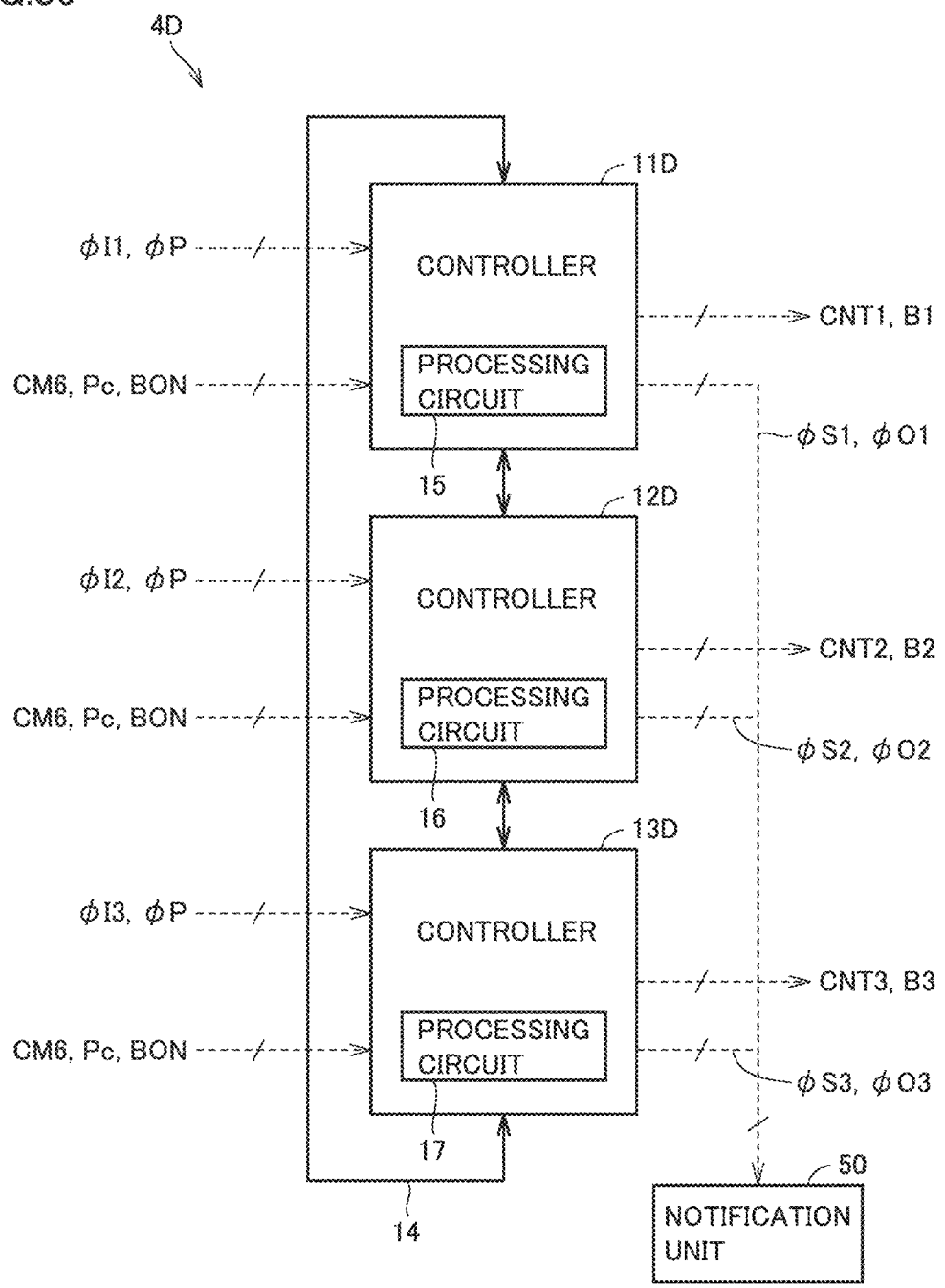
FIG. 35 is a block diagram illustrating a main part of a laser beam generation device according to a ninth embodiment.

FIG. 35 is a circuit block diagram illustrating a main part of a laser beam generation device according to a ninth embodiment and is a view compared with FIG. 2. Referring to FIG. 35, the laser beam generation device of the ninth embodiment is different from that of the first embodiment in that control device 4 is replaced with a control device 4D. Control device 4D is obtained by replacing controller 11 to 13 of control device 4 with controllers 11D to 13D and adding a notification unit 50.

The user of the laser beam generation device operates operation unit 3 to set a failure detection mode for detecting the failure of LD modules M1 to M3. In response to the setting of the failure detection mode, operation unit 3 provides a signal CM6 instructing the execution of the failure detection mode to controllers 11D to 13D. Controllers 11D to 13D execute the failure detection mode in response to signal CM6.

Controller 11D performs the same operation as controller 11, and in response to signal CM6, generates current command value Ic1 to cause LD module M1 to emit light such that the difference between the power of laser beam α1 indicated by output signal φP of power detector 2 and laser output setting value Pc is eliminated. Then, when the power of laser beam α1 is smaller than a reference value Ps, controller 11D determines that a short circuit failure of LD module M1 occurs, and raises signal φS1 from the "L" level that is the inactivation level to the "H" level that is the activation level. Reference value Ps is a reference current value used to determine whether LD module M fails.

In addition, when current I1 indicated by output signal φI1 of current detector CD1 is 0 A while power supply unit PS1 is driven, controller 11D determines that an open fault of LD module M1 occurs, and raises signal φO1 from the "L" level of the deactivation level to the "H" level of the activation level.

Similarly to controller 11D, when the power of laser beam α2 is smaller than reference value Ps, controller 12D determines that the short circuit failure of LD module M2 occurs, and raises signal φS2 from the "L" level that is the inactivation level to the "H" level that is the activation level. In addition, when current I2 indicated by output signal φI2 of current detector CD2 is 0 A while power supply unit PS2 is driven, controller 12D determines that the open fault of LD module M2 occurs, and raises signal φO2 from the "L" level of the deactivation level to the "H" level of the activation level.

Similarly to controller 11D, when the power of laser beam α3 is smaller than reference value Ps, controller 13D determines that the short circuit failure of LD module M3 occurs and raises signal φS3 from the "L" level that is the inactivation level to the "H" level that is the activation level. In addition, when current I3 indicated by output signal φI3 of current detector CD3 is 0 A while power supply unit PS3 is driven, controller 13D determines that the open fault of LD module M3 occurs, and raises signal φO3 from the "L" level of the deactivation level to the "H" level of the activation level.

When signals φS1 to φS3 are set to the "H" level that is the activation level, notification unit 50 notifies the user of the laser beam generation device by sound, light, image, or the like that the short circuit failure of LD modules M1 to M3 occurs. When signals φO1 to φO3 are set to the "H" level that is the activation level, notification unit 50 notifies the user of the laser beam generation device by sound, light, an image, or the like that the open fault of LD modules M1 to M3 occurs.

Figure 36:
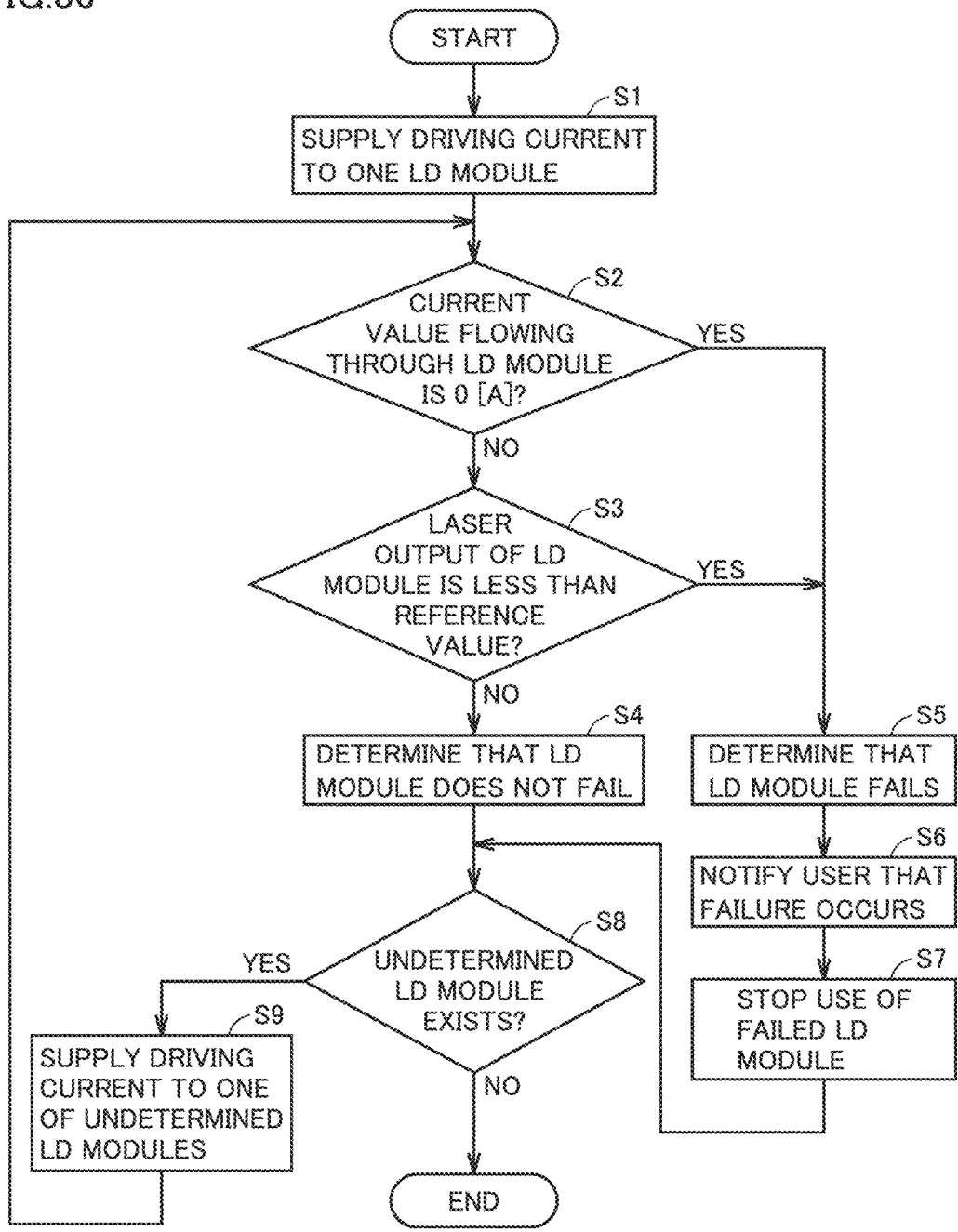
FIG. 36 is a flowchart illustrating operation of the control device in FIG. 35.

FIG. 36 is a flowchart illustrating the operation of control device 4D in the failure detection mode. Referring to FIG. 36, in step S1, control device 4D controls power supply unit PS to supply driving current IM (IM1) to any one of LD modules M1 to M3 (hereinafter, referred to as LD module M1).

In step S2, control device 4D determines whether driving current IM1 flowing through LD module M1 is 0 A based on output signal φI1 of current detector CD1 corresponding to LD module M1, proceeds to step S5 because the open fault of LD module M1 occurs when driving current IM1 is 0 A, and proceeds to step S3 when driving current IM1 is not 0 A.

In step S3, control device 4D determines whether the laser output of driven LD module M1 is less than reference value Ps, proceeds to step S5 because the short circuit failure of LD module M1 occurs when the laser output is less than reference value Ps, and proceeds to step S4 when the laser output is not less than reference value Ps. In step S4, control device 4D determines that driven LD module M1 does not fail, and proceeds to step S8.

In step S5, control device 4D determines that the failure of LD module M1 occurs. In step S6, control device 4D causes notification unit 50 to notify the user that the failure occurs. In step S7, control device 4D stops the use of failed LD module M1. Specifically, the supply of the control signal to power supply unit PS1 corresponding to failed LD module M1 is stopped, and the supply of the current to LD module M1 is stopped.

In step S8, control device 4D determines whether the LD module in which the presence or absence of the failure is not yet determined exists, and ends the execution of the failure detection mode when the undetermined LD module does not exist. When the undetermined LD module exists, control device 4D supplies driving current IM (IM2) to any one of the undetermined LD modules (for example, LD module M2), and returns to step S2. Steps S2 to S9 are repeatedly executed until the presence or absence of the failure of all the LD modules is determined.

Control device 4D changes driving current IM of remaining LD module M in order to output laser beam β having the power indicated by laser output setting value Pc until the failed LD module is repaired or replaced with a new LD module.

According to the laser beam generation device of the ninth embodiment, the presence or absence of the failure of LD module M can be detected, and laser beam β can be output using the LD module that does not fail.

Further, in the laser beam generation device (FIG. 7) of the comparative example of the first embodiment, only one LD module M10 is provided. Therefore, when LD module M10 fails, the device cannot be operated until the repair is completed, the laser processing process is completely stopped, and there is a risk that the large loss occurs for a factory including the laser processing apparatus.

However, in the ninth embodiment, even when any one of LD modules M1 to M3 fails, the laser processing can be performed by supplementing the laser output with another LD module, so that the laser processing process is not stopped and the loss can be suppressed in the factory.

In addition, when one LD in the LD module fails during repair, it is necessary to replace the entire LD module. In the laser beam generation device of the comparative example, because all the LDs to be used are included in LD module M10, all the LDs need to be replaced when one LD fails.

On the other hand, in the laser beam generation device of the ninth embodiment, because the LDs as many as LD modules M10 are distributed in three LD modules M1 to M3, even when one LD fails, only the LDs in the LD module including the failed LD need to be replaced. Consequently, the number of LDs to be replaced can be reduced to 1/3 as compared with the comparative example, and the repair cost can be reduced.

Although both the short circuit failure and the open fault are detected in the ninth embodiment, only the short circuit failure or only the open fault may be detected.

Tenth Embodiment

Figure 37:
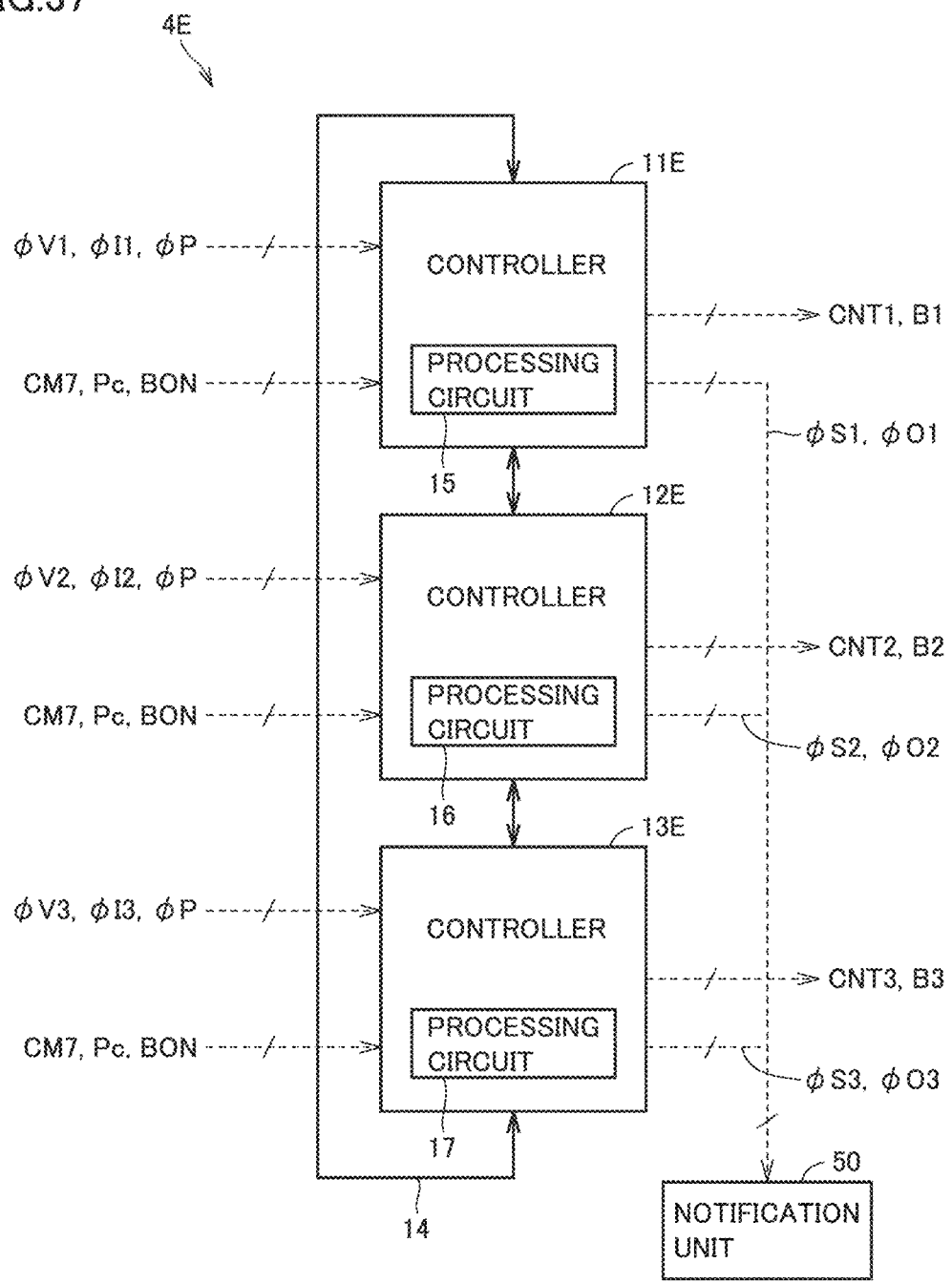
FIG. 37 is a block diagram illustrating a main part of a laser beam generation device according to a tenth embodiment.

FIG. 37 is a circuit block diagram illustrating a main part of a laser beam generation device according to a tenth embodiment and is a view compared with FIG. 24. Referring to FIG. 37, the laser beam generation device of the tenth embodiment is different from that of the fifth embodiment in that control device 4A is replaced with a control device 4E.

Control device 4E is obtained by replacing controllers 11A to 13A of control device 4A with controllers 11E to 13E, respectively.

The user of the laser beam generation device operates operation unit 3 to set a failure detection mode for detecting the failure of LD modules M1 to M3. In response to the setting of the failure detection mode, operation unit 3 provides a signal CM7 instructing the execution of the failure detection mode to controllers 11E to 13E. Controllers 11E to 13E execute the failure detection mode in response to signal CM7.

Controller 11E performs the same operation as controller 11A, and in response to signal CM7, generates current command value Ic1 to cause LD module M1 to emit light such that the difference between value P/3 that is 1/3 of the power of laser beam β indicated by output signal φP of power detector 2 and value Pc/3 that is 1/3 of laser output setting value Pc is eliminated.

When voltage V1 between the terminals of LD module M1 indicated by output signal φV1 of voltage detector VD1 is smaller than reference value Vs, controller 11E determines that the short circuit failure of LD module M1 occurs, and raises signal φS1 from the "L" level that is the deactivation level to the "H" level that is the activation level. Reference value Vs is a reference voltage value used to determine whether LD module M fails.

In addition, when current I1 indicated by output signal φI1 of current detector CD1 is 0 A while power supply unit PS1 is driven, controller 11E determines that the open fault of LD module M1 occurs, and raises signal φO1 from the "L" level of the inactivation level to the "H" level of the activation level.

Similarly to controller 11E, when voltage V2 between the terminals of LD module M2 indicated by output signal φV2 of voltage detector VD2 is smaller than reference value Vs, controller 12E determines that the short circuit failure of LD module M2 occurs, and raises signal φS2 from the "L" level that is the deactivation level to the "H" level that is the activation level. In addition, when current I2 indicated by output signal φI2 of current detector CD2 is 0 A while power supply unit PS2 is driven, controller 12E determines that the open fault of LD module M2 occurs, and raises signal φO2 from the "L" level of the deactivation level to the "H" level of the activation level.

Similarly to controller 11E, when voltage V3 between the terminals of LD module M3 indicated by output signal φV3 of voltage detector VD3 is smaller than reference value Vs, controller 13E determines that the short circuit failure of LD module M3 occurs, and raises signal φS3 from the "L" level that is the deactivation level to the "H" level that is the activation level. In addition, when current I3 indicated by output signal φI3 of current detector CD3 is 0 A while power supply unit PS3 is driven, controller 13E determines that the open fault of LD module M3 occurs, and raises signal φO3 from the "L" level of the deactivation level to the "H" level of the activation level.

Figure 38:
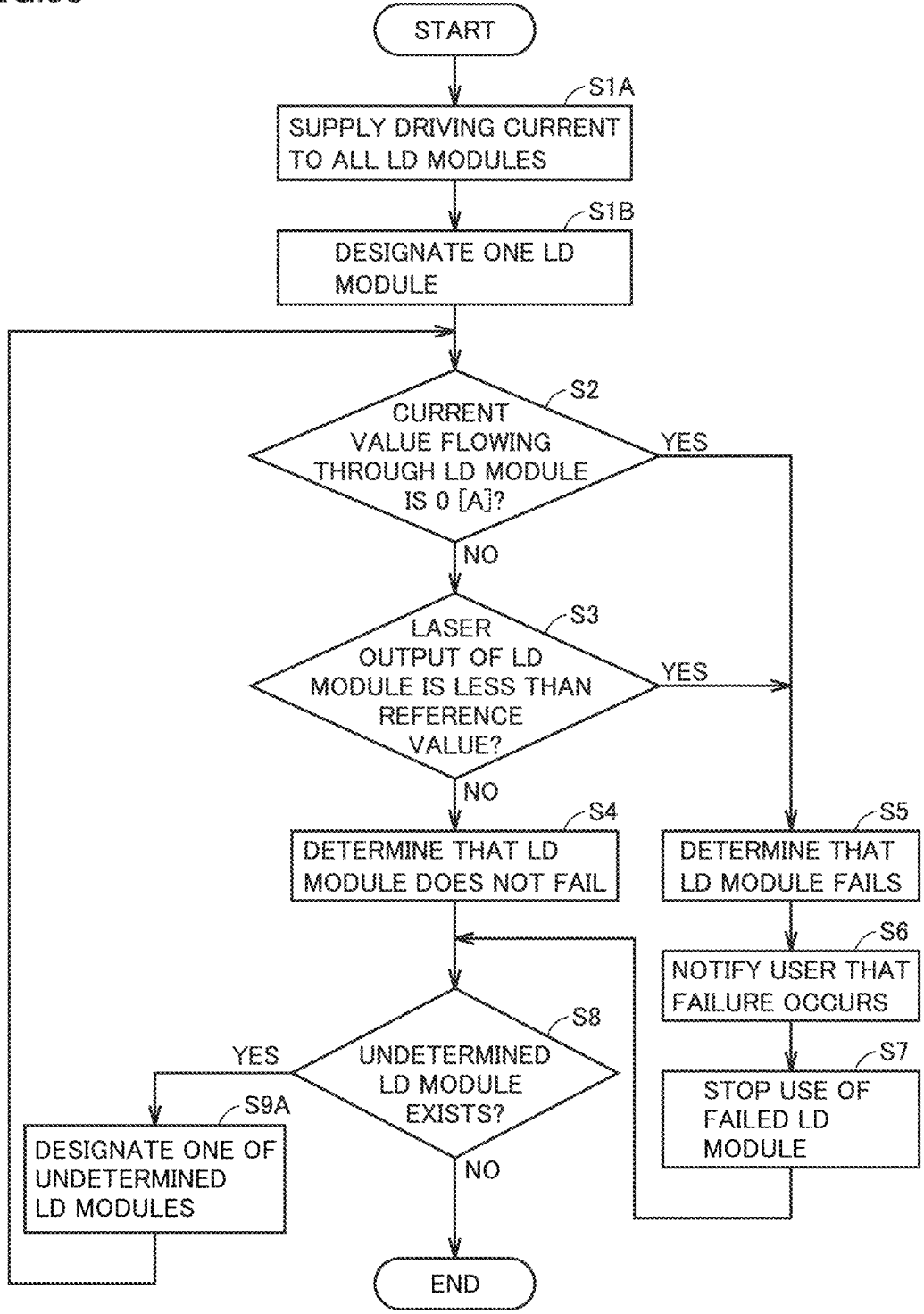
FIG. 38 is a flowchart illustrating operation of the control device in FIG. 37.

FIG. 38 is a flowchart illustrating the operation of control device 4E in the failure detection mode and is a view compared with FIG. 36. The flowchart of FIG. 38 is different from the flowchart of FIG. 36 in that step S1 is replaced with steps S1A, S1B and step S9 is replaced with step S9A.

Referring to FIG. 38, control device 4E supplies driving currents IM1 to IM3 to all LD modules M1 to M3 in step S1A, and designates any one of LD modules M1 to M3 in step S1B. When the determination that the undetermined LD module exists is made in step S8, control device 4E designates any one of the undetermined LD modules in step S9A, and returns to step S2. Other configurations and operations are the same as those of the fifth and ninth embodiments, and thus, the description will not be repeated.

According to the laser beam generation device of the tenth embodiment, the presence or absence of the failure of LD module M can be also detected, and laser beam β can be also output using the LD module that does not fail.

In addition, in the ninth embodiment, because the laser outputs of LD modules M1 to M3 are measured one by one by driving power supply units PS1 to PS3 one by one during the detection of the short circuit failure, the detection time of the short circuit failure is long. On the other hand, in the tenth embodiment, power supply units PS1 to PS3 are simultaneously driven during the detection of the short circuit failure to simultaneously measure voltages V1 to V3 between the terminals of LD modules M1 to M3, so that the detection time of the short circuit failure can be shortened as compared with the ninth embodiment.

Furthermore, because it is not necessary to drive LD modules M1 to M3 one by one, the failure can be detected even when a plurality of LD modules are caused to emit light during the laser processing. For this reason, damage to the workpiece due to the failure of the LD module during processing can be minimized.

Although both the short circuit failure and the open fault are also detected in the tenth embodiment, only the short circuit failure or only the open fault may be detected.

Eleventh Embodiment

Figure 39:
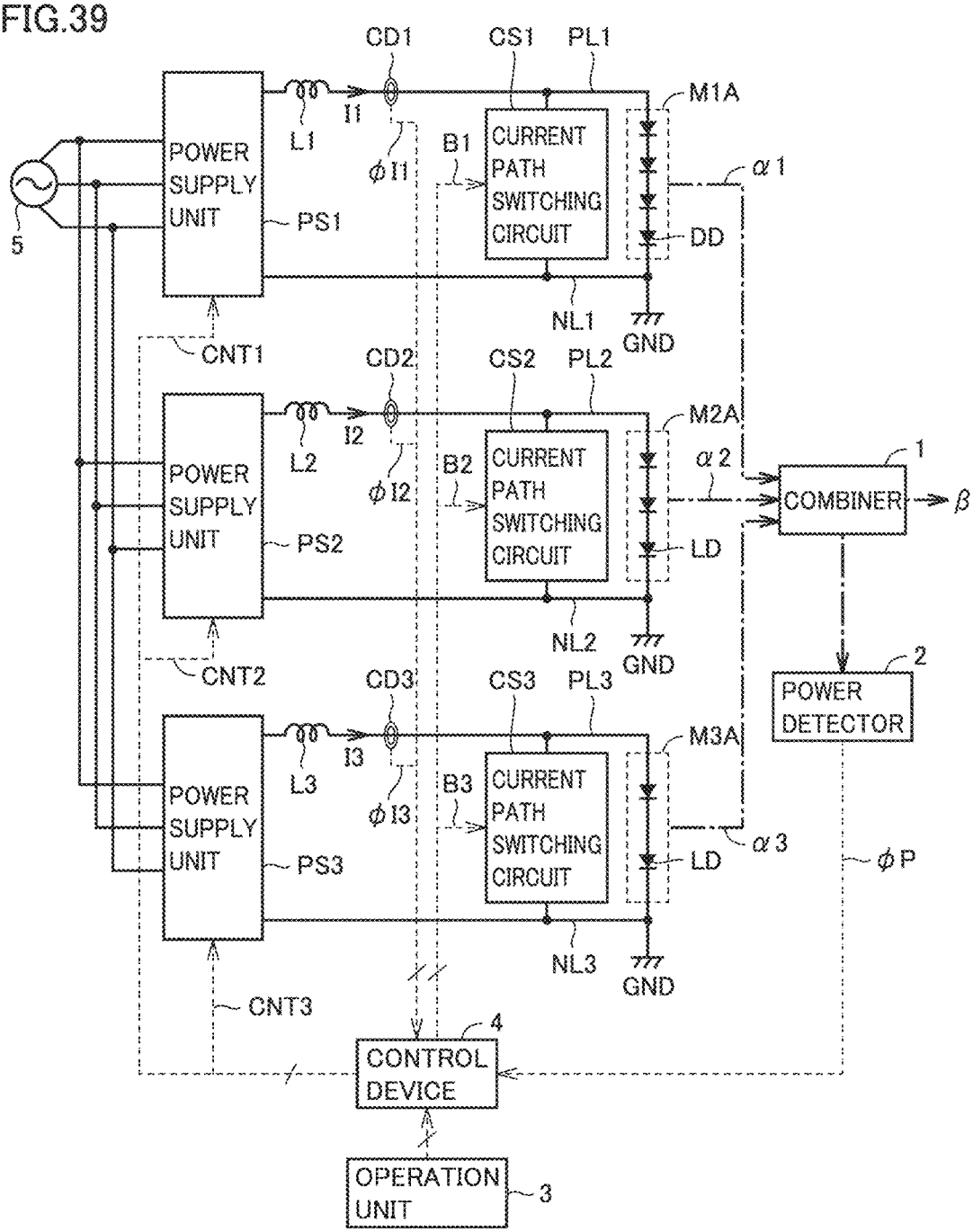
FIG. 39 is a circuit block diagram illustrating a configuration of a laser beam generation device according to an eleventh embodiment.

FIG. 39 is a circuit block diagram illustrating a configuration of a laser beam generation device according to an eleventh embodiment and is a view compared with FIG. 1. Referring to FIG. 39, the laser beam generation device of the eleventh embodiment is different from the laser beam generation device of FIG. 1 in that LD modules M1 to M3 are replaced with LD modules M1A to M3A, respectively.

LD modules M1A to M3A have different numbers of LDs. In this example, LD module M1A includes four LDs connected in series, LD module M2A includes three LDs connected in series, and LD module M3A includes two LDs connected in series. The number of LDs is not limited to the above number.

Control device 4 selects at least one LD module among three LD modules M1 to M3 based on laser output setting value Pc, and causes the selected LD module to emit light. Because other configurations and operations are the same as those of the first embodiment, the description will not be repeated.

In the eleventh embodiment, when laser output setting value Pc is small, by causing only driving current IM3 to flow through LD module M3A having the small number of LDs in series, the smaller laser output can be obtained as compared with the first embodiment, and the processing can be performed using laser beam having the lower output.

LD module M1A having the large number of LDs in series is driven when the large output is obtained, and LD module M3A having the small number of LDs in series is driven when the small output is obtained, so that the laser output from the low output to the high output can be obtained in a gradation manner. Consequently, the number of types of objects that can be processed can be increased.

In addition, laser beam α1 having the output close to laser output setting value Pc is output from LD module M1A having the large number of series LDs, and the laser output is finely adjusted by output laser beam α3 of LD module M3A having the small number of series LDs, whereby the magnitude of the laser output can be finely controlled. Consequently, highly accurate processing can be performed.

Twelfth Embodiment

Figure 40:
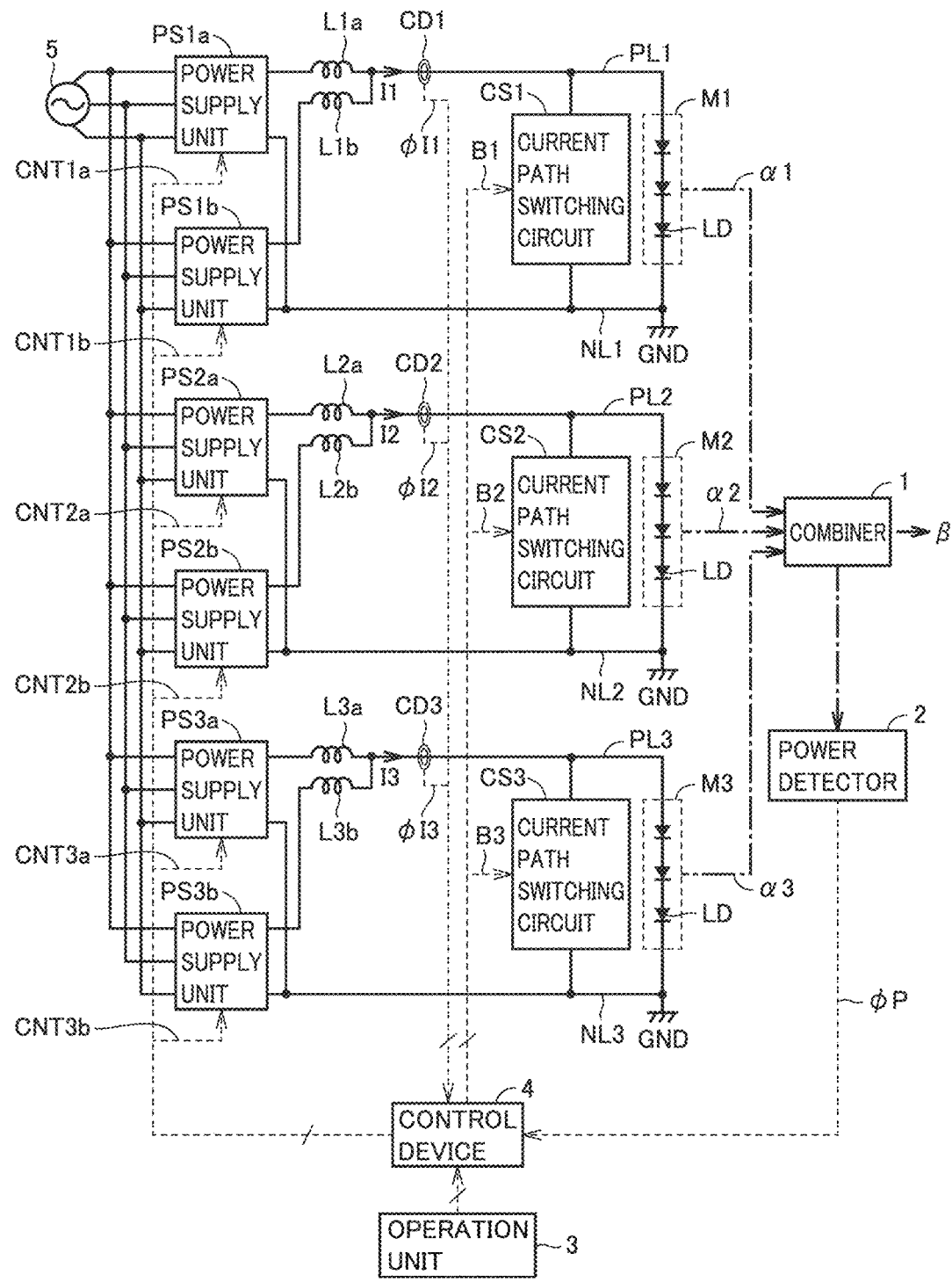
FIG. 40 is a circuit block diagram illustrating a configuration of a laser beam generation device according to a twelfth embodiment.

FIG. 40 is a circuit block diagram illustrating a configuration of a laser beam generation device according to a twelfth embodiment and is a view compared with FIG. 1. Referring to FIG. 40, the laser beam generation device of the twelfth embodiment is different from the laser beam generation device in FIG. 1 in that power supply unit PS1 is replaced with sub-power supply units PS1a, PS1b, that power supply unit PS2 is replaced with sub-power supply units PS2a, PS2b, that power supply unit PS3 is replaced with sub-power supply units PS3a, PS3b, that reactor L1 is replaced with sub-reactors L1a, L1b, that reactor L2 is replaced with sub-reactors L2a, L2b, and that reactor L3 is replaced with sub-reactors L3a, L3b.

One terminals of sub-reactors L1a, L1b are connected to the positive electrodes of sub-power supply units PS1a, PS1b, respectively, and both the other terminals of sub-reactors L1a, L1b are connected to DC positive bus PL1. Current detector CD1 detects current I1 that is the sum of the output currents of sub-reactors L1a, L1b, and outputs signal φI1 indicating the detected value to control device 4. Both the negative electrodes of the sub-power supply units PS1a, PS1b are connected to DC negative bus NL1.

Sub-power supply units PS1a, PS1b are driven by sub-control signals CNT1a, CNT1b, respectively. The phases of the pulses of sub-control signals CNT1a, CNT1b are shifted from each other by 180 degrees, and sub-power supply units PS1a, PS1b are interleave-controlled. Consequently, the phases of the current ripples included in the output currents of sub-reactors L1a, L1b are shifted from each other by 180 degrees, and the current ripples included in the output currents of sub-reactors L1a, L1b cancel each other, so that the current ripple included in current I1 becomes smaller and the ripple rate of laser beam α1 output from LD module M1 becomes smaller than that of the first embodiment.

Sub-reactors L2a, L2b, sub-power supply units PS2a, PS2b, sub-reactors L3a, L3b, and sub-power supply units PS3a, PS3b also have the same configurations as those of sub-reactors L1a, L1b and sub-power supply units PS1a, PS1b. Because other configurations and operations are the same as those of the first embodiment, the description will not be repeated.

In the twelfth embodiment, two sub-power supply units are provided corresponding to each LD module, and the two sub-power supply units are interleave-controlled, so that the current ripple of the current flowing through each LD module can be reduced. As a result, the ripple rate generated in output laser beam β can be further reduced as compared with the first embodiment. In addition, the inductance value of each reactor that smoothes the current ripple and the capacitance value of the smoothing capacitor can be further reduced, this can also contribute to reduction in component cost.

Figure 41:
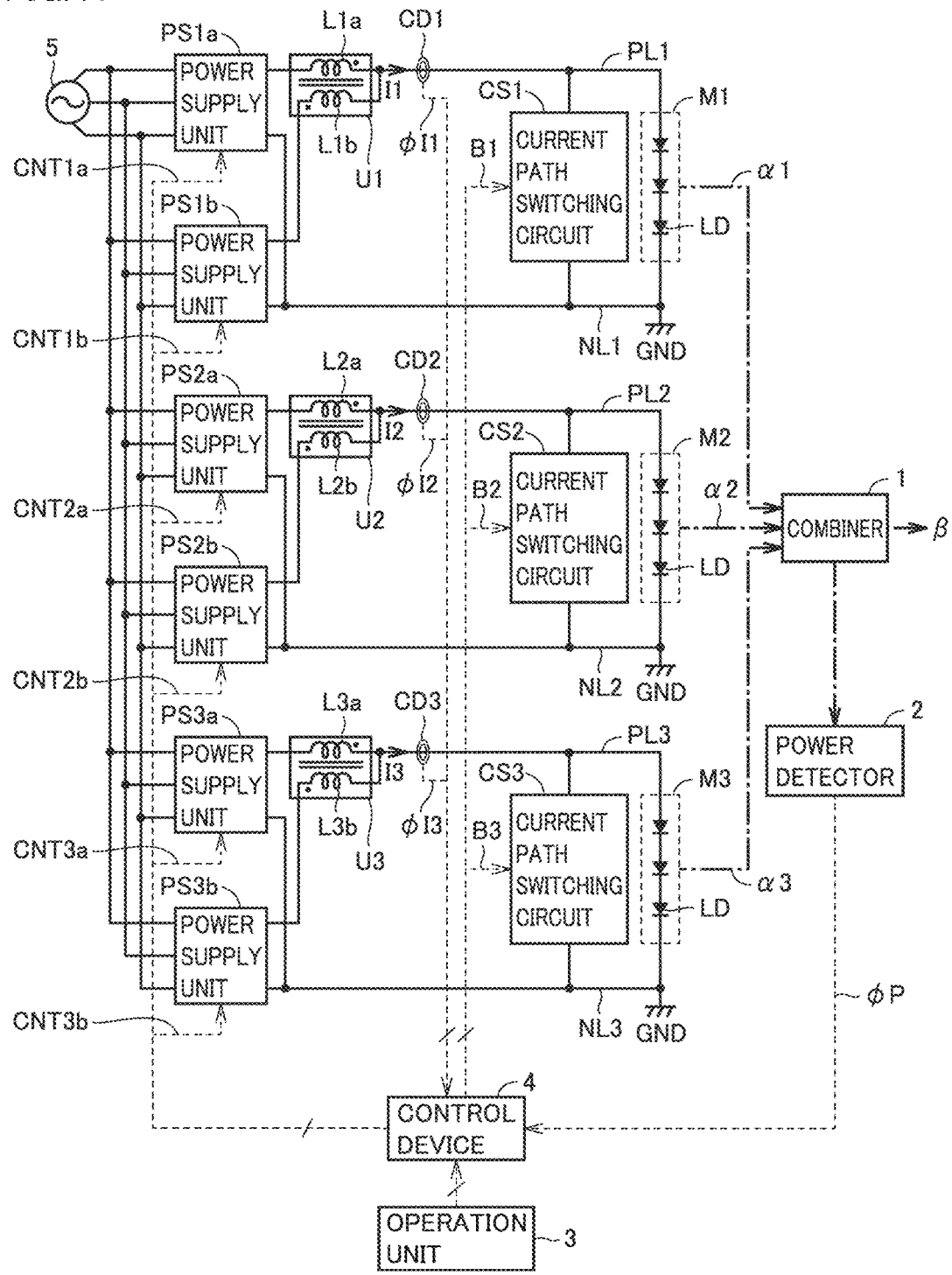
FIG. 41 is a circuit block diagram illustrating a modification of the twelfth embodiment.

FIG. 41 is a circuit block diagram illustrating a modification of the twelfth embodiment and is a view compared with FIG. 40. Referring to FIG. 41, the difference from FIG. 40 is that sub-reactors L1a, L1b constitute a magnetically coupled reactor unit U1, sub-reactors L2a, L2b constitute a magnetically coupled reactor unit U2, and sub-reactors L3a, L3b constitute a magnetically coupled reactor unit U3. In reactor unit U1, sub-reactors L1a, L1b are wound around the same iron core and magnetically coupled. In reactor unit U2, sub-reactors L2a, L2b are wound around the same iron core and magnetically coupled. In reactor unit U3, sub-reactors L3a, L3b are wound around the same iron core and magnetically coupled. In this modification, the downsizing of each reactor and the reduction of the component cost can be achieved.

Thirteenth Embodiment

In the first embodiment, phase angles θ1 to θ3 of control signals CNT1 to CNT3 are set to 0 degrees, 60 degrees, and 120 degrees, respectively, so that the phases of the current ripples generated in driving currents IM1 to IM3 of LD modules M1 to M3 are shifted by 120 degrees. Thus, ideally the ripple of power P of laser beam β is reduced by the effect that the ripples of the laser outputs of LD modules M1 to M3 cancel each other out.

However, in practice, the current ripples generated in currents IM1 to IM3 vary due to component variations (for example, variations in inductance values of reactors L1 to L3). For example, from the above equation (1), current ripple IR is +25% when the variation in inductance value L of the reactor is −20%, and current ripple IR is −17% when the variation in inductance value L is +20%. For this reason, the current ripples generated in currents IM1 to IM3 are superimposed, and sometimes the ripple of power P of laser beam β increases. Accordingly, in a thirteenth embodiment, the phase difference between the current ripples is adjusted based on the magnitude of each current ripple flowing through LD modules M1 to M3, so that the ripple of laser beam β is suppressed to stabilize the laser output.

Hereinafter, regarding the "phase difference between the current ripples", the magnitude of the phase difference having a smaller absolute value between the phase difference on a phase leading side and the phase difference on a phase delay side of the current ripples flowing through other LD modules with respect to the phase of the current ripple flowing through a certain LD module is referred to as a "phase difference between the current ripples".

Figure 42:
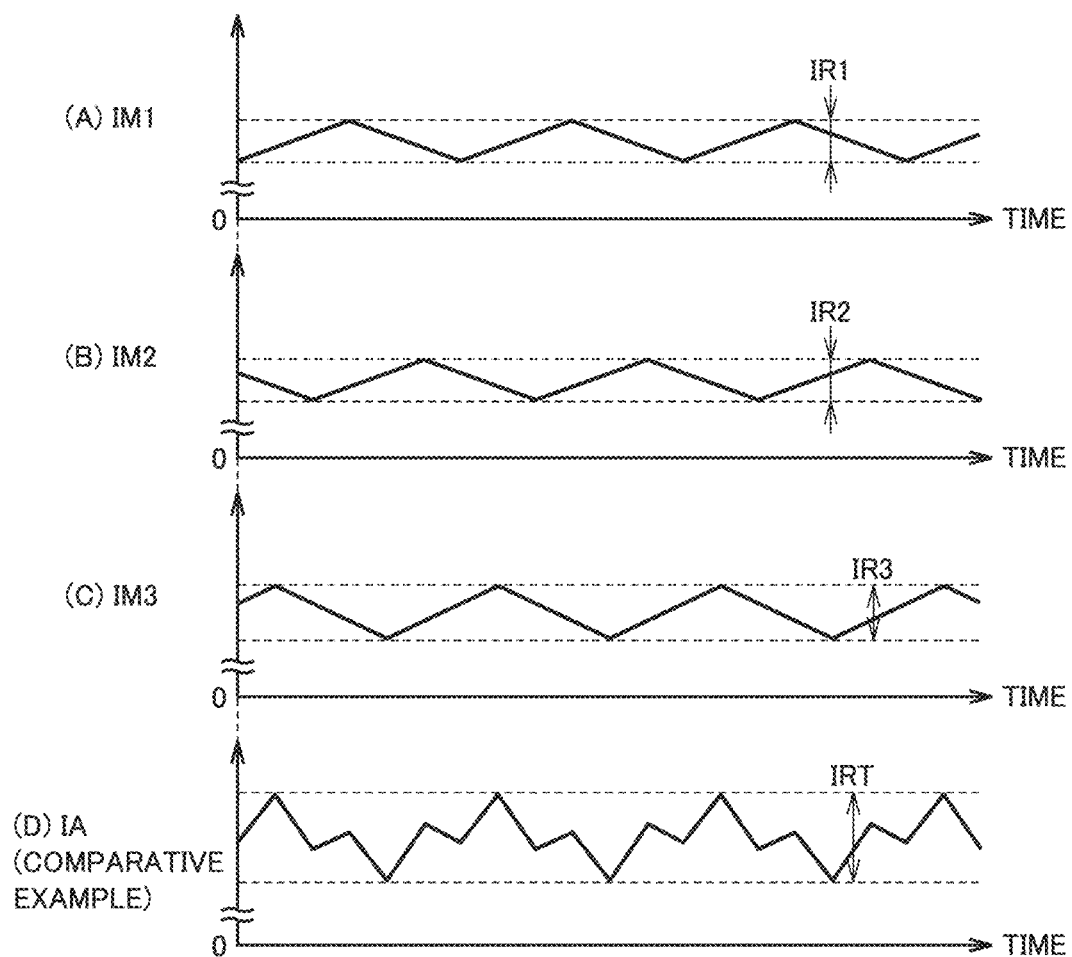
FIG. 42 is a time chart illustrating an example of operation of a laser beam generation device in a comparative example of a thirteenth embodiment.

FIG. 42 is a time chart illustrating an example of the operation of the laser beam generation device in the comparative example of the thirteenth embodiment. FIGS. 42(A) to 42(C) illustrate the waveforms of currents IM1 to IM3 flowing through LD modules M1 to M3, respectively, and FIG. 42(D) illustrates the waveforms when the currents IM1 to IM3 are added. The current value obtained by adding currents IM1 to IM3 is proportional to power P of laser beam β.

In the comparative example, the phase differences between the current ripples of currents IM1 to IM3 are 120 degrees from each other. The inductance values of reactors L1, L2 vary by +20% with respect to the reference value, and the inductance value of reactor L3 varies by −20% with respect to the reference value.

In the comparative example, the current ripple of each of currents IM1 to IM3 is about 1.4 A for currents IM1, IM2 and about 2 A for current IM3, and the ripple rate of the current obtained by adding currents IM1 to IM3 is about ±4.0%.

Figure 43:
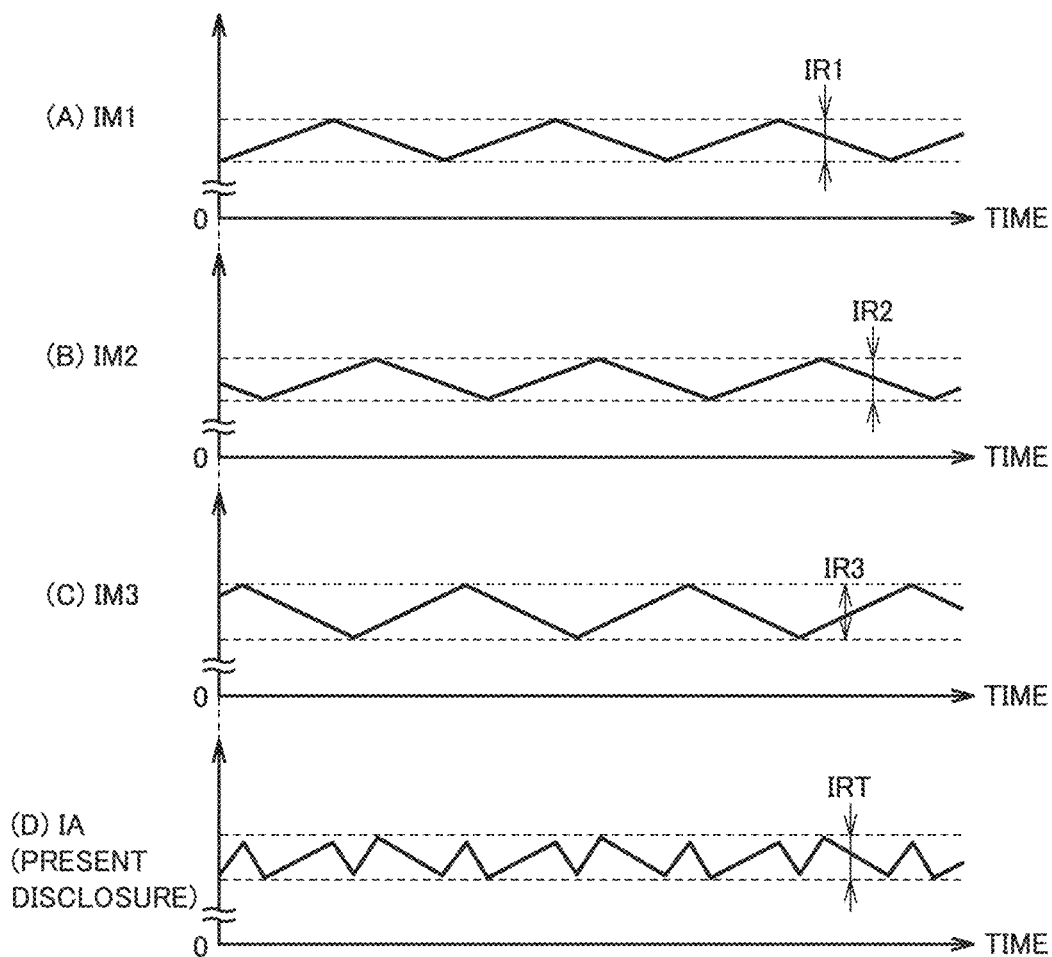
FIG. 43 is a time chart illustrating an example of operation of a laser beam generation device according to the thirteenth embodiment.

FIG. 43 is a time chart illustrating an example of the operation of the laser beam generation device according to the thirteenth embodiment. FIGS. 43(A) to 43(C) illustrate the waveforms of currents IM1, IM3 flowing through LD modules M1 to M3, respectively, and FIG. 43(D) illustrates the waveforms when currents IM1 to IM3 are added.

In the thirteenth embodiment, the phase differences between the current ripples are adjusted by controlling phase angles θ1 to θ3 of control signals CNT1 to CNT3 from the magnitude of the current ripple of each of currents IM1 to IM3 such that the laser output is stabilized (so that the ripple of laser beam β is suppressed) (the adjustment method will be described later). Also in this example, it is assumed that the inductance values of reactors L1, L2 vary by +20% with respect to the reference value, and the inductance value of reactor L3 varies by −20% with respect to the reference value.

Consequently, also in the thirteenth embodiment, the current ripple of each of currents IM1 to IM3 is about 1.4 A for currents IM1, IM2 and about 2 A for current IM3. On the other hand, the ripple rate of the current obtained by adding currents IM1 to IM3 is suppressed to about 11.6% by adjusting the phase differences between the current ripples so as to stabilize the laser output.

Figure 44:
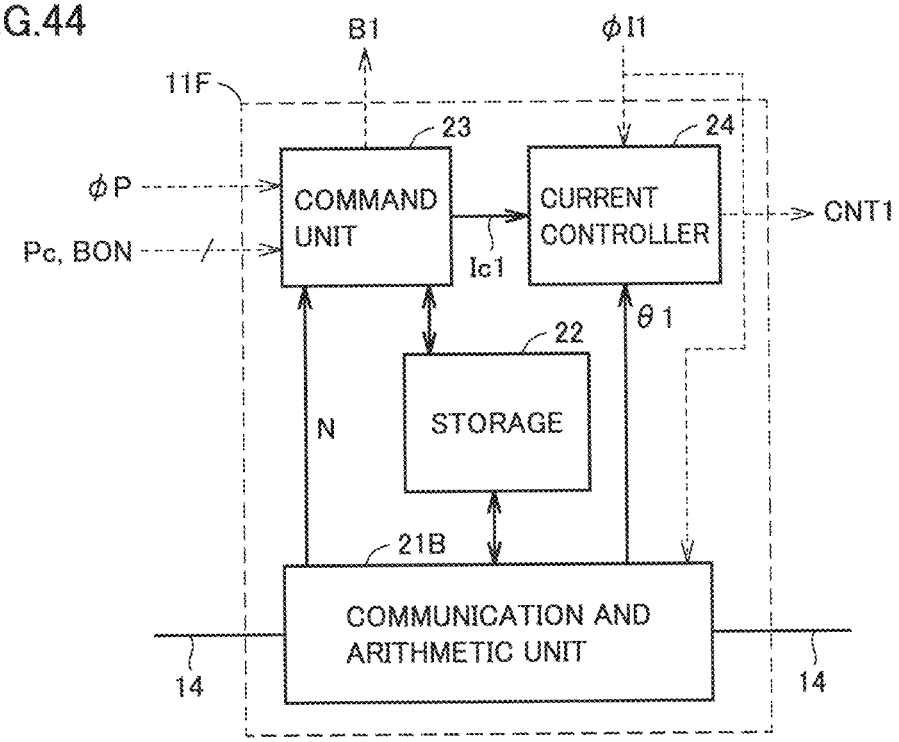
FIG. 44 is a block diagram illustrating a configuration of a controller in the laser beam generation device according to the thirteenth embodiment.

FIG. 44 is a block diagram illustrating a configuration of a controller 11F in the laser beam generation device of the thirteenth embodiment, and is a view compared with FIG. 3. The configurations of controllers 12F, 13F (not illustrated) are also similar to those of controller 11F, and the configuration of controller 11F is representatively illustrated in FIG. 44. Referring to FIG. 44, controller 11F is different from controller 11 in FIG. 3 in that communication and arithmetic unit 21 is replaced with a communication and arithmetic unit 21B.

Communication and arithmetic unit 21B receives output signal φI1 of current detector CD1. Then, communication and arithmetic unit 21B transmits output signal 911 to other controllers 12F, 13F (not illustrated). Each of other controllers 12F, 13F similarly outputs the output signal of the corresponding current detector to other controller. Thus, output signals φI1 to φI3 of current detectors CD1 to CD3 are shared in each controller.

Communication and arithmetic unit 21B detects the magnitude of each current ripple flowing through LD modules M1 to M3 from output signals φI1 to φI3 of current detectors CD1 to CD3. Then, communication and arithmetic unit 21B determines the phase differences between the current ripples from the magnitude of each detected current ripple using a correspondence relationship between the magnitude of each current ripple and the phase differences between the current ripples.

The correspondence relationship between the magnitude of each current ripple and the phase differences between the current ripples is previously produced and stored in storage 22. The correspondence relationship can be produced by various methods. For example, before shipping the laser beam generation device, the current is caused to flow through LD modules M1 to M3, the phase of each current ripple is variously changed, and the detected value of power P of laser beam β is fed back to control device 4. Then, the phase of each current ripple in which the laser output is most stable (the ripple of laser beam β is minimized) may be acquired, and the correspondence relationship (table) between the magnitude of each current ripple and the phase differences between the current ripples may be produced.

Alternatively, before the laser output from the laser beam generation device or during calibration setting, the current may be caused to flow through LD modules M1 to M3, and the correspondence relationship (table) between the magnitude of each current ripple and the phase differences between the current ripples may be produced by the same method as described above.

In the example of FIG. 43, using the correspondence relationship between the magnitudes of the respective current ripples and the phase differences between the current ripples produced as described above, from the magnitude of each detected current ripple, the phase difference between the current ripples of currents IM1, IM3 and the phase difference between the current ripples of currents IM2, IM3 are determined to be 144 degrees, and the phase difference between the current ripples of currents IM1, IM2 is determined to be 72 degrees.

In the thirteenth embodiment, hereinafter, the phase difference between the current ripple of current IM1 and the current ripple of current IM2 is referred to as ΔRp1, the phase difference between the current ripple of current IM2 and the current ripple of current IM3 is referred to as ΔRp2, and the phase difference between the current ripple of current IM3 and the current ripple of current IM1 is referred to as ΔRp3.

Communication and arithmetic unit 21B obtains phase angle θ1 of corresponding control signal CNT1 from the phase difference between the determined current ripples, and provides phase angle θ1 to current controller 24. By differentiating the phase difference between the current ripples flowing through LD modules M1 to M3 in this manner, the ripple of laser beam β can be reduced to obtain the stable laser output.

As described above, in the thirteenth embodiment, the phase differences between the current ripples are adjusted from the magnitude of each current ripple flowing through LD modules M1 to M3 such that the laser output is stabilized (such that the ripple of laser beam β is suppressed). That is, phase differences ΔRp1 to ΔRp3 between the current ripples are the same (120 degrees) in the first embodiment, but phase differences ΔRp1 to ΔRp3 are different in the thirteenth embodiment. When phase differences ΔRp1 to ΔRp3 are different, two of phase differences ΔRp1 to ΔRp3 may be the same and one thereof may be different, or phase differences ΔRp1 to ΔRp3 may be different from each other. In other words, in the thirteenth embodiment, the phase differences between the current ripples are adjusted such that the phase differences between the current ripples having adjacent peaks have unequal magnitudes from each other.

Figure 45:
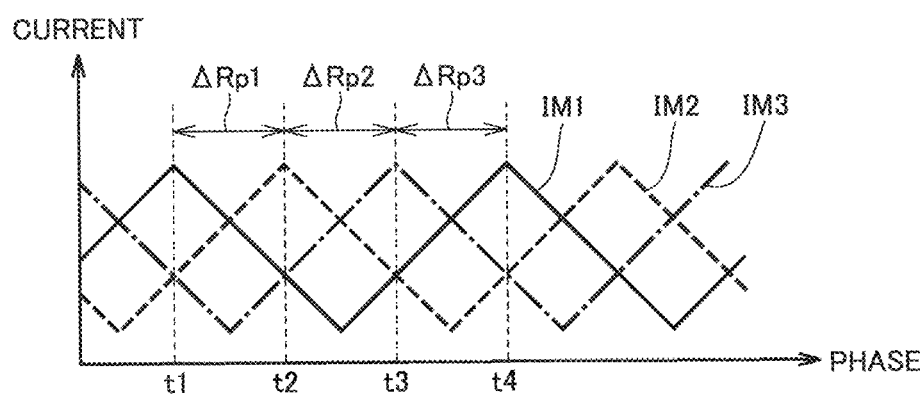
FIG. 45 is a view illustrating a current waveform when phase differences between current ripples are the same as each other.

FIG. 45 is a view illustrating the current waveforms when phase differences ΔRp1 to ΔRp3 between the current ripples are the same. Referring to FIG. 45, phase differences ΔRp1 to ΔRp3 are equal to each other and are 120 degrees. In such a case, when the inductance value of the reactor varies, as illustrated in FIG. 42, there is a possibility that the ripple rate of the current obtained by adding currents IM1 to IM3 (ripple of the laser beam β) increases.

Figure 46:
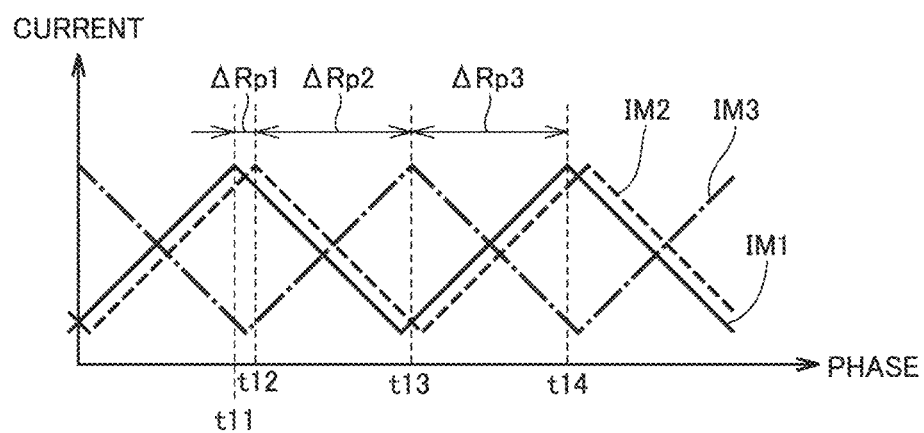
FIG. 46 is a view illustrating an example of the current waveform when the phase differences between the current ripples are different.

FIG. 46 is a view illustrating an example of the current waveform when phase differences ΔRp1 to ΔRp3 between the current ripples are different. In this example, the case where two of phase differences ΔRp1 to ΔRp3 are the same but one is different is illustrated.

Referring to FIG. 46, phase differences ΔRp2, ΔRp3 are equal to each other, and phase difference ΔRp1 is different from phase differences ΔRp2, ΔRp3. For example, phase differences ΔRp2, ΔRp3 are 160 degrees, and phase difference ΔRp1 is 40 degrees. That is, in this example, the phase differences between the current ripples are adjusted such that two phase differences between the current ripples having adjacent peaks have the different magnitudes.

Figure 47:
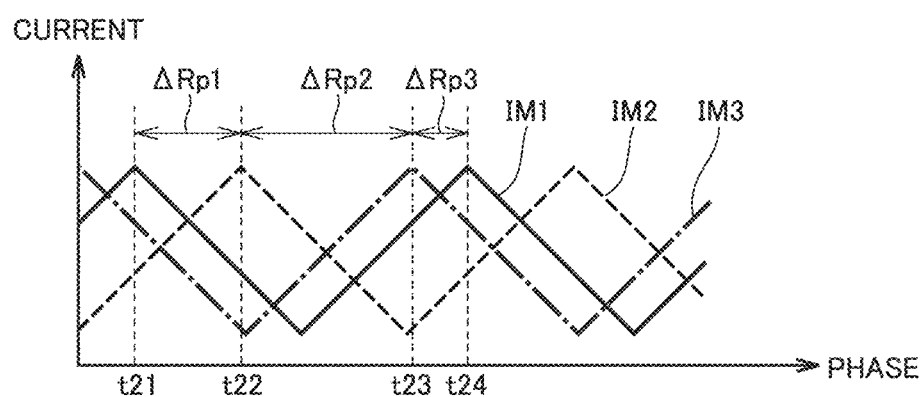
FIG. 47 is a view illustrating another example of the current waveform when the phase differences between the current ripples are different.

FIG. 47 is a view illustrating another example of the current waveform when phase differences ΔRp1 to ΔRp3 between the current ripples are different. In this example, the case where phase differences ΔRp1 to ΔRp3 are different from each other is illustrated.

Referring to FIG. 47, for example, phase differences ΔRp1 to ΔRp3 are 120 degrees, 160 degrees, and 80 degrees. That is, in this example, the phase differences between the current ripples are adjusted such that three phase differences between the current ripples having adjacent peaks have the different magnitudes.

As described above, in the thirteenth embodiment, phase differences ΔRp1 to ΔRp3 between the current ripples vary appropriately depending on the magnitude of each current ripple according to the previously prepared correspondence relationship between the magnitude of each current ripple and the phase differences between the current ripples, whereby the ripple of laser beam β can be suppressed to stabilize the laser output.

In the above description, the magnitudes of the current ripples flowing through LD modules M1 to M3 are detected from output signals φI1 to φI3 of current detectors CD1 to CD3, respectively, but may be estimated from the temperatures of reactors L1 to L3.

Specifically, a magnetic material is often used for the core of the reactor, and in the case of a ferrite core that is often used as the magnetic material, permeability has a positive temperature characteristic. For this reason, when the temperature of the reactor rises, the inductance value of the reactor rises. The magnitude (IR) of the current ripple can be estimated from the inductance value (L) of the reactor using the equation (1). Consequently, the magnitude of the current ripple can be estimated from the temperature of the reactor by predicting the relationship between the temperature of the reactor and the inductance value.

For example, inductance value L of the reactor can be expressed by the following equation.

$$L = k \times \mu \times \pi \times a^2 \times n^2 / b \qquad (3)$$

At this point, k represents a Nagaoka coefficient, μ represents magnetic permeability, and a, b, n represent a radius, a length, and a number of turns of the reactor.

As described above, in the above parameters, permeability μ changes depending on the temperature. For this reason, by acquiring previously the temperature characteristic of permeability μ based on specifications, evaluation tests, and the like, the magnitude of the current ripple can be estimated from the temperature of the reactor using the equations (3) and (1).

Fourteenth Embodiment

Figure 48:
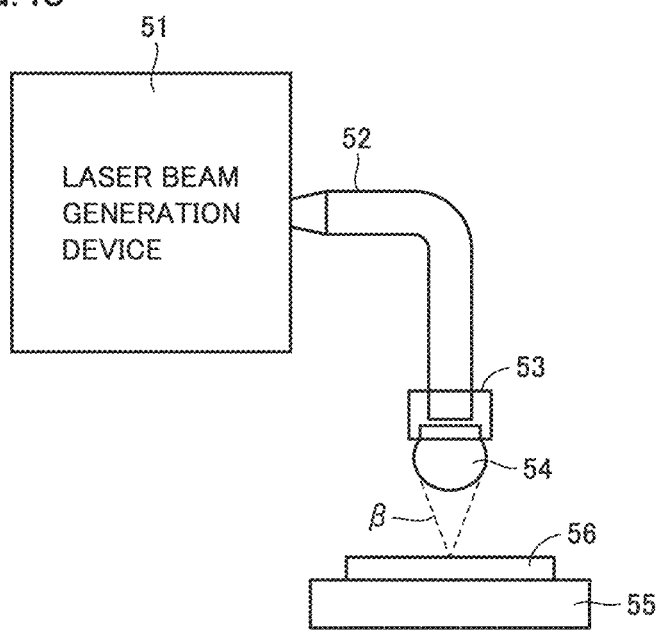
FIG. 48 is a view illustrating a configuration of a laser processing apparatus including the laser beam generation device.

FIG. 48 is a view illustrating a configuration of a laser processing apparatus including the laser beam generation device. In FIG. 48, the laser processing apparatus includes a laser beam generation device 51, an optical fiber 52, a processing head 53, a lens 54, and a positioning device 55.

Laser beam generation device 51 has been described in any one of the above-described embodiments and modifications, and outputs laser beam β having the small ripple. Optical fiber 52 transmits laser beam β output from laser beam generation device 51 to processing head 53. Processing head 53 vertically irradiates the surface of object 56 with laser beam β. Lens 54 is provided between processing head 53 and object 56, and a focal point of lens 54 is adjusted to the surface of object 56.

Object 56 is mounted on positioning device 55. Positioning device 55 moves object 56 in the horizontal and vertical directions to cause the focal point of lens 54 to be aligned to the machined position on the surface of object 56. Laser beam β emitted from laser beam generation device 51 is emitted to a position to be processed of object 56 through optical fiber 52, processing head 53, and lens 54, and processes object 56.

In the fourteenth embodiment, because the above-described laser beam generation device is used, object 56 can be irradiated with stable laser beam β having the small ripple, and the flatness accuracy of the processed section during the laser processing can be improved.

The embodiments disclosed herein are also planned to be appropriately combined and implemented within a range not technically contradictory. It should be considered that the disclosed embodiments are an example in all respects and not restrictive. The technical scope disclosed by the present disclosure is defined by not the description of the embodiments, but the claims, and it is intended that all changes within the meaning and scope of the claims are included in the present invention.

REFERENCE SIGNS LIST

PS1 to PS3: power supply unit, L1 to L3: reactor, PL1 to PL3: DC positive bus, NL1 to NL3: DC negative bus, CD1 to CD3: current detector, CS1 to CS3, CS1A to CS1C: current path switching circuit, M1 to M3, M1A to M3A, M10: LD module, PS1a to PS3a, PS1b to PS3b: sub-power supply unit, L1a to L3a, L1b to L3b: sub-reactor, U1 to U3: magnetically coupled reactor unit, 1: combiner, 2: power detector, 3: operation unit, 4, 4A to 4E: control device, 5: AC power supply, 11 to 13, 11A to 11F, 12A to 12F, 13A to 13F: controller, 14: communication line, 15 to 17: processing device, 21, 21A, 21B: communication and arithmetic unit, 22: storage, 23, 23A, 23B: command unit, 24: current controller, 31, 35: rectifier circuit, 32: smoothing capacitor, 33: full-bridge circuit, 33a to 33d, 41, 45: switching element, 34: transformer, 34a: primary winding, 34b: secondary winding, 42, 42A to 42C: current switching controller, 43: energy consumption unit, 44: resistive element, VD1 to VD3: voltage detector, TD1 to TD3: temperature detector, 50: notification unit, 51: laser beam generation device, 52: optical fiber, 53: processing head, 54: lens, 55: positioning device

The invention claimed is:

1. A laser beam generation device comprising:
a plurality of power supply units each to output a current, the plurality of power supply units being driven by a plurality of control signals, respectively;
a plurality of current detectors provided corresponding to the plurality of power supply units, respectively, and provided each to detect a current output from the corresponding power supply unit;
a plurality of laser diode modules provided corresponding to the plurality of power supply units, respectively, and provided each to receive a current from the corresponding power supply unit and output a laser beam;
a condensing unit to collect a plurality of laser beams output from the plurality of laser diode modules, and output a laser beam; and
a control device to generate the plurality of control signals wherein
a current output from each of the plurality of power supply units includes a current ripple that changes in synchronization with a control signal that drives the corresponding power supply unit, and
the control device changes a phase or a frequency of each of the plurality of control signals based on a magnitude of the current ripple included in the current detected by each of the plurality of current detectors.

2. The laser beam generation device according to claim 1, wherein the control device generates the plurality of control signals such that phases or frequencies of at least two control signals in the plurality of control signals are different from each other.

3. The laser beam generation device according to claim 2, wherein
the laser beam output from each of the plurality of laser diode modules includes a ripple that changes in synchronization with a current ripple included in the current received by the corresponding laser diode module, and
the control device differentiates phases or frequencies of the at least two control signals from each other so as to reduce a ripple included in the laser beam output from the condensing unit.

4. The laser beam generation device according to claim 3, wherein the control device generates the plurality of control signals such that phase differences between a plurality of current ripples flowing through the plurality of laser diode modules are provided and at least two phase differences between current ripples having adjacent peaks have different magnitudes.

5. The laser beam generation device according to claim 3, wherein the control device generates the plurality of control signals such that phase differences between a plurality of current ripples flowing through the plurality of laser diode modules are provided and phase differences between current ripples having adjacent peaks have unequal magnitudes.

6. The laser beam generation device according to claim 1, further comprising:
a plurality of reactors provided corresponding to the plurality of power supply units, respectively; and
a plurality of first switching elements connected in parallel to the plurality of laser diode modules, respectively, wherein
each of the plurality of reactors is connected between the corresponding power supply unit and the corresponding laser diode module.

7. The laser beam generation device according to claim 6, wherein
the control device
controls, when a laser beam is output from a first laser diode module in the plurality of laser diode modules, a first switching element corresponding to the first laser diode module to become non-conductive, and
controls, when an output of the laser beam from the first laser diode module is stopped, the first switching element to become conductive.

8. The laser beam generation device according to claim 1, further comprising a plurality of voltage detectors provided corresponding to the plurality of laser diode modules, respectively, and provided each to detect a voltage between terminals of the corresponding laser diode module.

9. The laser beam generation device according to claim 8, further comprising a power detector to detect power of the laser beam output from the condensing unit.

10. The laser beam generation device according to claim 9, wherein the control device predicts a residual lifetime of the plurality of laser diode modules using at least one detection result of the plurality of current detectors, the plurality of voltage detectors, and the power detector.

11. The laser beam generation device according to claim 9, wherein the control device detects light emission efficiency of the plurality of laser diode modules using at least one detection result of the plurality of current detectors, the plurality of voltage detectors, and the power detector.

12. The laser beam generation device according to claim 9, wherein the control device detects a failure of the plurality of laser diode modules using at least one detection result of the plurality of current detectors, the plurality of voltage detectors, and the power detector.

13. The laser beam generation device according to claim 10, wherein the control device generates the plurality of control signals to change magnitudes of currents flowing through the plurality of laser diode modules, respectively, based on a prediction result of the residual lifetime.

14. The laser beam generation device according to claim 1, further comprising a plurality of temperature detectors provided corresponding to the plurality of laser diode modules, respectively, and provided each to detect a temperature of the corresponding laser diode module, wherein
when the plurality of laser diode modules are caused to emit light, the control device generates the plurality of control signals such that a current flowing through a laser diode module having a high detected temperature is smaller than a current flowing through a laser diode module having a low detected temperature.

15. The laser beam generation device according to claim 1, wherein
the control device
selects at least one laser diode module driven according to a laser output setting value, and
generates the plurality of control signals such that a current flows through a selected laser diode module and a current does not flow through an unselected laser diode module.

16. The laser beam generation device according to claim 1, wherein
each of the plurality of laser diode modules includes at least one laser diode, and
the plurality of laser diode modules include different numbers of laser diodes from each other.

17. The laser beam generation device according to claim 6, wherein
each of the plurality of control signals includes first and second sub-control signals having respective phases different from each other,
each of the plurality of power supply units includes:
a first sub-power supply unit to output a current according to the first sub-control signal, the first sub-power supply unit being driven by the first sub-control signal; and
a second sub-power supply unit to output a current according to the second sub-control signal, the second sub-power supply unit being driven by the second sub-control signal, and
each of the plurality of reactors includes first and second sub-reactors, the first and second sub-reactors being provided corresponding to the first and second sub-power supply units, respectively, the first sub-reactor being connected between a positive electrode of the first sub-power supply unit and an anode terminal of the corresponding laser diode module, the second sub-reactor being connected between a positive electrode of the second sub-power supply unit and the anode terminal.

18. A laser processing apparatus comprising:
the laser beam generation device according to claim 1; and
a processing head to irradiate a surface of an object with a laser beam output from the laser beam generation device.

19. The laser beam generation device according to claim 8, wherein the control device detects a failure of the plurality of laser diode modules using detection results of the plurality of current detectors and the plurality of voltage detectors.

20. The laser beam generation device according to claim 19, wherein
the control device
generates the plurality of control signals such that a current flows through a laser diode module that does not fail and a current does not flow through a failed laser diode module, of the plurality of laser diode modules, and
further differentiates phases or frequencies of control signals of laser diode modules that do not fail from each other so as to reduce a ripple included in the laser beam output from the condensing unit.

* * * * *